US012633498B2

(12) United States Patent
Marakhtanov et al.

(10) Patent No.: US 12,633,498 B2
(45) Date of Patent: May 19, 2026

(54) DUTY CYCLE CONTROL TO ACHIEVE UNIFORMITY

(71) Applicant: Lam Research Corporation, Fremont, CA (US)

(72) Inventors: Alexei M. Marakhtanov, Albany, CA (US); Felix Leib Kozakevich, Sunnyvale, CA (US); Bing Ji, Pleasanton, CA (US); John P. Holland, San Jose, CA (US); Ranadeep Bhowmick, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 404 days.

(21) Appl. No.: 18/011,131

(22) PCT Filed: Dec. 23, 2021

(86) PCT No.: PCT/US2021/065155
§ 371 (c)(1),
(2) Date: Dec. 16, 2022

(87) PCT Pub. No.: WO2022/169518
PCT Pub. Date: Aug. 11, 2022

(65) Prior Publication Data
US 2023/0215694 A1      Jul. 6, 2023

Related U.S. Application Data

(60) Provisional application No. 63/146,499, filed on Feb. 5, 2021.

(51) Int. Cl.
H01J 37/32      (2006.01)
H03K 3/017      (2006.01)

(52) U.S. Cl.
CPC .. *H01J 37/32165* (2013.01); *H01J 37/32926* (2013.01); *H01J 37/32935* (2013.01); *H03K 3/017* (2013.01); *H01J 2237/3343* (2013.01)

(58) Field of Classification Search
CPC ........... H01J 37/32165; H01J 37/32926; H01J 37/32935; H01J 2237/3343; H03K 3/017
See application file for complete search history.

(56) References Cited

U.S. PATENT DOCUMENTS 7,829,469 B2      11/2010   Chen et al.
9,761,414 B2      9/2017    Marakhtanov et al.
(Continued)

FOREIGN PATENT DOCUMENTS

KR      2018-0071124 A      6/2018
WO      WO-2023136913 A1 *  7/2023   ........ H01J 37/32091

OTHER PUBLICATIONS

ISR & WO PCT/US2021/065155, dated Apr. 20, 2022, 8 pages.

*Primary Examiner* — Anita K Alanko
(74) *Attorney, Agent, or Firm* — Polygon IP, LLP

(57) ABSTRACT

A method for achieving a first uniformity level in a processing rate across a surface of a substrate is described. The method includes receiving the first uniformity level to be achieved across the surface of the substrate and identifying a first plurality of duty cycles associated with a first plurality of states based on the first uniformity level. The first plurality of states are of a variable of a first radio frequency (RF) signal. The method further includes controlling an RF generator to generate the first RF signal having the first plurality of duty cycles.

20 Claims, 18 Drawing Sheets

(56) References Cited

U.S. PATENT DOCUMENTS

| | | | |
|---|---|---|---|
| 10,283,330 B2 * | 5/2019 | Marakhtanov .... | H01J 37/32165 |
| 10,861,708 B2 * | 12/2020 | Yanagawa ......... | H01J 37/32091 |
| 12,217,972 B2 * | 2/2025 | Dole ................ | H01L 21/31116 |
| 2007/0246443 A1 * | 10/2007 | Paterson ........... | H01J 37/32082 |
| | | | 216/67 |
| 2018/0019102 A1 | 1/2018 | Voronin et al. | |
| 2019/0244788 A1 | 8/2019 | Marakhtanov et al. | |
| 2022/0084789 A1 * | 3/2022 | Takeuchi .......... | H01J 37/32165 |

* cited by examiner

(While Processing)

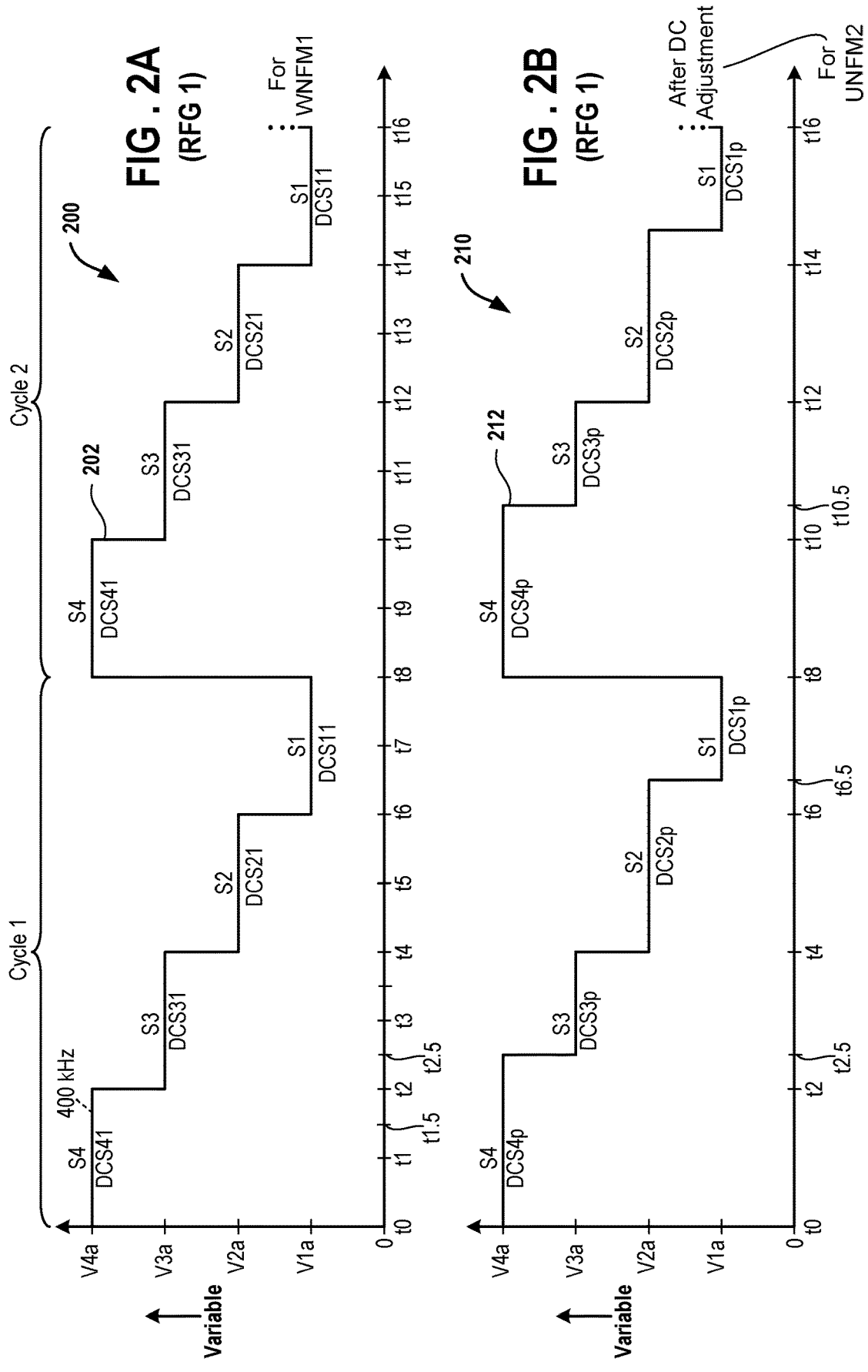

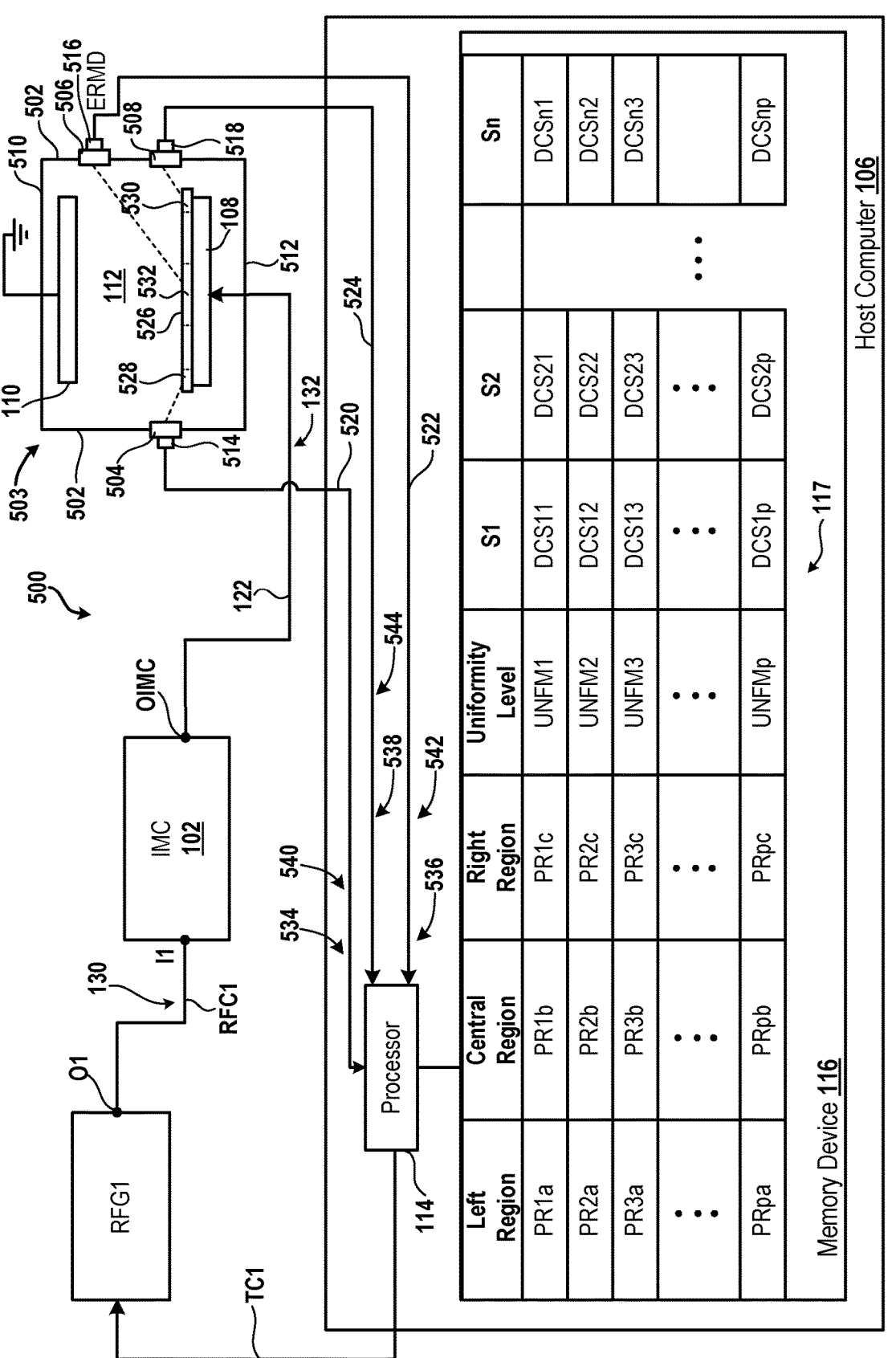
FIG. 5A (Determination of Uniformities Based on DCS)

(While Processing Multiple RFGs)

750

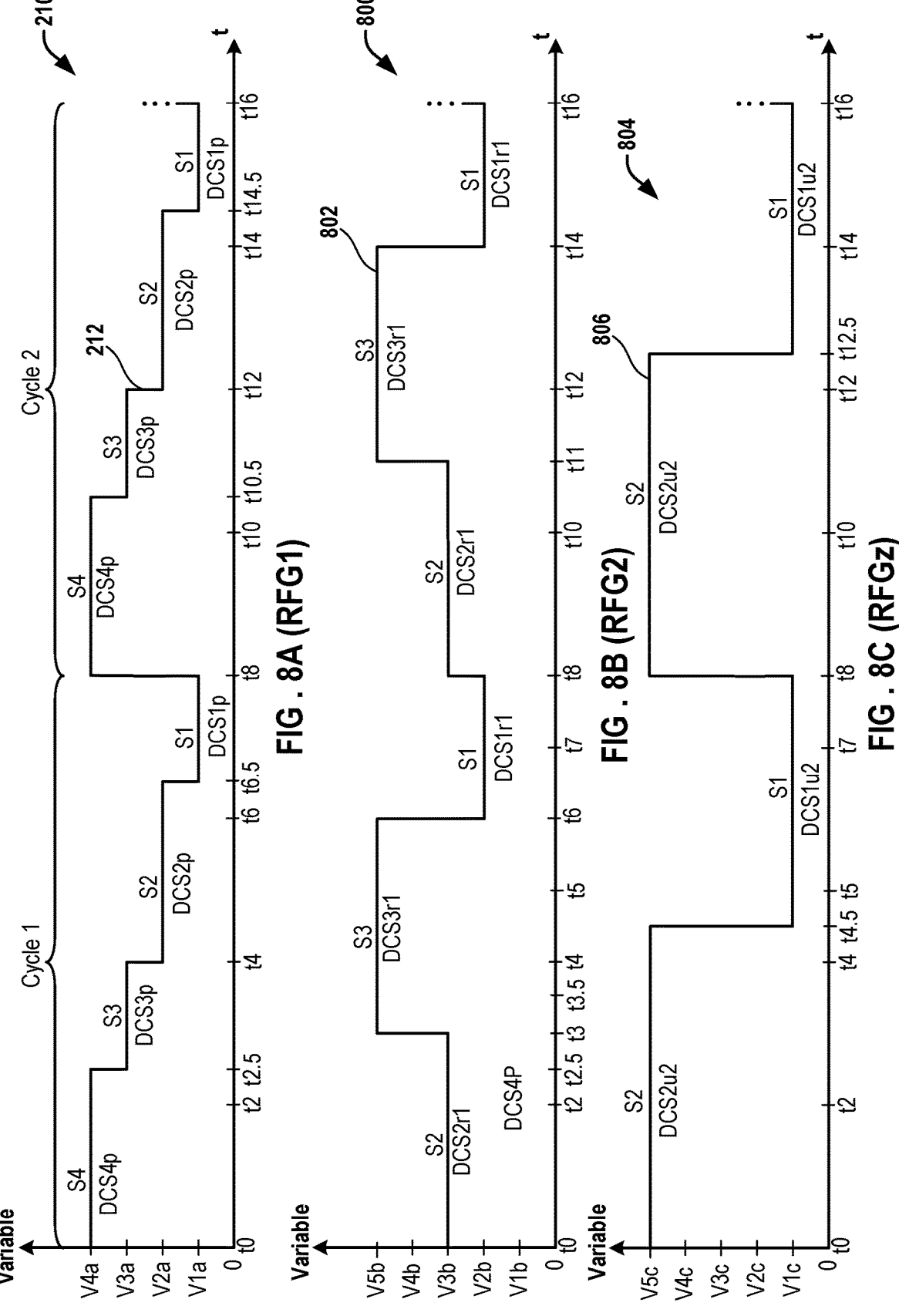
FIG . 8A (RFG1)
FIG . 8B (RFG2)
FIG . 8C (RFGz)

(When pulse rep. rate is reduced to achieve the same pulse width, duty cycle is increased)

(To illustrate RF signal
Freq. & rep. rate)

DUTY CYCLE CONTROL TO ACHIEVE UNIFORMITY

CLAIM OF PRIORITY

This application is a national stage filing of and claims priority, under 35 U.S.C. § 371, to PCT/US21/65155, filed on Dec. 23, 2021, and titled "DUTY CYCLE CONTROL TO ACHIEVE UNIFORMITY", which claims the benefit of and priority, under 35 U.S.C. § 119 (e), to U.S. Provisional Patent Application No. 63/146,499, filed on Feb. 5, 2021, and titled "DUTY CYCLE CONTROL TO ACHIEVE UNIFORMITY", all of which are incorporated by reference herein in their entirety.

FIELD

The present embodiments relate to systems and methods for controlling a duty cycle to achieve uniformity in a processing a substrate.

BACKGROUND

With each successive semiconductor technology generation, wafer diameters tend to increase and transistor sizes decrease, resulting in the need for an ever higher degree of accuracy and repeatability in wafer processes. Semiconductor substrate materials, such as silicon wafers, are processed by techniques, which include the use of plasma chambers. These techniques include plasma applications, such as plasma etch, plasma cleaning, and plasma deposition.

Plasma processing systems available today are among those semiconductor fabrication tools, which are subject to an increasing need for improved accuracy and repeatability of the plasma applications. It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for controlling a duty cycle to achieve uniformity in a processing a substrate. It should be appreciated that the present embodiments can be implemented in numerous ways, e.g., a process, an apparatus, a system, a device, or a method on a computer readable medium. Several embodiments are described below.

In one embodiment, a method for achieving a first uniformity level in a processing rate across a surface of a substrate is described. The method includes receiving the first uniformity level to be achieved across the surface of the substrate and identifying a first plurality of duty cycles associated with a first plurality of states based on the first uniformity level. The first plurality of states are of a variable of a first radio frequency (RF) signal. The method further includes controlling an RF generator to generate the first RF signal having the first plurality of duty cycles.

In an embodiment, a method for achieving a first uniformity level in a processing rate across a surface of a substrate is described. The method includes receiving the first uniformity level to be achieved across the surface of the substrate and identifying a plurality of duty cycles associated with a plurality of states based on the first uniformity level. The first plurality of states are of a variable of a plurality of RF signals. The method also includes controlling a plurality of RF generators to generate the plurality of RF signals.

In one embodiment, a controller for achieving a first uniformity level in a processing rate across a surface of a substrate is described. The controller includes a processor that receives the first uniformity level to be achieved across the surface of the substrate. The processor identifies a first plurality of duty cycles associated with a first plurality of states based on the first uniformity level. The first plurality of states are of a variable of a first RF signal. The processor further controls an RF generator to generate the first RF signal having the first plurality of duty cycles. The controller includes a memory device coupled to the processor. The memory device stores the first uniformity level.

Several advantages of the herein described systems and methods include controlling the uniformity in the processing of the substrate by controlling a duty cycle of an RF signal that is generated by an RF generator. The duty cycle can be controlled to achieve the uniformity at a center region or an edge region or both the center and edge regions of the substrate. The duty cycle is determined before processing the substrate. Once the duty cycle is determined, during processing of the substrate, the RF signal with the duty cycle is generated to achieve the uniformity. Additional advantages of the herein described systems and methods include determining multiple duty cycles for multiple states of the RF signal. By determining the duty cycles of the states, the uniformity is controlled.

Further advantages of the herein described systems and methods include controlling the uniformity by controlling multiple duty cycles of multiple RF signals generated by multiple RF generators. By controlling the duty cycles of the RF signals, the uniformity is controlled. In addition, the duty cycles are determined for each state of each of the RF signals. The duty cycles are then applied to the RF signals to achieve the uniformity.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A is an embodiment of a graph to illustrate multiple duty cycles of a variable of a first RF signal that is generated by the RF generator.

FIG. 2B is an embodiment of a graph to illustrate a change in duty cycles for one or more states of a variable of an RF signal.

FIG. 5A is a diagram of an embodiment of a system to illustrate generation of a listing of uniformity levels and duty cycles.

FIG. 8A is a diagram of an embodiment of the graph of FIG. 2B.

FIG. 8B is a diagram of an embodiment of a graph to illustrate multiple duty cycles of a variable of an RF signal that is generated by an RF generator.

FIG. 8C is a diagram of an embodiment of a graph to illustrate multiple duty cycles of a variable of an RF signal that is generated by an RF generator.

DETAILED DESCRIPTION

The following embodiments describe systems and methods for controlling a duty cycle to achieve uniformity in a processing a substrate. It will be apparent that the present embodiments may be practiced without some or all of these specific details. In other instances, well known operations have not been described in detail in order not to unnecessarily obscure the present embodiments.

Figure 1:
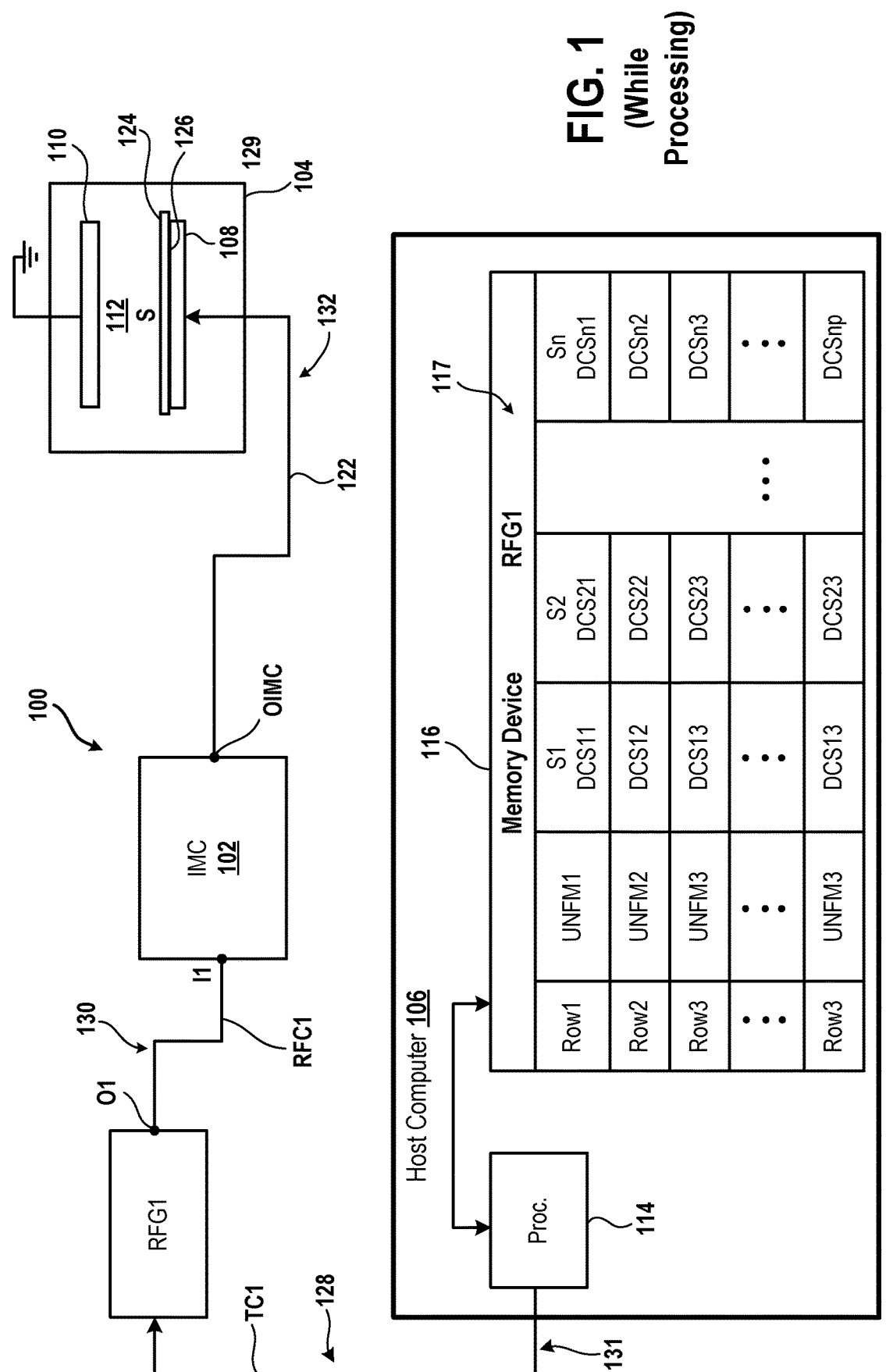
FIG. 1 is a diagram of an embodiment of a system to illustrate an adjustment of duty cycles associated with an operation of a radio frequency generator (RFG) during processing of a substrate.

FIG. 1 is a diagram of an embodiment of a system 100 to illustrate an adjustment of duty cycles during operation of an RF generator (RFG) 1 while processing a substrate S, such as a semiconductor wafer. The system 100 includes the RF generator RFG1, and impedance matching circuit 102, a plasma chamber 104, and a host computer 106. An example of the RF generator RFG1 is a low frequency RF generator. Another example of the RF generator RFG1 is a high frequency RF generator. An illustration of the low frequency RF generator is an RF generator having a low frequency of operation of 100 kilohertz (kHz), or 400 kHz, or 2 megahertz (MHz). As an illustration, the high frequency RF generator has a high frequency of operation of 13.56 MHz, 27 MHz, or 60 MHz. Yet another example of the low frequency RF generator is an RF generator having the low frequency of operation of 100 kHz.

As an example, an impedance matching circuit, as used herein, includes a network of circuit components, such as capacitors, inductors, and resistors. The circuit components are coupled to each other. To illustrate, two of the circuit components are coupled to each other in a series or in parallel.

The plasma chamber 104 includes a substrate support 108, such as an electrostatic chuck (ESC). The plasma chamber 104 further includes an upper electrode 110 that is located above the substrate support 108 to form a gap 112 between the upper electrode 110 and the substrate support 108. A lower electrode, embedded within the substrate support 108, is made from a metal, such as aluminum or an alloy of aluminum. The substrate support 108 is made from the metal and from ceramic, such as aluminum oxide $(Al_2O_3)$. The upper electrode 110 is fabricated from the metal and is coupled to a reference potential, such as a ground potential or a negative potential. An example of the plasma chamber 104 is a capacitively coupled plasma (CCP) chamber.

Examples of the host computer 106 include a desktop computer, a laptop computer, a tablet, a smart phone, and a controller. The host computer 106 includes a processor 114 and a memory device 116. As an example, the processor 114 can be a central processing unit (CPU), a field programmable gate array (FPGA), a programmable logic device (PLD), or a microcontroller. Examples of the memory device 116 include a read-only memory (ROM) and a random access memory (RAM). To illustrate, the memory device 116 is a flash memory or a redundant array of independent discs (RAID). The processor 114 is coupled to the memory device 116. The processor 114 is coupled to the RF generator RFG1 via a transfer cable TC1. Examples of a transfer cable include a cable that allows for serial transfer of data, or a cable that allows for a parallel transfer of data, or a cable that allows for transfer of data using a Universal Serial Bus (USB) protocol.

An output O1 of the RF generator RFG1 is coupled to an input I1 of the impedance matching circuit 102 via an RF cable RFC1. Also, an output OIMC of the impedance matching circuit 102 is coupled via an RF transmission line 122 to the lower electrode of the substrate support 108. An example of the RF transmission line 122 includes an RF cable that is surrounded by an RF sheath, with an insulator between the RF cable and the RF sheath.

The processor 114 stores, within the memory device 116, a listing 117 of uniformity levels and duty cycles. The listing 117 is generated using a method described with reference to FIG. 5A or a method described with reference to FIG. 5B below. The uniformity levels include uniformities that can be achieved across a top surface 124 of the substrate S while processing the substrate S within the plasma chamber 104. As an example, each of the uniformity levels includes values defining a rate at which the substrate S is processed across the top surface 124 of the substrate S. To illustrate, each of the uniformity levels is a plot of a graph. The graph plots the rate of processing the substrate S versus a radius of the substrate S. The top surface 124 faces a bottom surface of the upper electrode 110 and a bottom surface 126 of the substrate S is adjacent to and faces a top surface of the substrate support 108. The uniformity levels include a uniformity level UNFM1, a uniformity level UNFM2, the uniformity level UNFM3, and so on until a uniformity level UNFMp is included, where p is a positive integer.

Each uniformity level, stored within the memory device 116, corresponds to multiple duty cycles of multiple states of a variable, such as power or voltage or frequency. The states are of a corresponding one of first through pth RF signals generated by the RF generator RFG1. For example, there is a one-to-one mapping or a one-to-one relationship between the uniformity level UNFM1 and a set of duty cycles that define the variable of a first RF signal generated by the RF generator RFG1. The set of duty cycles include a duty cycle DCS11 of a state S1 defining the variable of the first RF signal, a duty cycle DCS21 of a state S2 defining the variable of the first RF signal, and so on until a duty cycle DCSn1 of a state Sn defining the variable of the first RF signal is included, where n is a positive integer. As another example, there is a one-to-one mapping between the uniformity level UNFM2 and a set of duty cycles of the variable of second RF signal generated by the RF generator RFG1. The set of duty cycles include a duty cycle DCS12 defining the state S1 of the variable of the second RF signal, a duty cycle DCS22 of the state S2 defining the variable of the second RF signal, and so on until a duty cycle DCSn2 of the state Sn defining the variable of the second RF signal is included. As yet another example, there is a one-to-one mapping between the uniformity level UNFM3 and a set of duty cycles of a third RF signal generated by the RF generator RFG1. The set of duty cycles include a duty cycle DCS13 of the state S1 defining the variable of the third RF signal, a duty cycle DCS23 of the state S2 defining the variable of the third RF signal, and so on until a duty cycle DCSn3 of the state Sn defining the variable of the third RF signal is included. As still another example, there is a one-to-one mapping between the uniformity level UNFMp and a set of duty cycles that define time periods for applying the variable of the pth RF signal, such as an RF signal 130. The set of duty cycles include a duty cycle DCSIp defining the state S1 of the variable of an RF signal 130, a duty cycle DCS2p defining the state S2 of the variable of the RF signal 130, and so on until a duty cycle DCSnp defining the state Sn of the variable of the RF signal 130 is included.

It should be noted that in one embodiment, a number of the duty cycles DCS11 through DCSn1 that correspond to the uniformity level UNFM1 is different from a number of the duty cycles DCSIp through DCSnp that correspond to the uniformity level UNFMp. For example, five duty cycles correspond to the uniformity level UNFM1 and three duty cycles correspond to the uniformity level UNFMp. Also, in the example, there are five states S1 through S5 that correspond to the uniformity level UNFM1 and three states S1 through S3 that correspond to the uniformity level UNFMp. The five states S1 through S5 and the duty cycles DCS11 through DCS51 that correspond to the uniformity level UNFM1 repeat with each cycle of a clock signal. Also, the three states S1 through S3 and the duty cycles DCS1p through DCS3p that correspond to the uniformity level UNFMp repeat with each cycle of the clock signal. For example, a number of the duty cycles DCS11 through DCS51 that correspond to the uniformity level UNFM1 does not exceed five and a number of the duty cycles DCSIp through DCS3p that correspond to the uniformity level UNFMp does not exceed three. The number of states corresponding to a uniformity level is equal to a number of duty cycles corresponding to the uniformity level. Similarly, in the embodiment, a number of the duty cycles DCS12 through DCSn2 that correspond to the uniformity level UNFM2 is different from a number of the duty cycles DCSIp through DCSnp that correspond to the uniformity level UNFMp. Also, in the embodiment, a number of the duty cycles DCS13 through DCSn3 that correspond to the uniformity level UNFM3 is different from a number of the duty cycles DCSIp through DCSnp that correspond to the uniformity level UNFMp.

As an example, a duty cycle of the variable is a time period or a time interval for which the variable has a state, which is represented by a variable level. For example, the duty cycle DCSIp is a time interval for which the variable has the state S1. As another example, the duty cycle DCS2p is a time interval for which the variable has the state S2, and the duty cycle DCSnp is a time interval for which the variable has the state Sn.

The processor 114 receives from a user, via an input device, an indication, such as a signal, including a uniformity level UNFMa to be achieved in processing the substrate S. Examples of the input device include a keyboard, a touchscreen, a mouse, a stylus, and a keypad. The input device is coupled to the processor 114 via a transfer cable.

Upon receiving the indication, the processor 114 determines whether the uniformity level UNMFa is within a predetermined range from one of the uniformity levels UNFM1 through UNFMp in the listing 117 stored in the memory device 116. For example, the processor 114 parses the uniformity level UNFMa to identify multiple values of the uniformity level UNFMa. The processor 114 determines whether a majority of the values defining the uniformity level UNFMa are within the predetermined range from a majority of values defining the one of the uniformity levels UNFM1 through UNFMp. Upon determining that the majority of the values defining the uniformity level UNFMa are within the predetermined range from the majority of values defining the one of the uniformity levels UNFM1 through UNFMp, the processor 114 determines that the uniformity level UNFMa is within the predetermined range from the one of uniformity levels UNFM1 through UNFMp. On the other hand, upon determining that the majority of the values defining the uniformity level UNFMa are not within the predetermined range from the majority of values defining the one of the uniformity levels UNFM1 through UNFMp, the processor 114 determines that the uniformity level UNFMa is not within, such as outside, the predetermined range from the one of uniformity levels UNFM1 through UNFMp.

As another example, when the uniformity level UNFMa is a graphical plot, such as a graphical representation or a graphical curve, the processor 114 parses the uniformity level UNFMa to identify multiple values of the uniformity level UNFMa. The processor 114 calculates a first statistical value from the values of uniformity level UNFMa. The processor 114 determines whether the first statistical value is within the predetermined range from a second statistical value calculated from one of the uniformity levels UNFM1 through UNFMp. Upon determining that the first statistical value is within the predetermined range from the second statistical value, the processor 114 determines that the uniformity level UNFMa is within the predetermined range from the one of uniformity levels UNFM1 through UNFMp. On the other hand, upon determining that the first statistical value is not within the predetermined range from the second statistical value, the processor 114 determines that the uniformity level UNFMa is not within, such as outside, the predetermined range from the one of uniformity levels UNFM1 through UNFMp. Examples of a statistical value include an average value and a median value. The second statistical value is calculated by the processor 114 from the values of the one of the uniformity levels UNFM1 through UNFMp.

The predetermined range is stored within the memory device 116 for access by the processor 114. As an example, the predetermined range is +1% or +2% or +3% or ±4% or ±5%.

Upon determining that the uniformity level UNMFa is within the predetermined range from the one of the uniformity levels UNFM1 through UNFMp, such as the uniformity level UNFMp, in the listing 117 stored in the memory device 116, the processor 114 identifies from the memory device 116, a set of duty cycles that correspond to the one of the uniformity levels UNFM1 through UNFMp. For example, the processor 114 identifies, from the memory device 116, the duty cycles DCSIp through DCSnp from the memory device 116 as corresponding to, such as linked to or mapped to, the uniformity level UNFMp. To illustrate, the processor 114 descends through the listing 117 to find a row p, from among rows 1 through p, having the duty cycles DCSIp through DCSnp and the uniformity level UNFMp. Upon finding the row p having the duty cycles DCSIp through DCSnp and the uniformity level UNFMp, the processor 114 determines that the duty cycles DCS1$p$ through DCSnp correspond to the uniformity level UNFMp. The row p includes one-to-one correspondence between the duty cycles DCS1$p$ through DCSnp and the uniformity level UNFMp. The processor 114 accesses, such as reads, from the listing 117, the duty cycles DCS1$p$ through DCSnp.

The processor 114 generates a recipe signal 128 including the duty cycles DCS1$p$ through DCSnp of the variable of the RF signal 130, and sends the recipe signal 128 via the transfer cable TC1 to the RF generator RFG1. Upon receiving the duty cycles DCS1$p$ through DCSnp, the RF generator RFG1 stores the duty cycles DCS1$p$ through DCSnp in one or more memory devices within the RF generator RFG1.

In addition, the RF generator RFG1 stores the variable and a parameter within the one or more memory devices of the RF generator RFG1 for each of the states S1 through Sn. For example, the RF generator RFG1 stores, in the one or more memory devices, multiple variable levels for the states S1 through Sn and a parameter level, such as a single parameter level, for the states S1 through Sn. The variable levels and the parameter level for the states S1 through Sn are received by the RF generator RFG1 via the transfer cable TC1 from the processor 114. To illustrate, the variable levels and the parameter level for the states S1 through Sn are received within the recipe signal 128. The processor 114 receives an input signal indicating the variable levels and the parameter level for the states S1 through Sn from the user via the input device.

An example of the parameter includes frequency. Another example of the parameter includes voltage or power. For example, when the variable is power or voltage, the parameter is frequency. As another example, when the variable is frequency, the parameter is power or voltage.

Moreover, the processor 114 generates a trigger signal 131 and sends the trigger signal 131 via the transfer cable TC1 to the RF generator RFG1. An example of the trigger signal 131 is a digital pulse signal. The digital pulse signal is not periodic and does not repeat. The trigger signal 131 is sent to the RF generator RFG1 after the recipe signal 128 is sent to the RF generator RFG1. Upon receiving the trigger signal 131, the RF generator RFG1 generates the RF signal 130 having the variable levels for the states S1 through Sn, the parameter level for the states S1 through Sn, and the duty cycles DCS1$p$ through DCSnp for the states S1 through Sn. The RF generator RFG1 supplies the RF signal 130 at the output O1.

The RF signal 130 is supplied from the output O1 via the RF cable RFC1 to the input I1 of the impedance matching circuit 102. When the RF signal 130 is transferred via the impedance matching circuit 102, the circuit components of the impedance matching circuit 102 match an impedance an at input of a load coupled to the output OIMC with an impedance at an output of a source coupled to the input I1 to modify an impedance of the RF signal 130. An example of the load includes the RF transmission line 122 and the plasma chamber 104. An example of the source includes the RF cable RFC1 and the RF generator RFG1. The impedance of the RF signal 130 is modified to output a modified RF signal 132 at the output OIMC.

The modified RF signal 132 is supplied from the output OIMC via the RF transmission line 122 to the lower electrode of the substrate support 108. In addition, when one or more process gases are supplied to the gap 112, plasma is stricken or maintained within the gap 112 to process the substrate S. Examples of processing the substrate S include etching the substrate S, or depositing one or more material layers on the substrate S, or cleaning the substrate S, or sputtering the substrate S. Examples of the one or more process gases include an oxygen containing gas, a fluorine containing gas, and a combination thereof.

In one embodiment, the terms impedance matching circuit, impedance matching network, match, impedance match, matching network, match circuit, and match network are used herein interchangeably.

In an embodiment, a duty cycle is a time interval for which the variable has a state and transitions from a preceding state to the state. For example, the duty cycle DCSnp is a time period for which the variable has the state Sn and transitions from a state S(n−1) to the state Sn. The state Sn is consecutive to the state S(n−1). The state S(n−1) precedes the state Sn.

In one embodiment, a duty cycle is a time interval for which the variable has a state and transitions from the state to a consecutive state. For example, the duty cycle DCS(n−1) p is a time period for which the variable has the state S(n−1) and transitions from the state S(n−1) to the state Sn. The state Sn is consecutive to the state S(n−1). The state S(n−1) precedes the state Sn.

In an embodiment, the impedance matching circuit 102 is coupled via the RF transmission line 122 to the upper electrode 110 instead of to the substrate support 108. In this embodiment, the substrate support 108 is coupled to the reference potential.

It should be noted that in one embodiment, a duty cycle defining a state of the variable of an RF signal is a time period for which an envelope of power values or frequency values delineating the state occurs. Examples of the envelope include a variable level, such as peak-to-peak magnitudes and zero-to-peak magnitudes. The peak-to-peak magnitudes are sometimes referred to herein as peak-to-peak amplitudes.

In one embodiment, a number of duty cycles corresponding to the uniformity level UNFMp is greater than or less than a number of duty cycles corresponding to a uniformity level UNFM(p−1). For example, the uniformity level UNFM1 has a one-to-one mapping with the three duty cycles DCS11, DCS21 and DCS31 and the uniformity level UNFM2 has a one-to-one mapping with the two duty cycles DCS12 and DCS22. To illustrate, the uniformity level UNFM1 is achieved by controlling the RF generator RFG1 to generate the first RF signal having the three duty cycles DCS11, DCS21 and DCS31. In this illustration, the uniformity level UNFM2 is achieved by controlling the RF generator RFG1 to generate the first RF signal having the two duty cycles DCS12 and DCS22.

In an embodiment, a first variable level for a first state, such as the state S1, is a first peak-to-peak amplitude or a first zero-to-peak amplitude of the variable and has one or more values. Also, a second variable level for a second state, such as the state S2, is a second peak-to-peak amplitude or a zero-to-peak amplitude of the variable and has one or more values. The first variable level is exclusive from the second variable level. For example, a minimum of the one or more values delineating the first variable level is greater than a maximum of the one or more values defining the second variable level. In this example, the first variable level is greater than the second variable level.

In an embodiment, a parameter level for multiple states, such as the states S1 through Sn, includes one or values of the parameter.

In an embodiment, a state represents a variable level. For example, a first state has a different variable level than a variable level of a second state. The variable level of the first state is greater than or lower than the variable level of the second state.

FIG. 2A is an embodiment of a graph 200 to illustrate multiple duty cycles defining the variable of the first RF signal that is generated by the RF generator RFG1 (FIG. 1). The graph 200 includes a plot 202 of the variable of the first RF signal generated by the RF generator RFG1 versus time t. The variable is plotted on a y-axis and the time t is plotted on an x-axis.

The x-axis of the graph 200 is divided into equal time intervals. For example, the x-axis of the graph 200 is divided into a first time interval between a time to and a time t1, a second time interval between the time t1 and a time t2, a third time interval between the time t2 and a time t3, a fourth time interval between the time t3 and a time t4, a fifth time interval between the time t4 and a time t5, a sixth time interval between the time t5 and a time t6, a seventh time interval between the time t6 and a time t7, and an eighth time interval between the time t7 and a time t8. Also, the x-axis of the graph 200 is divided into a ninth time interval between the time t8 and a time t9, a tenth time interval between the time t9 and a time t10, an eleventh time interval between the time t10 and a time t11, a twelfth time interval between the time t11 and a time t12, a thirteenth time interval between the time t12 and a time t13, a fourteenth time interval between the time t13 and a time t14, a fifteenth time interval between the time t14 and a time t15, and a sixteenth time interval between the time t15 and a time t16.

The y-axis of the graph 200 is divided into variable levels of the first RF signal. For example, the y-axis of the graph 200 has a variable level 0, a variable level Vla, a variable level V2a, a variable level V3a, and a variable level V4a. The variable level V4a is greater than the variable level V3a, which is greater than the variable level V2a. The variable level V2a is greater than the variable level Vla, which is greater than the variable level of zero.

Also, the y-axis of the graph 200 is divided into the equal variable level intervals. For example, a first interval between the variable levels 0 and Vla is equal to a second interval between the variable levels Vla and V2a. Also, the second interval is equal to a third interval between the variable levels V2a and V3a. Similarly, the third interval is equal to a fourth interval between the variable levels V3a and V4a.

The plot 202 transitions at the time to from the variable level Vla to the variable level V4a. The plot 202 has the variable level V4a during a time period between the time t0 and the time t2. The plot 202 transitions at the time t2 from the variable level V4a to the variable level V3a. The plot 202 remains at the variable level V3a during a time interval between the time t2 and the time t4, and transitions at the time t4 from the variable level V3a to the variable level V2a. The plot 202 has the variable level V2a during a time interval between the time t4 to the time t6. The plot 202 transitions from the variable level V2a to the variable level Vla at the time t6 and remains at the variable level Vla during a time period between the time t6 and the time t8.

The variable level V4a of the plot 202 defines the state S4 of the variable of the first RF signal. Similarly, the variable level V3a of the plot 202 defines the state S3 of the variable of the first RF signal, the variable level V2a of the plot 202 defines the state S2 of the variable of the first RF signal, and the variable level Vla of the plot 202 defines the state S1 of the variable of the first RF signal.

The variable levels V4a through Vla of the plot 202 repeat during each cycle of the clock signal. For example, first instances of the variable levels V4a through Vla of the plot 202 occur during a cycle 1 of the clock signal and second instances of the variable levels V4a through Vla occur during a cycle 2 of the clock signal. The cycle 2 is consecutive to the cycle 1. The cycle 1 precedes the cycle 2.

The clock signal can be generated by a clock source, such as a processor or a clock oscillator, within the RF generator RFG1. As an example, the clock signal is a square wave pulsed signal.

The time interval for which the state S4 of the variable of the plot 202 of the first RF signal occurs is illustrated as a duty cycle DCS41. Similarly, the time interval for which the state S3 of the variable of the plot 202 of the first RF signal occurs is illustrated as a duty cycle DCS31, the time interval for which the state S2 of the variable of the plot 202 of the first RF signal occurs is illustrated as the duty cycle DCS21, and the time interval for which the state S1 of the variable of the plot 202 of the first RF signal occurs is illustrated as the duty cycle DCS11.

In one embodiment, the clock signal is generated by the processor 114 and supplied via the transfer cable TC1 or a separate cable to the RF generator RFG1.

In an embodiment, a transition of the variable, illustrated in the plot 202, of the RF signal 130 occurs within a time interval. For example, instead of transitioning from the variable level V4a to the variable level V3a at the time t2, the plot 202 transitions during a time interval from a first time to a second time. The first time is between a time t1.5 and the time t2, and the second time is between the time t2 and a time t2.5. The time t1.5 occurs at half of the time interval between the times t1 and t2, and the time t2.5 occurs at half of the time interval between the times t2 and t3. In this example, a duty cycle of the variable level V3a includes a time interval of occurrence of the variable level V3a and the time interval of the transition from the variable level V4a to the variable level V3a. As another example, a duty cycle of the variable level V4a includes a time interval of occurrence of the variable level V4a and the time interval of the transition from the variable level V4a to the variable level V3a.

FIG. 2B is an embodiment of a graph 210 to illustrate a change in duty cycles for one or more states defining the variable of the RF signal 130. The graph 210 includes a plot 212 of the variable of the RF signal 130 (FIG. 1) versus the time t. The variable is plotted on a y-axis of the graph 210 and the time t is plotted on an x-axis of the graph 210.

The x-axis of the graph 200 is divided into the equal time intervals illustrated in the graph 200 of FIG. 2A. Also, the y-axis of the graph 210 is divided into equal intervals of variable levels in the same manner as that of the graph 200. The plot 212 transitions from the variable level of zero to the variable level V4a at the time to. The plot 212 has the variable level V4a during a time period between the time to and the time t2.5. The plot 212 transitions at the time t2.5 from the variable level V4a to the variable level V3a. The plot 212 remains at the variable level V3a during a time interval between the time t2.5 and the time t4, and transitions at the time t4 from the variable level V3a to the variable level V2a. The plot 212 has the variable level V2a during a time interval between the time t4 and a time t6.5, which is at half of a time interval between the times t6 and t7. The plot 212 transitions from the variable level V2a to the variable level V1a at the time t6.5 and remains at the variable level V1a during a time period between the time t6.5 and the time t8.

The variable level V4a illustrated in the plot 212 defines the state S4 of the variable of the RF signal 130. Similarly, the variable level V3a indicated in the plot 212 defines the state S3 of the variable of the RF signal 130, the variable level V2a illustrated in the plot 212 defines the state S2 of the variable, and the variable level V1a indicated in the plot 212 defines the state S1 of the variable.

The variable levels V4a through V1a indicated in the plot 212 repeat during each cycle of a clock signal. For example, first instances of the variable levels V4a through V1a illustrated in the plot 202 occur during the cycle 1 of the clock signal and second instances of the variable levels V4a through V1a indicated in the plot 202 occur during the cycle 2.

The time interval for which the state S4 of the variable of the plot 212 occurs is illustrated as a duty cycle DCS4p. Similarly, the time interval for which the state S3 of the variable of the plot 212 occurs is illustrated as the duty cycle DCS3p, the time interval for which the state S2 of the variable occurs is illustrated as the duty cycle DCS2p, and the time interval for which the state S1 of the variable occurs is illustrated as the duty cycle DCS1p.

It should be noted that the duty cycles DCS41, DCS31, DCS21, and DCS11 are adjusted to generate the duty cycles DCS4p, DCS3p, DCS2p, and DCS1p. For example, the duty cycle DCS4p is greater than the duty cycle DCS41 (FIG. 2A) and the duty cycle DCS3p is less than the duty cycle DCS31 (FIG. 2A). Also, the duty cycle DCS2p is greater than the duty cycle DCS21 (FIG. 2A) and the duty cycle DCS1p is less than the duty cycle DCS11 (FIG. 2A).

In an embodiment, a transition of the variable, illustrated in the plot 212, of the RF signal 130 occurs within a time interval. For example, instead of transitioning from the variable level V4a to the variable level V3a at the time t2.5, the plot 212 transitions during a time interval from a first time to a second time. The first time is between the time t2 and the time t2.5, and the second time is between the time t2.5 and the time t3. In this example, a duty cycle defining the variable level V3a includes a time interval of occurrence of the variable level V3a and the time interval of the transition from the variable level V4a to the variable level V3a. As another example, a duty cycle defining the variable level V4a includes a time interval of occurrence of the variable level V4a and the time interval of the transition from the variable level V4a to the variable level V3a.

Figure 2C:
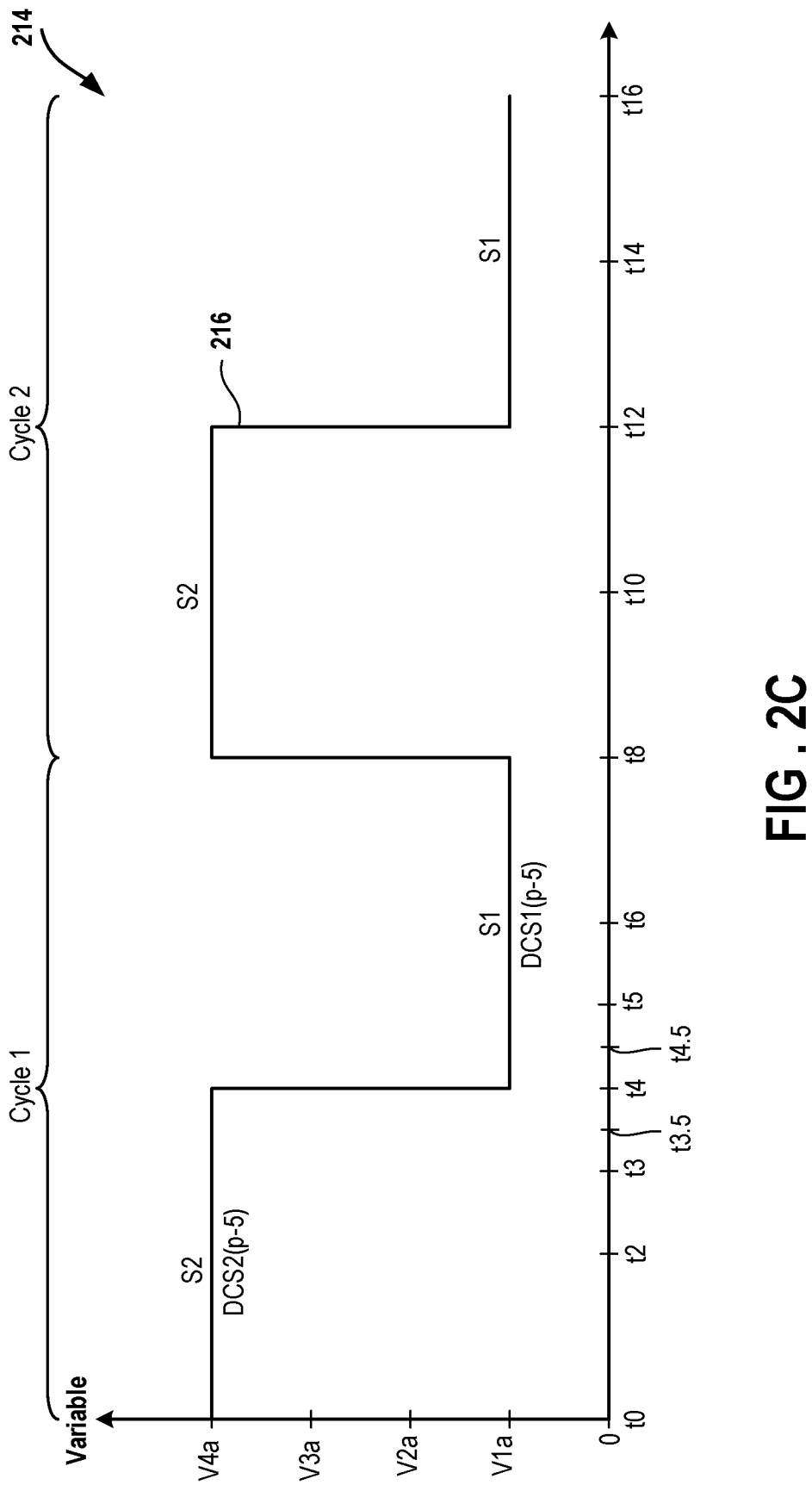
FIG. 2C is an embodiment of a graph to illustrate a change in duty cycles for one or more states of a variable of an RF signal.

FIG. 2C is an embodiment of a graph 214 to illustrate a change in duty cycles for one or more states of the variable of the first RF signal generated by the RF generator RFG1 (FIG. 1). The graph 214 includes a plot 216 of the variable of a (p−5)th RF signal generated by the RF generator RFG1 versus the time t. The variable of the (p−5)th RF signal is plotted on a y-axis of the graph 214 and the time t is plotted on an x-axis of the graph 214.

The x-axis of the graph 214 is divided into the equal time intervals illustrated in the graph 200 of FIG. 2A. Also, the y-axis in the graph 214 is divided into equal intervals of variable levels in the same manner as that in the graph 200. The plot 216 transitions from the variable level of zero to the variable level of V4a at the time to. The plot 216 has the variable level V4a during a time period between the time to and the time t4. The plot 216 transitions at the time t4 from the variable level V4a to the variable level V1a. The plot 216 remains at the variable level V1a during a time interval between the time t4 and the time t8, and transitions at the time t8 from the variable level V1a to the variable level V4a.

The variable level V4a of the plot 216 defines the state S2 of the variable of the (p−5)th RF signal. Similarly, the variable level V1a of the plot 216 defines the state S1 of the variable of the (p−5)th RF signal. The variable levels V1a and V4a of the plot 216 repeat during each cycle of the clock signal. For example, first instances of the variable levels V1a and V4a of the plot 216 occur during the cycle 1 and second instances of the variable levels V1a and V4a occur during the cycle 2.

The time interval for which the state S2 of the variable of the plot 216 of the (p−5)th RF signal occurs is illustrated as a duty cycle DCS2(p−5). Similarly, the time interval for which the state S1 of the variable of the plot 216 of the (p−5)th RF signal occurs is illustrated as a duty cycle DCS1(p−5).

It should be noted that the duty cycles DCS41, DCS31, DCS21, and DCS11 of the first RF signal generated by the RF generator RFG1 are adjusted to generate the duty cycles DCS2(p−5) and DCS1(p−5) generated by the RF generator RFG1. For example, the duty cycle DCS41 is adjusted to be zero, the duty cycle DCS31 is adjusted to be zero, the duty cycle DCS21 is adjusted to be DCS2(p−5), and the duty cycle DCS11 is adjusted to be DCS1(p−5).

In an embodiment, a transition of the variable, illustrated in the plot 216, of the (p−5)th RF signal occurs within a time interval. For example, instead of transitioning from the variable level V4a to the variable level V1a at the time t4, the plot 216 transitions during a time interval from a first time to a second time. The first time is between a time t3.5 and the time t4 and the second time is between the time t4 and a time t4.5. The time t3.5 occurs at half of the time interval between the times t3 and t4. The time t4.5 occurs at half of the time interval between the times t4 and t5. In this example, a duty cycle of the variable level V1a includes a time interval of occurrence of the variable level V1a and the time interval defining the transition from the variable level V4a to the variable level V1a. As another example, a duty cycle defining the variable level V4a includes a time interval of occurrence of the variable level V4a and the time interval of the transition from the variable level V4a to the variable level V1a.

Figure 3:
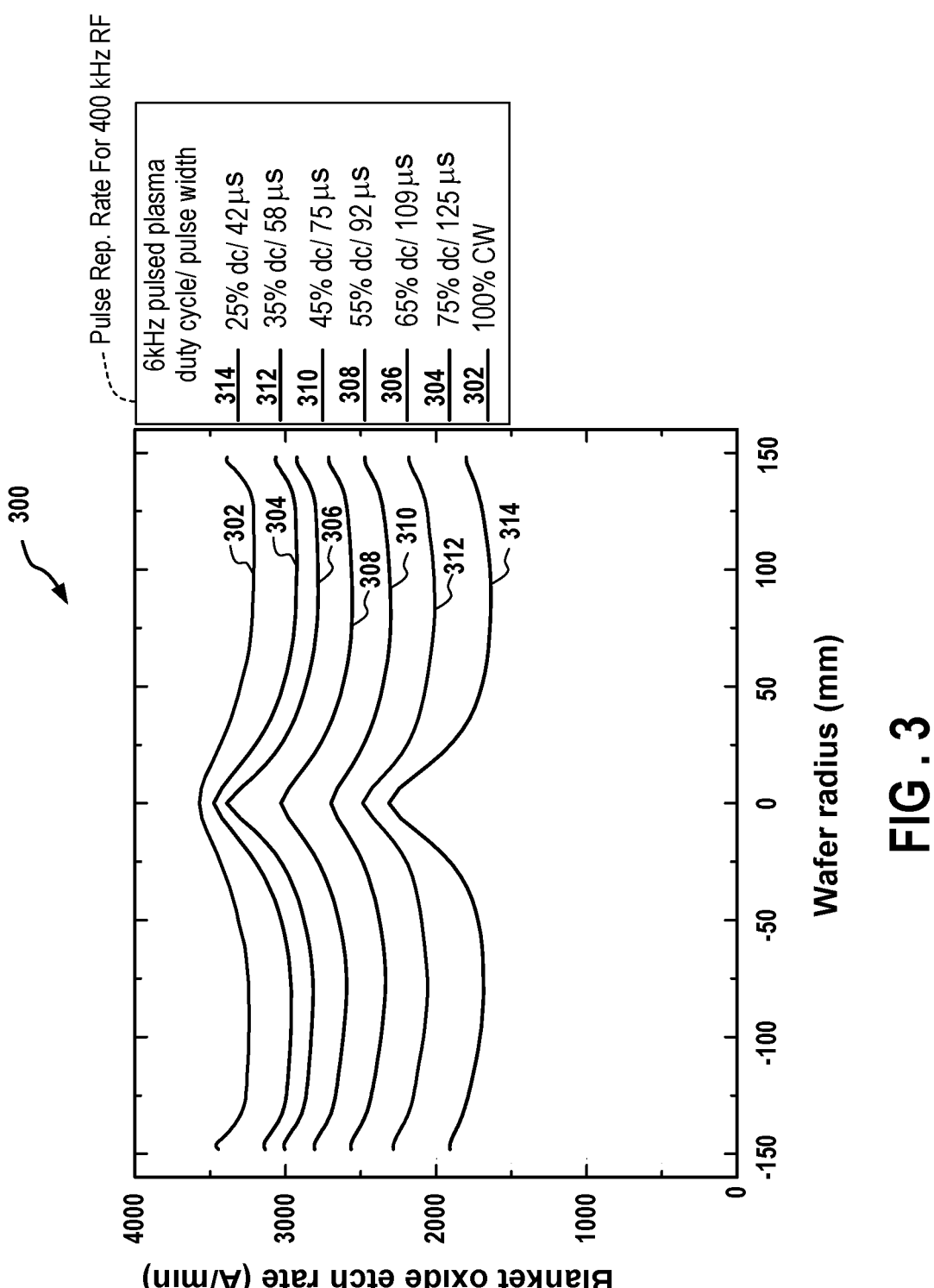
FIG. 3 is an embodiment of a graph to illustrate a change in an etch rate of etching a substrate versus a radius of the substrate.

FIG. 3 is an embodiment of a graph 300 to illustrate a change in an etch rate for etching the substrate S (FIG. 1) versus a radius of the substrate S. The etch rate across the radius of the substrate S is an example of a uniformity level in a rate for etching the substrate S. The etch rate is plotted on a y-axis and the radius of the substrate S is plotted on an x-axis. The graph 300 includes multiple plots 302, 304, 306, 308, 310, 312, and 314 to illustrate that with a change in one or more duty cycles of one or more states of the variable defining the RF signal 130 (FIG. 1), there is a change in uniformity, such as an uniformity level, in etch rates across the top surface 124 (FIG. 1). For example, when the RF signal 130 has only two states S1 and S2, and a duty cycle of the state S1 is 25%, uniformity in etch rates across the top surface 124 is illustrated by the plot 314. As another example, when the RF signal 130 has only two states S1 and S2 during each clock cycle of the clock signal, and a duty cycle of the state S1 is 75%, uniformity in etch rates across the top surface 124 is illustrated by the plot 304.

The graph 300 includes the plots 302-314 defining duty cycles of the variable of the RF signal 310 when the RF signal 130 has only two states S1 and S2. However, it should be noted that the plot 302 is generated when the state S1 defining the variable of the RF signal 130 has a duty cycle of 100%. For example, the plot 302 is generated when the variable of the RF signal 130 is a continuous wave (CW). To illustrate, the plot 302 is generated when the variable of the RF signal 130 has the state S1 only.

As such, as illustrated in the graph 300, uniformity in etch rates increases at a central region proximate to a center of the substrate S with an increase in the duty cycle for the state S1 and decreases at the central region with a decrease in the duty cycle. An example of the central region includes a region that is within a pre-determined distance from a center of the substrate S. To illustrate, the pre-determined distance from the center is ±50 millimeters (mm). As another illustrate, the pre-determined distance from the center is ±25 mm.

Also, as illustrated in the graph 300, uniformity in etch rates increases at an edge region distal from the central region of the substrate S with an increase in the duty cycle for the state S1 and decreases at the edge region with a decrease in the duty cycle. An example of the edge region distal from the central region includes a region that is within a pre-set distance from an edge of the substrate S. To illustrate, the pre-set distance from the edge of the substrate S is ±25 mm. As another illustrate, the pre-set distance from the radius of zero is ±50 mm. The edge region surrounds the central region and is peripheral to the central region.

Figure 4:
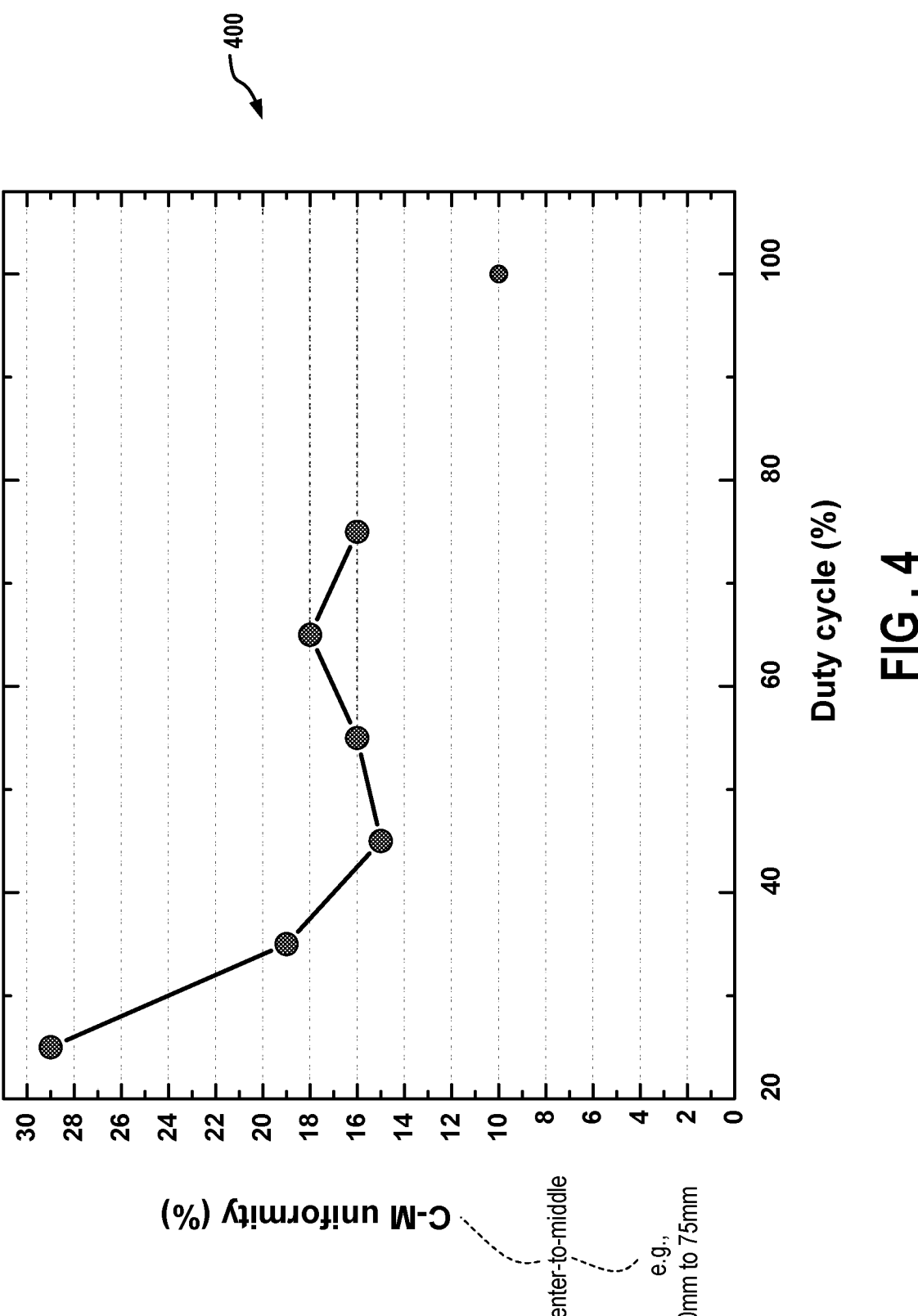
FIG. 4 is an embodiment of a graph to illustrate a decrease in uniformity in a rate of processing of the substrate with an increase in a duty cycle associated with a state of a variable of first through pth RF signals.

FIG. 4 is an embodiment of a graph 400 to illustrate a decrease in uniformity in a rate to process the substrate S (FIG. 1) with an increase in a duty cycle of the state S1 defining the variable of one of the first through pth RF signals (FIG. 1). It should be noted that in the embodiment illustrated using the graph 400, the variable of the one of the first through pth RF signals has only two states, which include the state S1 and the state S2. The graph 400 plots a percentage of a center-to-middle (C-M) uniformity versus a percentage of a duty cycle defining the state S1 of the variable of the one of the first through pth RF signals. An example of the C-M uniformity is uniformity from a center of the substrate S. To illustrate, the C-M uniformity is from the center of the substrate S to 75 mm along the radius of the substrate S. The C-M uniformity percentage is plotted on a y-axis and the duty cycle percentage defining the state S1 of the variable of the one of the first through pth RF signals is plotted on an x-axis. As illustrated in the graph 400, as the percentage of the duty cycle defining the state S1 of the variable of the one of the first through pth RF signals increases, the C-M uniformity percentage, which is a measure of the uniformity in the processing rate of the substrate S, decreases.

FIG. 5A is a diagram of an embodiment of a system 500 to illustrate generation of the listing 117 having uniformity levels and duty cycles. The system 500 includes the host computer 106, the RF generator RFG1, the impedance matching circuit 102, and a plasma chamber 503.

The plasma chamber 503 has the same components as that of the plasma chamber 104 (FIG. 1). For example, the plasma chamber 503 includes the substrate support 108 and the upper electrode 110.

The plasma chamber 503 has a sidewall 502, which has multiple windows 504, 506, and 508. For example, the windows 504-508 are integrated into the sidewall 502. The plasma chamber 503 has a top wall 510 and a bottom wall 512. The top wall 510 is placed on top of the sidewall 502, which is placed on top of the bottom wall 512.

Associated with the windows 504 are etch rate measurement devices (ERMD) 514, 516, and 518. For example, the ERMD 514 is attached to the window 504, the ERMD 516 is attached to the window 506, and the ERMD 518 is attached to the window 508. As another example, ERMD 514 is placed proximate to the window 504, the ERMD 516 is placed proximate to the window 506, and the ERMD 518 is placed proximate to the window 508. As an example, each ERMD includes a spectrophotometer that monitors the plasma within the plasma chamber 102 to measure intensity of radiation emitted by the plasma generated within the plasma chamber 102. As an example, each window 504, 506, and 508 is made of a transparent material, such as glass, that allows light emitted by the plasma to pass through. In various embodiments, each window 504, 506, and 508 is a translucent window.

The ERMD 514 is coupled to the processor 114 via a transfer cable 520 and has a line of sight via the window 504 into the gap 112 of the plasma chamber 102. The line of sight of the ERMD 514 is directed into a space in which the plasma is generated within the plasma chamber 503. For example, the ERMD 514 includes a spectrophotometer that monitors plasma within the plasma chamber 102 to measure intensity of radiation emitted by the plasma via the window 504. The intensity of radiation emitted by the plasma via the window 504 is directly proportional to an etch rate of a left edge region 528 of a substrate 526 that is processed by the plasma within the plasma chamber 102. As an example, the line of sight of the ERMD 514 is directed to the left edge region 528 of the substrate 526. An example of the substrate 526 is a dummy substrate, which is not processed to fabricate integrated circuits, such as PLDs, FPGAs, and Application Specific Integrated Circuits (ASICs). Another example of the substrate 526 is a substrate, such as a semiconductor wafer.

Similarly, the ERMD 516 is coupled to the processor 114 via a transfer cable 522 and has a line of sight via the window 506 into the gap 112 of the plasma chamber 102. The line of sight of the ERMD 516 is directed into the space in which the plasma is generated within the plasma chamber 503. For example, the ERMD 516 includes a spectrophotometer that monitors plasma within the plasma chamber 102 to measure intensity of radiation emitted by the plasma via the window 506. The intensity of radiation emitted by the plasma via the window 506 is directly proportional to an etch rate of a central region 532 of the substrate 526 that is processed by the plasma within the plasma chamber 102. As an example, the line of sight of the ERMD 516 is directed to the central region 532 of the substrate 526.

Also, the ERMD 518 is coupled to the processor 114 via a transfer cable 524 and has a line of sight via the window 508 into the gap 112 of the plasma chamber 102. The line of sight of the ERMD 518 is directed into the space in which the plasma is generated within the plasma chamber 503. For example, the ERMD 518 includes a spectrophotometer that monitors plasma within the plasma chamber 102 to measure intensity of radiation emitted by the plasma via the window 508. The intensity of radiation emitted by the plasma via the window 508 is directly proportional to an etch rate of a right edge region 530 of the substrate 526 that is processed by the plasma within the plasma chamber 102. As an example, the line of sight of the ERMD 518 is directed to the right edge region 530 of the substrate 526.

It should be noted that the left edge region 528 is towards one side of the central region 532 and the right edge region 530 is towards an opposite side of the central region 532. For example, the left edge region 528 is on a left side of the central region 532 and the right edge region 530 is on a right side of the central region 532.

The substrate 526 is placed within the plasma chamber 503. Thereafter, the processor 114 controls the RF generator RFG1 in a manner described about with reference to FIG. 1 to generate the pth RF signal, such as the RF signal 130. The pth RF signal having the duty cycles DCS1$p$ through DCSn$p$ for the states S1 through Sn of the variable of the pth RF signal is supplied to the impedance matching circuit 102, which outputs the modified RF signal 132 to the plasma chamber 503. When the modified RF signal 132 is sent to the plasma chamber 503 and the one or more process gases are supplied to the gap 112 within the plasma chamber 102, plasma is generated within the gap 112 in the plasma chamber 503.

After plasma is generated within the gap 112, during a time period TP1, the ERMD 514 generates an intensity signal 534 based on the line of sight towards the left edge region 528 of the substrate 526, and sends the intensity signal 534 via the transfer cable 520 to the processor 114. Similarly, during the time period TP1, the ERMD 516 generates an intensity signal 536 based on the line of sight towards the central region 532 of the substrate 526, and sends the intensity signal 536 via the transfer cable 522 to the processor 114. Also, during the time period TP1, the ERMD 518 generates an intensity signal 538 based on the line of sight towards the right edge region 530 of the substrate 526, and sends the intensity signal 538 via the transfer cable 524 to the processor 114.

A time period TP2 occurs after a passage of a pre-set time period from an end of the time period TP1. As an example, the time period TP2 is equal to the time period TP1. As another example, the time period TP2 is greater or less than the time period TP1 by a pre-set amount, which is stored in the memory device 116. During the time period TP2, the ERMD 514 generates an intensity signal 540 based on the line of sight towards the left edge region 528 of the substrate 526, and sends the intensity signal 540 via the transfer cable 520 to the processor 114. Similarly, during the time period TP2, the ERMD 516 generates an intensity signal 542 based on the line of sight towards the central region 532 of the substrate 526, and sends the intensity signal 542 via the transfer cable 522 to the processor 114. Also, during the time period TP1, the ERMD 518 generates an intensity signal 544 based on the line of sight towards the right edge region 530 of the substrate 526, and sends the intensity signal 544 via the transfer cable 524 to the processor 114.

The processor 114 determines based on the intensity signals 534 and 540 received from the ERMD 514, a processing rate of processing the left edge region 528 of the substrate 526. For example, the processor 114 calculates a ratio of a first difference and a second difference. The first difference is a difference between an intensity value received within the intensity signal 540 and an intensity value received within the intensity signal 534. The second difference is a difference between the time periods TP2 and TP1. To illustrate, the second difference is a difference between an end of the time period TP2 and an end of the time period TP1. As another illustration, the second difference is a difference between a start of the time period TP2 and a start of the time period TP1. The ratio of the first and second differences is a processing rate PRpa to process the left edge region 528 of the substrate 526. The processor 114 stores the processing rate PRpa in the listing 117 of the memory device 116.

Similarly, the processor 114 determines based on the intensity signals 536 and 542 received from the ERMD 516, a processing rate for processing the central region 532 of the substrate 526. For example, the processor 114 calculates a ratio of a first difference and a second difference. The first difference is a difference between an intensity value received within the intensity signal 542 and an intensity value received within the intensity signal 538. The second difference is a difference between the time periods TP2 and TP1. The ratio of the first and second differences is a processing rate PRpb for processing the central region 532 of the substrate 526. The processor 114 stores the processing rate PRpb in the listing 117 of the memory device 116.

Also, the processor 114 determines based on the intensity signals 538 and 544 received from the ERMD 518, a processing rate for processing the right edge region 530 of the substrate 526. For example, the processor 114 calculates a ratio of a first difference and a second difference. The first difference is a difference between an intensity value received within the intensity signal 544 and an intensity value received within the intensity signal 538. The second difference is a difference between the time periods TP2 and TP1. The ratio of the first and second differences is a processing rate PRpc for processing the right edge region 530 of the substrate 526. The processor 114 stores the processing rate PRpc in the listing 117 of the memory device 116.

The processor 114 associates the processing rates PRpa through PRpc with the uniformity level UNFMp and stores the uniformity level UNFMp within the listing 117 of the memory device 116. For example, the processor 114 determines that the processing rates PRpa through PRpc define or form the uniformity level UNFMp, and stores the uniformity level UNFMp in the memory device 116. As another example, the processor 114 interpolates, such as estimates, data points between the processing rates PRpa and PRPb and between the processing rates PRpb and PRpc to generate the uniformity level UNFMp, and stores the uniformity level UNFMp within the memory device 116. To illustrate the interpolation, the processor 114 generates a first smooth curve between the processing rates PRpa and PRpb and a second smooth curve between the PRpb and PRpc to generate the uniformity level UNFMp. The first smooth curve has the processing rates PRpa and PRpb as its end points, and the second smooth curve has the PRpb and PRpc as its end points. The interpolation creates a first set of additional processing rates between the processing rates PRpa and PRpb and a second set of additional processing rates between the processing rates PRpb and PRpc. The processing rates PRpa and PRpb, the data points between the processing rates PRpa and PRpb, the processing rates PRpb and PRpc, and the data points between the processing rates PRpb and PRpc define the uniformity level UNFMp.

In a similar manner as that described above for determining the processing rates PRpa through PRpc, the processor 114 determines multiple processing rates PR1a, PR1b, and PR1c when the first RF signal is supplied by the RF generator RFG1, and stores the processing rates PR1a through PR1c in the listing 117 within the memory device 116. The first RF signal has the duty cycles DCS11, DCS21 and so on until the duty cycle DCSn1. When the first RF signal is supplied to the impedance matching circuit 102, a first modified RF signal is output from the output OIMC of the impedance matching circuit 102 and sent via the RF transmission line 122 to the lower electrode of the substrate support 108. Also, when the first modified RF signal is supplied to the substrate support 108 of the plasma chamber 503, the one or more process gases are supplied to the gap 112 of the plasma chamber 503. The processor 114 defines the uniformity level UNFM1 based on the processing rates PR1a through PR1c in the manner described above for defining the uniformity level UMFMp and stores the uniformity level UNFM1 within the listing 117 of the memory device 116.

Also, in the similar manner as that described above for determining the processing rates PRpa through PRpc, the processor 114 determines multiple processing rates PR2a, PR2b, and PR2c when the second RF signal is supplied by the RF generator RFG1, and stores the processing rates PR2a through PR2c in the listing 117 within the memory device 116. The second RF signal has the duty cycles DCS12, DCS22 and so on until the duty cycle DCSn2. When the second RF signal is supplied to the impedance matching circuit 102, a second modified RF signal is output from the output OIMC of the impedance matching circuit 102 and sent via the RF transmission line 122 to the lower electrode of the substrate support 108. Also, when the second modified RF signal is supplied to the substrate support 108 of the plasma chamber 503, the one or more process gases are supplied to the gap 112 of the plasma chamber 503. Also, the processor 114 defines the uniformity level UNFM2 based on the processing rates PR2a through PR2c in the manner described above for defining the uniformity level UMFMp and stores the uniformity level UNFM2 within the listing 117 of the memory device 116.

In the similar manner as that described above for determining the processing rates PRpa through PRpc, the processor 114 determines multiple processing rates PR3a, PR3b, and PR3c when the third RF signal is supplied by the RF generator RFG1, and stores the processing rates PR3a through PR3c in the listing 117 within the memory device 116. The third RF signal has the duty cycles DCS13, DCS23 and so on until the duty cycle DCSn3. When the third RF signal is supplied to the impedance matching circuit 102, a third modified RF signal is output from the output OIMC and sent via the RF transmission line 122 to the lower electrode of the substrate support 108. Also, when the third modified RF signal is supplied to the substrate support 108 within the plasma chamber 503, the one or more process gases are supplied to the gap 112 within the plasma chamber 503. Also, the processor 114 defines the uniformity level UNFM3 based on the processing rates PR3a through PR3c in the manner described above for defining the uniformity level UMFMp and stores the uniformity level UNFM3 within the listing 117 of the memory device 116.

Figure 5B:
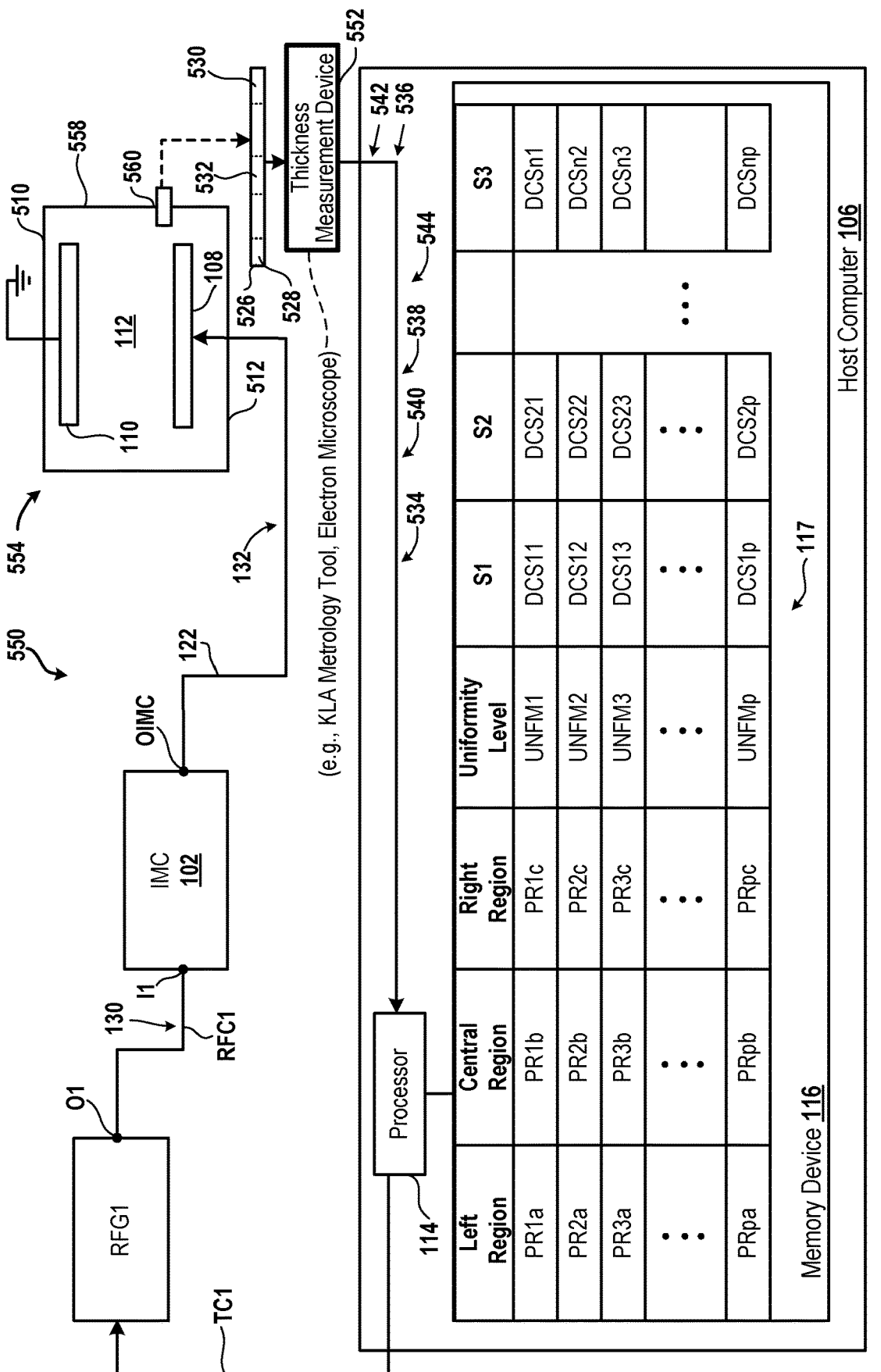
FIG. 5B is a diagram of an embodiment of a system to illustrate use of a thickness measurement device to measure intensity values of light emitted by plasma reflected from a left edge region, a central region, and a right edge region of the substrate.

FIG. 5B is a diagram of an embodiment of a system 550 to illustrate use of a thickness measurement device 552 to measure intensity values of light emitted from plasma reflected from the left edge region 526, the central region 532, and the right edge region 530. The system 550 includes the RF generator RFG1, the impedance matching circuit 102, a plasma chamber 554, the thickness measurement device 552, and the host computer 106. Examples of the thickness measurement device 552 include an electron microscope, an optical ellipsometer, and a metrology tool. As an illustration, the metrology tool is manufactured by KLA™ corporation. The thickness measurement device 552 is coupled via a transfer cable 556 to the processor 114.

The plasma chamber 554 has the same components as the plasma chamber 104 (FIG. 1). The plasma chamber 554 has a side wall 558, the top wall 510 and the bottom wall 512. The top wall 510 is placed on top of the side wall 558 and the side wall 558 is placed on top of the bottom wall 512. The side wall 558 has an opening 560.

The substrate 526 is placed within the plasma chamber 554. Thereafter, the processor 114 controls the RF generator RFG1 in a manner described about with reference to FIG. 1 to generate the pth RF signal, such as the RF signal 130. The pth RF signal having the duty cycles DCS1p through DCSnp for the states S1 through Sn of the variable of the pth RF signal is supplied to the impedance matching circuit 102, which outputs the modified RF signal 132 to the plasma chamber 554. When the modified RF signal 132 is sent to the plasma chamber 554 and the one or more process gases are supplied to the gap 112 within the plasma chamber 102, plasma is generated within the gap 112 in the plasma chamber 554.

After the substrate 526 is processed using plasma generated within the plasma chamber 554, during the time period TP1, the substrate 526 is removed from the plasma chamber 554 via the opening 560 and placed below the thickness measurement device 552. When the left edge region 528 of the substrate 526 is placed below the thickness measurement device 552 and the thickness measurement device 552 has a line of sight towards the left edge region 528 during the time period TP1, the thickness measurement device 552 generates the intensity signal 534. Also, when the central region 532 of the substrate 526 is placed below the thickness measurement device 552 and the thickness measurement device 552 has a line of sight towards the central region 532 during the time period TP1, the thickness measurement device 552 generates the intensity signal 536. When the right edge region 530 of the substrate 526 is placed below the thickness measurement device 552 and the thickness measurement device 552 has a line of sight towards the right edge region 530 during the time period TP1, the thickness measurement device 552 generates the intensity signal 538. The intensity signals 534, 536, and 538 are sent from the thickness measurement device 552 via the transfer cable 556 to the processor 114.

After the intensity signals 534, 536, and 538 are generated and sent to the processor 114, the substrate 526 is then placed back in the plasma chamber 554 for further processing. After the pre-set time period has passed from the time period TP1, the substrate 526 is removed from the plasma chamber 554 via the opening 560. During the time period TP2, the substrate 526 is removed from the plasma chamber 554 and placed below the thickness measurement device 552. When the left edge region 528 of the substrate 526 is placed below the thickness measurement device 552 and the thickness measurement device 552 has a line of sight towards the left edge region 528 during the time period TP2, the thickness measurement device 552 generates the intensity signal 540. Also, when the central region 532 of the substrate 526 is placed below the thickness measurement device 552 and the thickness measurement device 552 has a line of sight towards the central region 532 during the time period TP1, the thickness measurement device 552 generates the intensity signal 542. When the right edge region 530 of the substrate 526 is placed below the thickness measurement device 552 and the thickness measurement device 552 has a line of sight towards the right edge region 530 during the time period TP1, the thickness measurement device 552 generates the intensity signal 544. The intensity signals 540, 542, and 544 are sent from the thickness measurement device 552 via the transfer cable 556 to the processor 114. The processor 114 determines the processing rates PRpa, PRpb, and PRpc from the intensity signals 534, 536, 538, 540, 542, and 544 in the same manner as that described above with reference to FIG. 5A, determines the uniformity level UNFMp based on the processing rates PRpa, PRpb, and PRpc, and stores the processing rates PRpa, PRpb, and PRpc, and the uniformity level UNFMp in the listing 117 of the memory device 116.

In a similar manner as that described above for determining the processing rates PRpa through PRpc with reference to FIG. 5B, the processor 114 determines the processing rates PR1a, PR1b, and PR1c when the first RF signal is supplied by the RF generator RFG1, and stores the processing rates PR1a through PR1c in the listing 117 within the memory device 116. The first RF signal has the duty cycles DCS11, DCS21 and so on until the duty cycle DCSn1. When the RF generator RFG1 supplies the first RF signal to the impedance matching circuit 102, the impedance matching circuit 102 outputs the first modified RF signal to the lower electrode of the substrate support 108 of the plasma chamber 554. When the first modified RF signal is supplied to the lower electrode of the substrate support 108 and the one or more process gases are supplied to the plasma chamber 554, the substrate 526 is processed. After being processed, the substrate 526 is removed from the plasma chamber 554 via the opening 560 to placed under the thickness measurement device 552, which generates a first set of intensity signals. The processor 114 determines the processing rates PR1a, PR1b, and PR1c based on the first set of intensity signals in the same manner as that described above with reference to FIG. 5B, uses the processing rates PR1a, PR1b, and PR1c to define the uniformity level UNFM1, and stores the processing rates PR1a, PR1b, and PR1c, and the uniformity level UNFM1 in the listing 117 of the memory device 116.

Moreover, in a similar manner as that described above for determining the processing rates PRpa through PRpc with reference to FIG. 5B, the processor 114 determines the processing rates PR2a, PR2b, and PR2c when the second RF signal is supplied by the RF generator RFG1, and stores the processing rates PR2a through PR2c in the listing 117 within the memory device 116. The second RF signal has the duty cycles DCS12, DCS22 and so on until the duty cycle DCSn2. When the RF generator RFG1 supplies the second RF signal to the impedance matching circuit 102, the impedance matching circuit 102 outputs the second modified RF signal to the lower electrode of the substrate support 108 of the plasma chamber 554. When the second modified RF signal is supplied to the lower electrode of the substrate support 108 and the one or more process gases are supplied to the plasma chamber 554, the substrate 526 is processed. After being processed, the substrate 526 is removed from the plasma chamber 554 via the opening 560 and placed under the thickness measurement device 552, which generates a second set of intensity signals. The processor 114 determines the processing rates PR2a, PR2b, and PR2c based on the second set of intensity signals in the same manner as that described above with reference to FIG. 5B, applies the processing rates PR2a, PR2b, and PR2c to determine the uniformity level UNFM2, and stores the processing rates PR2a, PR2b, and PR2c, and the uniformity level UNFM2 in the listing 117 of the memory device 116.

Also, in a similar manner as that described above for determining the processing rates PRpa through PRpc with reference to FIG. 5B, the processor 114 determines multiple processing rates PR3a, PR3b, and PR3c when the third RF signal is supplied by the RF generator RFG1, and stores the processing rates PR3a through PR3c in the listing 117 within the memory device 116. The third RF signal has the duty cycles DCS13, DCS23 and so on until the duty cycle DCSn3. When the RF generator RFG1 supplies the third RF signal to the impedance matching circuit 102, the impedance matching circuit 102 outputs the third modified RF signal to the lower electrode of the substrate support 108 of the plasma chamber 554. When the third modified RF signal is supplied to the lower electrode of the substrate support 108 and the one or more process gases are supplied to the plasma chamber 554, the substrate 526 is processed. After being processed, the substrate 526 is removed from the plasma chamber 554 via the opening 560 and placed under the thickness measurement device 552, which generates a third set of intensity signals. The processor 114 determines the processing rates PR3a, PR3b, and PR3c based on the third set of intensity signals in the same manner as that described above with reference to FIG. 5B, associates the processing rates PR3a, PR3b, and PR3c with the uniformity level UNFM3, and stores the processing rates PR3a, PR3b, and PR3c, and the uniformity level UNFM3 in the listing 117 of the memory device 116.

Figure 6:
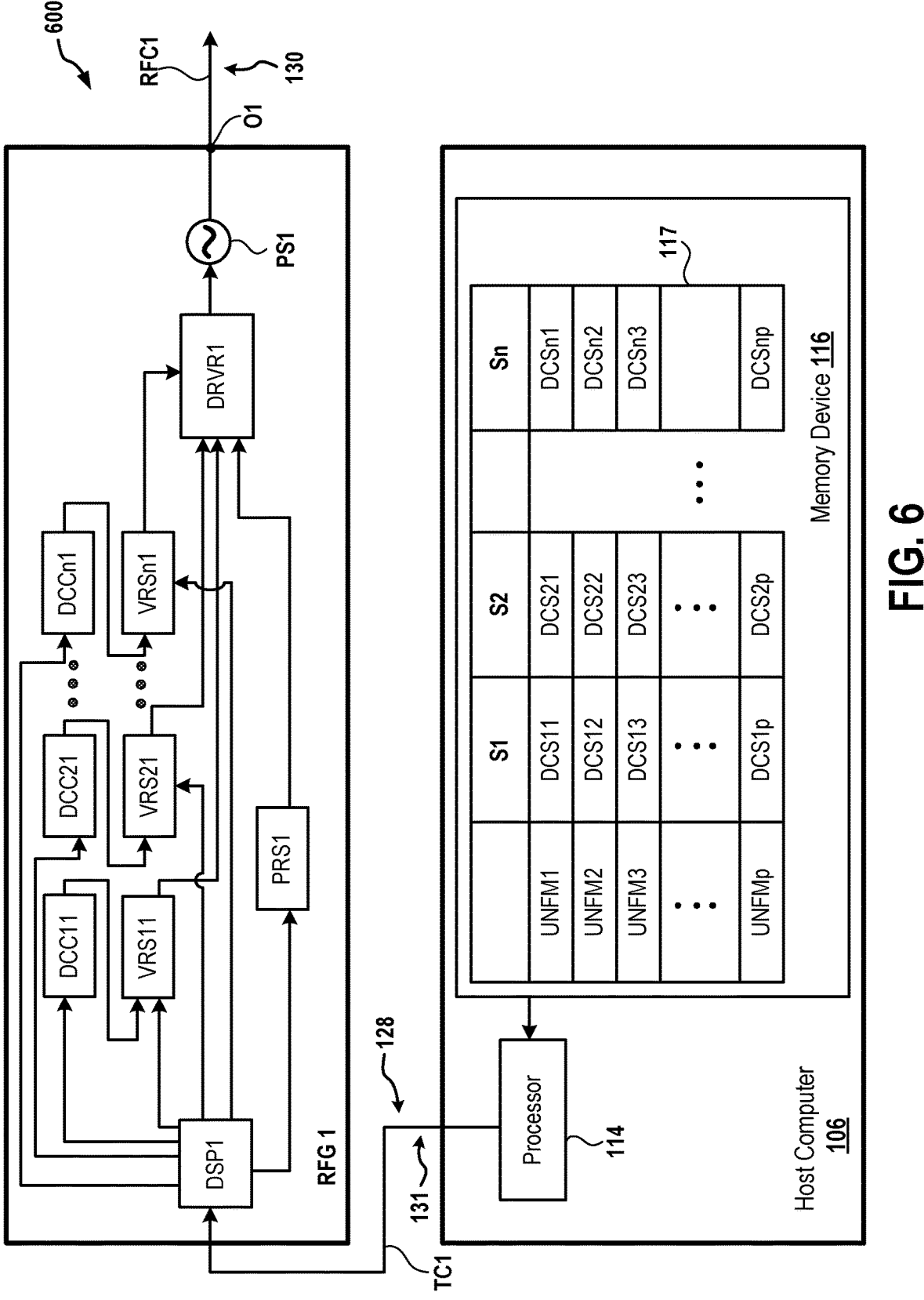
FIG. 6 is a diagram of an embodiment of a system to illustrate internal components within the RF generator of FIG. 1 to control duty cycles during states S1 through Sn associated with each of the first through pth RF signals.

FIG. 6 is a diagram of an embodiment of a system 600 to illustrate internal components within the RF generator RFG1 to control duty cycles during the states S1 through Sn of the each of the first through pth RF signals. The system 600 includes the RF generator RFG1 and the host computer 106.

The RF generator RFG1 includes a digital signal processor 1 (DSP1), and multiple controllers. The controllers include a duty cycle controller DCC11 for the state S1, a duty cycle controller DCC12 for the state S2, and so on until a duty cycle controller DCCn1 for the state Sn is included. Moreover, the controllers of the RF generator RFG1 include a variable controller VRS11 for the state S1, a variable controller VRS21 for the state S2, and so on until a variable controller VRSn1 for the state Sn is included. Also, the controllers of the RF generator RFG1 include a parameter controller PRS1 for the states S1 through Sn.

As an example, a controller, as used herein, includes a processor and a memory device. The processor of the controller is coupled to the memory device of the controller.

The RF generator RFG1 further includes a driver system DRVR1 and an power supply PS1. An example of a driver system, as used herein, includes a driver and an amplifier. The driver of the driver system is coupled to the amplifier of the amplifier system. Examples of the driver include one or more transistors that are coupled to each other. An example of an RF power supply, as used herein, includes an electronic oscillator that can generate an oscillating RF signal, such as a sine wave RF signal.

The processor 114 is coupled to the DSP1 via the transfer cable TC1. The DSP1 is coupled to the duty cycle controllers DCC11 through DCCn1, the variable controllers VRS11 through VRSn1, and the parameter controller PRS1. The duty cycle controller DCC11 is coupled to the variable controller VRS11. Also, the duty cycle controller DCC21 is coupled to the variable controller VRS21, and so on until the duty cycle controller DCCn1 is coupled to the variable controller VRSn1. The variable controllers VRS11 through VRSn1 and the parameter controller PRS1 are coupled to the driver system DRVR1, which is coupled to the power supply PS1. The power supply PS1 is coupled to the RF cable RFC1.

The processor 114 accesses the duty cycles DCS1$p$ through DCSnp from the listing 117 stored within the memory device 116, generates the recipe signal 128 having the duty cycles DCS1$p$ through DCSnp, and sends the recipe signal 128 via the transfer cable TC1 to the DSP1. For example, the processor 114 identifies the duty cycles DCS1$p$ through DCSnp as corresponding to the uniformity level UNFMp to be achieved, and generates the recipe signal 128 having the duty cycles DCS1$p$ through DCSnp. To illustrate, the processor 114 embeds the duty cycles DCS1$p$ through DCSnp within the recipe signal 128.

The processor 114 also includes duty cycle identifiers within the recipe signal 128 to indicate that the duty cycles DCS1$p$ through DCSnp are duty cycles for states of the variable defining the pth RF signal. For example, the processor 114 embeds a first duty cycle identifier within the recipe signal 128 to indicate that the duty cycle DCS1$p$ is for the state S1 of the variable defining the pth RF signal, a second duty cycle identifier within the recipe signal 128 to indicate that the duty cycle DCS2$p$ is for the state S2 of the variable, and so on until an nth duty cycle identifier within the recipe signal 128 to indicate that the duty cycle DCSnp is for the state Sn of the variable.

Upon receiving the duty cycles DCS1$p$ through DCSnp embedded within the recipe signal 128, the digital signal processor DSP1 determines that the recipe signal 128 includes the duty cycles DCS1$p$ through DCSnp from the duty cycle identifiers, extracts the duty cycles from the recipe signal 128, and sends the duty cycles DCS1$p$ through DCSnp to the duty cycle controllers DCC11 through DCCn1. For example, the digital signal processor DSP1 identifies, from the first duty cycle identifier, that the recipe signal 128 includes the duty cycle DCS1$p$ for the state S1 of the variable of the pth RF signal. The digital signal processor DSP1 identifies, from the second duty cycle identifier, that the recipe signal 128 includes the duty cycle DCS2$p$ for the state S2 of the variable of the pth RF signal, and identifies, from the nth duty cycle identifier, that the recipe signal 128 includes the duty cycle DCSnp for the state Sn of the variable.

Upon identifying the duty cycles DCS1$p$ through DCSnp for the states S1 through Sn of the variable of the pth RF signal, the digital signal processor DSP1 determines, from the duty cycle identifiers, that the duty cycle DCS1$p$ is to be sent to the duty cycle controller DCC11 for the state S1, the duty cycle DCS2$p$ is to be sent to the duty cycle controller DCC11 for the state S2, and so on until it is determined that duty cycle DCSnp is to be sent to the duty cycle controller DCCn1 for the state Sn. The digital signal processor DSP1 sends the duty cycle DCS1$p$ to the duty cycle controller DCC11, sends the duty cycle DCS2$p$ to the duty cycle controller DCC21, and so on until the duty cycle DCSnp is sent to the duty cycle controller DCCn1.

The duty cycle controllers DCC11 through DCCn1 store the duty cycles DCS1$p$ through DCSnp. For example, the duty cycle controller DCC11 stores the duty cycle DCS1$p$ within a memory device of the duty cycle controller DCC11. Similarly, the duty cycle controller DCC21 stores the duty cycle DCS2$p$ within a memory device of the duty cycle controller DCC21 and so on until the duty cycle controller DCCn1 stores the duty cycle DCSnp within a memory device of the duty cycle controller DCCn1.

In a similar manner as that described above with respect to sending the duty cycles DCS1$p$ through DCSnp to the digital signal processor DSP1 within the recipe signal 128, the processor 114 sends variable levels for the states S1 through Sn of the RF signal 130 and the parameter level for the states S1 through Sn within the recipe signal 128 to the digital signal processor DSP1. Upon receiving the variable level for the state S1, the digital signal processor DSP1 sends the variable level for the state S1 of the RF signal 130 to the variable controller VRS11, sends the variable level for the state S2 of the RF signal 130 to the variable controller VRS12, and so on until the variable level for the state Sn of the RF signal 130 is sent to the variable controller VRSn1. Also, upon receiving the parameter level for the states S1 through Sn, the digital signal processor DSP1 sends the parameter level of the RF signal 130 to the parameter controller PRS1.

Moreover, the processor 114 sends, within the recipe signal 128 to the digital signal processor DSP1, an order for generation of the variable levels of the RF signal 130. For example, as illustrated in the graph 212 (FIG. 2B), a portion of the RF signal 130 having a power level for the state S4 is generated first, a portion of the RF signal 130 having a power level for the state S3 is generated second, a portion of the RF signal 130 having a power level for the state S2 is generated third, and a portion of the RF signal 130 having a power level for the state S1 is generated fourth during each clock cycle.

After the duty cycles DCS1$p$ through DCSnp are stored in the duty cycle controllers DCC11 through DCCn1, the variable levels for the states S1 through Sn of the RF signal 130 are stored in the variable controllers VRS11 through VRSn1, and the parameter level for the state S1 through Sn of the RF signal 130 is stored in the parameter controller PRS1, the processor 114 sends the trigger signal 131 to the digital signal processor DSP1.

Upon receiving the trigger signal 131, the digital signal processor DSP1 sends a first command signal to a first set of the controllers DCC11, VRS11, and PRS1, a second command signal to a second set of the controllers DCC21, VRS21, and PRS1, and an nth command signal to an nth set of the controllers DCCn1, VRSn1, and PRS1. The first through nth command signals are sent from the digital signal processor DSP1 in the order for execution of the states S1 through Sn of the variable levels of the RF signal 130.

Upon receiving the first command signal, the duty cycle DCS1$p$ is sent from the duty cycle controller DCC11 to the variable controller VRS11, which supplies the variable level for the state S1 of the RF signal 130 to the driver system DRVR1 for a time interval of the duty cycle DCS1$p$. For example, in response to the reception of the first command signal, the variable controller VRS11 accesses the duty cycle DCS1$p$ from the duty cycle controller DCC11. As another example, in response to the reception of the first command signal, the duty cycle controller DCC11 sends the duty cycle DCS1$p$ to the variable controller VRS11. Also, upon receiving the first command signal, the parameter level for the states S1 through Sn of the RF signal 130 is sent from the parameter controller PRS1 to the driver system DRVR1.

Upon receiving the variable level for the state S1 of the RF signal 130 for the time period of the duty cycle DCS1$p$ and the parameter level for the states S1 through Sn of the RF signal 130, the driver of the driver system DRVR1 generates a drive signal for the state S1 for the time period. The drive signal for the state S1 is based on the variable level for the state S1 of the RF signal 130 and the parameter level for the states S1 through Sn of the RF signal 130. The drive signal for the state S1 can be amplified by the amplifier of the driver system DRVR1 to output an amplified signal for the state S1 of the RF signal 130 for the time period of the duty cycle DCS1$p$. The amplified signal for the state S1 for the time period of the duty cycle DCS1$p$ is sent from the amplifier of the driver system DRVR1 to the power supply PS1. Upon receiving the amplified signal for the state S1 for the time period of the duty cycle DCS1$p$, the power supply PS1 generates a portion of the RF signal 130 for the state S1. The portion of the RF signal 130 for the state S1 has the variable level for the state S1 for the time period of the duty cycle DCS1$p$ and has the parameter level for the states S1 through Sn for the time period of the duty cycle DCS1$p$.

Moreover, upon receiving the second command signal, the duty cycle DCS2$p$ is sent from the duty cycle controller DCC21 to the variable controller VRS21 in the same manner as that described above with reference to the controllers DCC11 and VRS11. Upon receiving the duty cycle DCS2$p$, the variable controller VRS21 supplies the variable level for the state S2 to the driver system DRVR1 for a time interval of the duty cycle DCS2$p$. Also, upon receiving the second command signal, the parameter controller PRS1 continues to supply the parameter level for the states S1 through Sn of the RF signal 130 to the driver system DRVR1.

Upon receiving the variable level for the state S2 of the RF signal 130 for the time period defining the duty cycle DCS2$p$ and the parameter level for the states S1 through Sn of the RF signal 130, the driver of the driver system DRVR1 generates a drive signal for the state S2 for the time period. The drive signal for the state S2 is based on the variable level for the state S2 of the RF signal 130 and the parameter level for the states S1 through Sn of the RF signal 130. The drive signal for the state S2 can be amplified by the amplifier of the driver system DRVR1 to output an amplified signal for the state S2 for the time period defining the duty cycle DCS2$p$. The amplified signal for the state S2 for the time period defining the duty cycle DCS2$p$ is sent from the amplifier of the driver system DRVR1 to the power supply PS1. Upon receiving the amplified signal for the state S2 for the time period defining the duty cycle DCS2$p$, the power supply PS1 generates a portion of the RF signal 130 for the state S2. The portion of the RF signal 130 for the state S2 has the variable level for the state S2 for the time period defining the duty cycle DCS2$p$ and has the parameter level for the states S1 through Sn for the time period.

Also, upon receiving the nth command signal, the duty cycle DCSnp is sent from the duty cycle controller DCCn1 to the variable controller VRSn1 in the same manner as that described above with reference to the controllers DCC11 and VRS11. Upon receiving the duty cycle DCSnp, the variable controller VRSn1 supplies the variable level for the state Sn to the driver system DRVR1 for a time interval of the duty cycle DCSnp. Also, upon receiving the nth command signal, the parameter controller PRS1 further continues to supply the parameter level for the states S1 through Sn of the RF signal 130 to the driver system DRVR1.

Upon receiving the variable level for the state Sn for the time period defining the duty cycle DCSnp and the parameter level for the states S1 through Sn, the driver of the driver system DRVR1 generates a drive signal for the state Sn for the time period of the duty cycle DCSnp. The drive signal for the state Sn is based on the variable level for the state Sn and the parameter level for the states S1 through Sn. The drive signal for the state Sn can be amplified by the amplifier within the driver system DRVR1 to output an amplified signal for the state Sn for the time period defining the duty cycle DCSnp. The amplified signal for the state Sn for the time period of the duty cycle DCSnp is sent from the amplifier within the driver system DRVR1 to the power supply PS1. Upon receiving the amplified signal for the state Sn for the time period defining the duty cycle DCSnp, the power supply PS1 generates a portion of the RF signal 130 for the state Sn. The portion of the RF signal 130 for the state Sn has the variable level for the state Sn for the time period of the duty cycle DCSnp and has the parameter level for the states S1 through Sn for the time period defining the duty cycle DCSnp.

The states S1 through Sn defining the variable of the RF signal 130 repeat for each clock cycle of the clock signal. The clock signal is generated by the clock source, such as a clock oscillator or an electronic oscillator, of the RF generator RFG1. The clock source is coupled to the digital signal processor DSP1 to send the clock signal to the digital signal processor DSP1. Upon determining that the cycle 1 has ended and the cycle 2 has begun, the digital signal processor DSP1 repeats sending the first through nth command signals to the variable controllers VRS11 through VRSn1 and the parameter controller PRS1 in the order described above to repeat generation of the states S1 through Sn of the variable levels and the parameter level defining the RF signal 130 during the cycle 2.

In one embodiment, the functions described herein as being performed by two or more of the controllers DCC11 through DCCn1, VRS11 through VRSn1, and PCS1 are instead performed by a single controller. For example, the functions described herein as being performed by two or more of the controllers DCC11 through DCCn1, VRS11 through VRSn1, and PCS1 are instead performed by a processor of the single controller.

In an embodiment, the functions described herein as being performed by two or more of the controllers DCC11 through DCCn1, VRS11 through VRSn1, and PCS1 are instead performed by any other number of controllers.

Figure 7A:
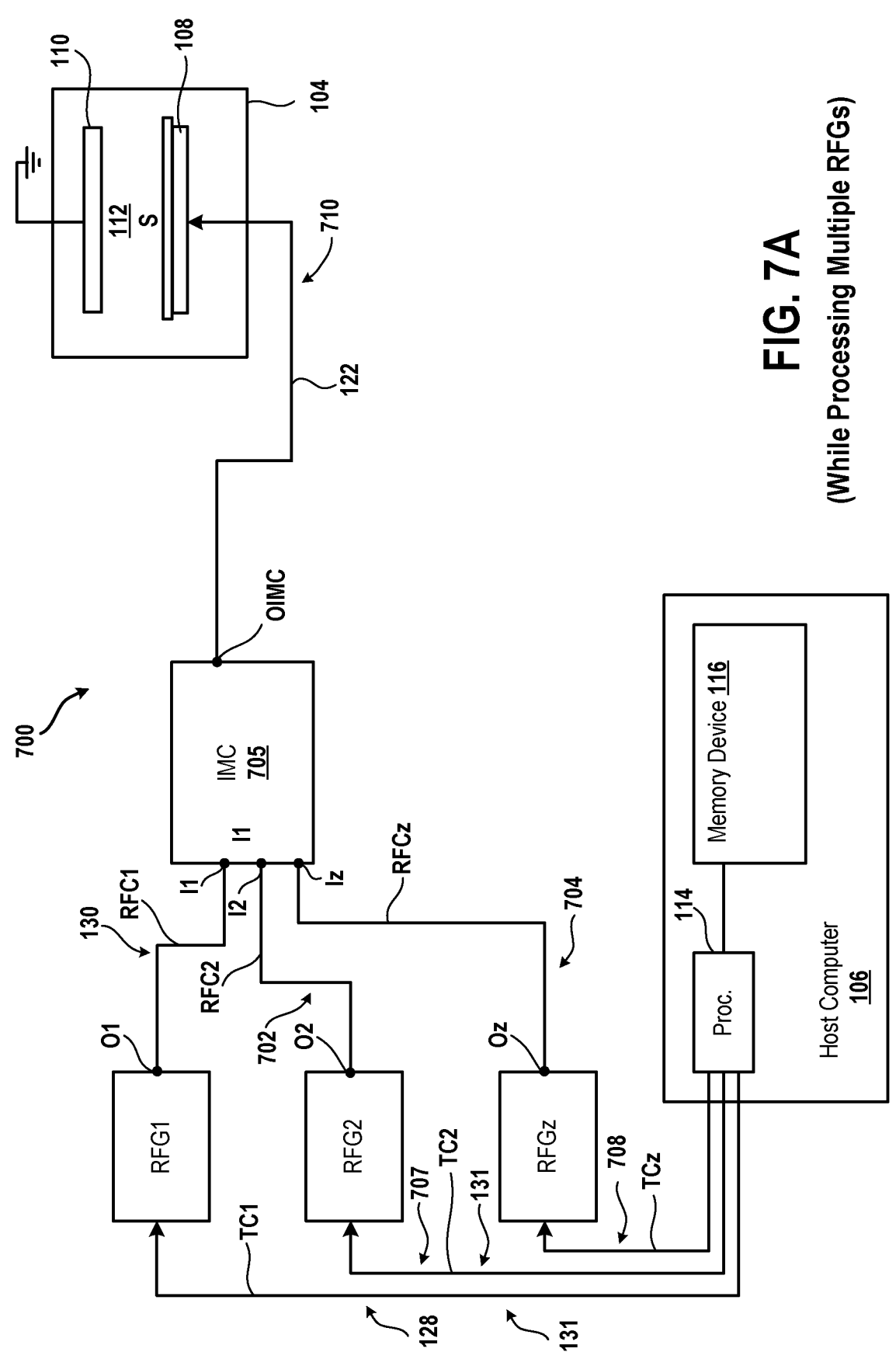
FIG. 7A is a diagram of an embodiment of a system to illustrate use of multiple RF generators to supply power to a plasma chamber and control of duty cycles associated with a variable of multiple RF signals to achieve uniformity in a processing rate of the substrate.
Figure 7B:
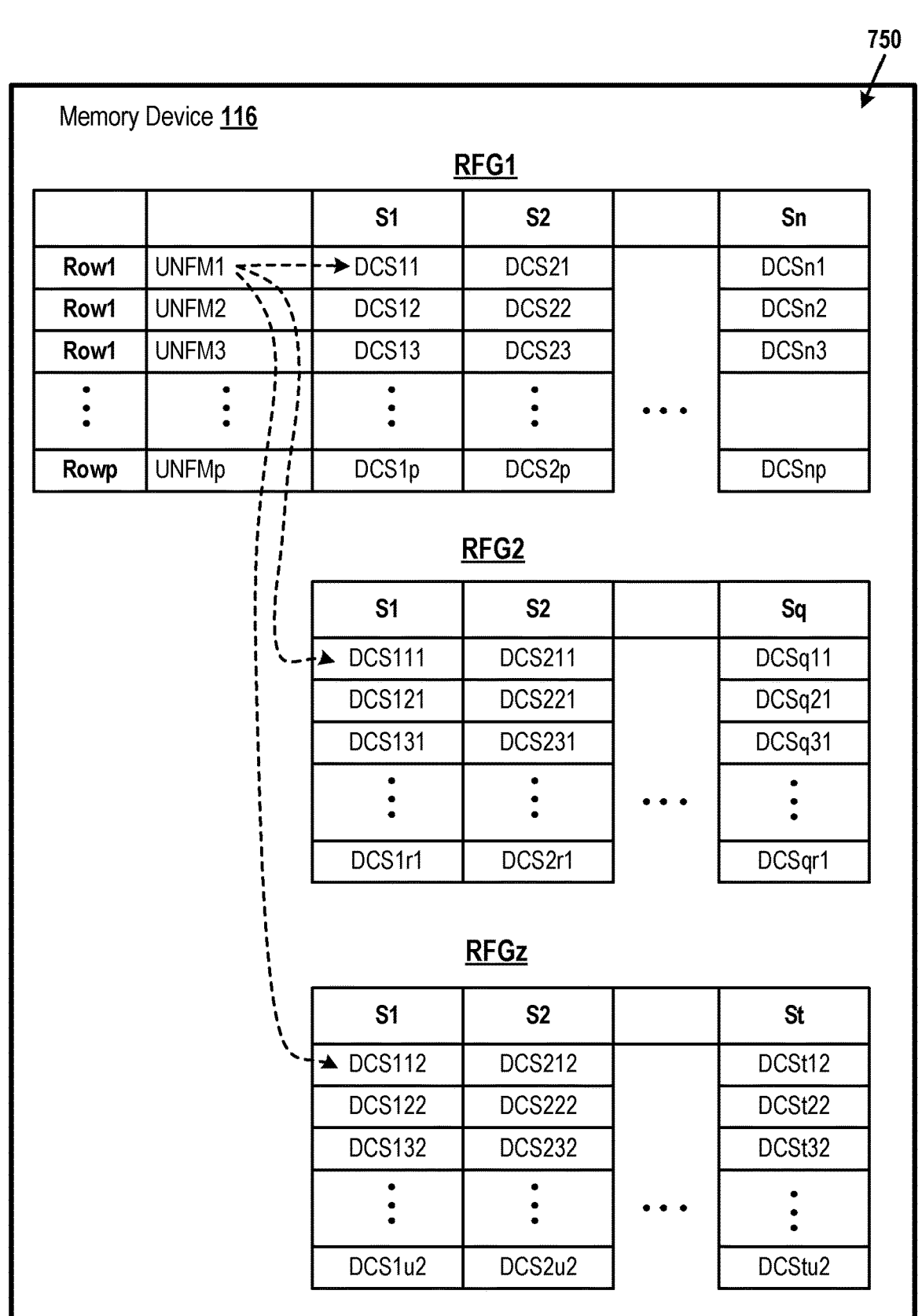
FIG. 7B is an embodiment of a listing of duty cycles for a plurality of states associated with the RF generators of FIG. 7A.

FIG. 7A is a diagram of an embodiment of a system 700 to illustrate use of multiple RF generators RFG1, RFG2, and so on until RFGz to supply power to the plasma chamber 104 and control of duty cycles of the variable of the RF signal 130, an RF signal 702, and an RF signal 704 to achieve uniformity in the processing rate of the substrate S. FIG. 7B is an embodiment of a listing 750 of duty cycles for multiple states associated with the RF generators RFG1 and RFG2 through RFGz. The listing 750 is generated using a method described with reference to FIG. 9 or a method described with reference to FIG. 10 below. It should be noted that z is an integer greater than one. For example, z is 3 or 4 or 5.

With reference to FIG. 7A, the system 700 includes the RF generators RFG1, RFG2, and so on until the RF generator RFGz. For example, the RF generator RFG1 operates at the low frequency, the RF generator RFG2 operates at a medium frequency, and the RF generator RFGz operates at the high frequency. The medium frequency is between the low frequency and the high frequency. As an example, when the low frequency is 400 kHz and the high frequency is 60 MHz, the medium frequency is 13.56 MHz. As another example, when the low frequency is 2 MHz and the high frequency is 60 MHz, the medium frequency is 13.56 MHz or 27 MHz. The system 700 further includes an impedance matching circuit 705, the plasma chamber 104, and the host computer 106. The impedance matching circuit 705 includes inputs I1, I2, and so on until an input Iz. The impedance matching circuit 704 includes the output OIMC.

The processor 114 is coupled via a transfer cable TC2 to the RF generator RFG2 and so on until the processor 114 is coupled via a transfer cable TCz to the RF generator RFGz. The output O1 is coupled via the RF cable RFC1 to the input I1. Also, an output O2 is coupled via an RF cable RFC2 to an input 12, and an output Oz is coupled via an RF cable RFCz to an input Iz. The output OIMC is coupled via the RF transmission line 122 to the lower electrode.

With reference to FIG. 7B, the processor 114 stores, within the memory device 116, the listing 750 of uniformity levels and duty cycles. The uniformity levels of the list 750 include the uniformity levels UNFM1 through UNFMp.

Each uniformity level, stored within the listing 750 of the memory device 116, corresponds to multiple duty cycles for multiple states defining the variable of a corresponding one of the first through pth RF signals generated by the RF generator RFG1, multiple duty cycles for multiple states defining the variable of a corresponding one of first through rth RF signals generated by the RF generator RFG2, and multiple duty cycles for multiple states defining the variable of a corresponding one of first through uth RF signals generated by the RF generator RFGz, where r and u are positive integers. For example, there is a one-to-one mapping or a one-to-one relationship among the uniformity level UNFM1, a set of duty cycles defining the variable of the first RF signal generated by the RF generator RFG1, a set of duty cycles defining the variable of the first RF signal generated by the RF generator RFG2, and a set of duty cycles defining the variable of the first RF signal generated by the RF generator RFGz. In the example, the one-to-one mapping is stored within the row 1 in the listing 750. The RF signal 702 is an example of the rth RF signal supplied by the RF generator RFG2 and the RF signal 704 is an example of the uth RF signal supplied by the RF generator RFGZ.

Continuing with the example, the set of duty cycles of the variable defining the first RF signal generated by the RF generator RFG2 include a duty cycle DCS111 of the state S1 defining the variable of the first RF signal, a duty cycle DCS211 of the state S2 defining the variable of the first RF signal, and so on until a duty cycle DCSq11 defining a state Sq of the variable of the first RF signal is included, where q is a positive integer. To illustrate, the integer q is equal to the integer n. In this illustration, a number of states of the variable defining the first RF signal generated by the RF generator RFG2 is equal to a number of states of the variable defining the first RF signal generated by the RF generator RFG1. As another illustration, the integer q is unequal to the integer n. In this illustration, a number of states defining the variable of the first RF signal generated by the RF generator RFG2 is not equal to a number of states defining the variable of the first RF signal generated by the RF generator RFG1.

Continuing further with the example, the set of duty cycles defining the variable of the first RF signal generated by the RF generator RFGz includes a duty cycle DCS112 defining the state S1 of the variable, a duty cycle DCS212 defining the state S2 of the variable, and so on until a duty cycle DCSt12 defining a state St of the variable is included, where t is a positive integer. To illustrate, the integer t is equal to at least one of the integers n and q. In this illustration, a number of states defining the variable of the first RF signal generated by the RF generator RFGz is equal to a number of states defining the variable of the first RF signal generated by the RF generator RFG1, or to a number of states defining the variable of the first RF signal generated by the RF generator RFG2, or to a number of states defining the variable of the first RF signal generated by the RF generator RFG2 and to a number of states of the variable of the first RF signal generated by the RF generator RFGz. As another illustration, the integer t is unequal to at least one of the integers n and q. In this illustration, a number of states defining the variable of the first RF signal generated by the RF generator RFGz is not equal to a number of states defining the variable of the first RF signal generated by the RF generator RFG1, or is not equal to a number of states defining the variable of the first RF signal generated by the RF generator RFG2, or is not equal to a number of states defining the variable of the first RF signal generated by the RF generator RFG1 and not equal to a number of states defining the variable of the first RF signal generated by the RF generator RFG2.

As another example, in a similar manner, there is a one-to-one mapping among the uniformity level UNFM2 and a set of duty cycles defining the variable of the second RF signal generated by the RF generator RFG1, a set of duty cycles defining the variable of the second RF signal generated by the RF generator RFG2, and a set of duty cycles defining the variable of the second RF signal generated by the RF generator RFGz. The one-to-one mapping is stored in the row 2 of the listing 750. The set of duty cycles defining the second RF signal generated by the RF generator RFG2 include a duty cycle DCS121 defining the state S1 of the variable of the second RF signal, a duty cycle DCS221 defining the state S2 of the variable of the second RF signal, and so on until a duty cycle DCSq21 defining the state Sq of the variable of the second RF signal is included. The set of duty cycles defining the RF signal generated by the RF generator RFGz includes a duty cycle DCS122 defining the state S1 of the variable of the second RF signal, a duty cycle DCS222 defining the state S2 of the variable of the second RF signal, and so on until a duty cycle DCSt22 defining the state St of the variable of the second RF signal is included.

As yet another example, there is a one-to-one relationship among the uniformity level UNFM3 and a set of duty cycles of the variable defining the third RF signal generated by the RF generator RFG1, a set of duty cycles of the variable defining the third RF signal generated by the RF generator RFG2, and a set of duty cycles of the variable defining the third RF signal generated by the RF generator RFGz. The one-to-one relationship is stored in the row 3 of the listing 750. The set of duty cycles of the third RF signal generated by the RF generator RFG2 includes a duty cycle DCS131 of the state S1 defining the variable of the third RF signal, a duty cycle DCS231 of the state S2 defining the variable of the third RF signal, and so on until a duty cycle DCSq31 of the state Sq defining the variable of the third RF signal is included. The set of duty cycles defining the third RF signal generated by the RF generator RFGz includes a duty cycle DCS132 of the state S1 of the variable of the third RF signal, a duty cycle DCS232 of the state S2 defining the variable of the third RF signal, and so on until a duty cycle DCSt32 of the state St defining the variable of the third RF signal is included.

As another example, there is a one-to-one relationship among the uniformity level UNFMp and a set of duty cycles of the variable defining the pth RF signal generated by the RF generator RFG1, a set of duty cycles of the variable defining the rth RF signal generated by the RF generator RFG2, and a set of duty cycles of the variable defining the uth RF signal generated by the RF generator RFGz. The one-to-one relationship is stored in the row p of the listing 750. The set of duty cycles defining the rth RF signal generated by the RF generator RFG2 includes a duty cycle DCS1r1 of the state S1 defining the variable of the rth RF signal, a duty cycle DCS2r1 of the state S2 defining the variable of the rth RF signal, and so on until a duty cycle DCSqr1 of the state Sq defining the variable of the rth RF signal is included. The set of duty cycles defining the uth RF signal generated by the RF generator RFGz includes a duty cycle DCS1u2 of the state S1 defining the variable of the uth RF signal, a duty cycle DCS2u2 of the state S2 defining the variable of the uth RF signal, and so on until a duty cycle DCStu2 defining the state St of the variable of the uth RF signal is included.

Referring back to FIG. 7A, the processor 114 receives from the user, via the input device, an indication, such as a signal, indicating the uniformity level UNFMa to be achieved in processing the substrate S. Upon receiving the indication, the processor 114 determines, in the same manner as that described above with reference to FIG. 1, whether the uniformity level UNMFa is within a predetermined range from one of the uniformity levels UNFM1 through UNFMp in the listing 750 stored in the memory device 116. Upon determining that the uniformity level UNMFa is within the predetermined range from one of the uniformity levels UNFM1 through UNFMp, such as the uniformity level UNFMp, in the listing 750 stored in the memory device 116, the processor 114 identifies from the listing 750 of the memory device 116, a set of duty cycles that correspond to the one of the uniformity levels UNFM1 through UNFMp. For example, the processor 114 identifies, from the memory device 116, the duty cycles DCS1p through DCSnp, DCS1r1 through DCSqr1, and DCS1u2 through DCStu2 from the memory device 116 as corresponding to the uniformity level UNFMp. To illustrate, the processor 114 examines each row 1 through p of the listing 750 (FIG. 7B) to determine that the duty cycles DCS1p through DCSnp, DCS1r1 through DCSqr1, and DCS1u2 through DCStu2 have a one-to-one relationship or a mapping with the uniformity level UNFMp.

In the manner described above with reference to FIG. 1, upon identifying the duty cycles DCS1p through DCSn1 from the listing 750, the processor 114 generates the recipe signal 128 including the duty cycles DCS1p through DCSn1 of the variable of the RF signal 130, and sends the recipe signal 128 via the transfer cable TC1 to the RF generator RFG1. Also, in the manner described above with reference to FIG. 1, the RF generator RFG1 stores a corresponding variable level within the one or more memory devices of the RF generator RFG1 for each of the states S1 through Sn. Further, in the manner described above with reference to FIG. 1, the RF generator RFG1 stores, within the one or more memory devices of the RF generator RFG1, the parameter level for the states S1 through Sn. The variable levels for the states S1 through Sn and the parameter level for the states S1 through Sn are received by the RF generator RFG1 within the recipe signal 128 via the transfer cable TC1 from the processor 114.

Moreover, upon identifying the duty cycles DCS1r1 through DCSqr1 from the listing 750, the processor 114 generates a recipe signal 707 including the duty cycles DCS1r1 through DCSqr1 of the variable of the RF signal 702, and sends the recipe signal 707 via the transfer cable TC2 to the RF generator RFG2. Upon receiving the duty cycles DCS1r1 through DCSqr1, the RF generator RFG2 stores the duty cycles DCS1r1 through DCSqr1 in one or more memory devices within the RF generator RFG2.

In addition, the RF generator RFG2 stores, within the one or more memory devices of the RF generator RFG2, a corresponding variable level for each of the states S1 through Sq. Also, the RF generator RFG2 stores a parameter level, such as a single parameter level, for the states S1 through Sq. The variable levels for the states S1 through Sq and the parameter level for the states S1 through Sq are received by the RF generator RFG2 via the transfer cable TC2 from the processor 114. For example, the variable levels for the states S1 through Sq and the parameter level for the states S1 through Sq are received by the RF generator RFG2 within the recipe signal 707 via the transfer cable TC1 from the processor 114. The processor 114 receives an indication of the variable levels for the states S1 through Sq from the user via the input device.

Also, the processor 114 generates a recipe signal 708 including the duty cycles DCS1u2 through DCStu2 of the variable of the RF signal 704, and sends the recipe signal 708 via the transfer cable TCz to the RF generator RFGz. Upon receiving the duty cycles DCS1u2 through DCStu2, the RF generator RFGz stores the duty cycles DCS1u2 through DCStu2 in one or more memory devices within the RF generator RFGz.

In addition, the RF generator RFGz stores a corresponding variable level within the one or more memory devices of the RF generator RFGz for each of the states S1 through St. The RF generator RFGz also stores a parameter level, such as a single parameter level, for the states S1 through St. The variable levels for the states S1 through St and the parameter level for the states S1 through St are received by the RF generator RFGz via the transfer cable TCz from the processor 114. For example, the variable levels for the states S1 through St and the parameter level for the states S1 through St are received by the RF generator RFGz within the recipe signal 708 via the transfer cable TCz from the processor 114. The processor 114 receives an indication of the variable levels for the states S1 through St from the user via the input device.

Moreover, the processor 114 generates the trigger signal 131 and sends the trigger signal 131 via the transfer cable TC1 to the RF generator RFG1, via the transfer cable TC2 to the RF generator RFG2, and via the transfer cable TCz to the RF generator RFGz. For example, the trigger signal 131 is sent after the recipe signals 128, 707, and 708 are sent. Upon receiving the trigger signal 131, the RF generator RFG2 generates the RF signal 702 having the variable levels for the states S1 through Sq, the parameter level for the states S1 through Sq, and the duty cycles DCS1r1 through DCSqr1 for the states S1 through Sq. As an example, the parameter level for the states S1 through Sq is a single parameter level. The RF generator RFG2 supplies the RF signal 702 at the output O2. The RF signal 702 is supplied from the output O2 via the RF cable RFC2 to the input 12 of the impedance matching circuit 706.

Also, upon receiving the trigger signal 131, the RF generator RFGz generates the RF signal 704 having the variable levels for the states S1 through St, the parameter level for the states S1 through St, and the duty cycles DCS1u2 through DCStu2 for the states S1 through St. As an example, the parameter level for the states S1 through St is a single parameter level. The RF generator RFGz supplies the RF signal 704 at the output Oz. The RF signal 704 is supplied from the output Oz via the RF cable RFCz to the input Iz of the impedance matching circuit 705.

The RF signal 130 is transferred via a first branch circuit of the impedance matching circuit 705, the RF signal 702 is transferred via a second branch circuit of the impedance matching circuit 705, and the RF signal 704 is transferred via a zth branch circuit of the impedance matching circuit 705. The first branch circuit extends from the input I1 to the output OIMC, the second branch circuit extends from the input 12 to the output OIMC, and the zth branch circuit extends from the input Iz to the output OIMC.

A branch circuit, as used herein, includes the network of circuit components. For example, the branch circuit includes one or more series circuits and one or more shunt circuits. The one or more series circuits are coupled to the one or more shunt circuits. Each series circuit includes a network of one or more capacitors, or one or more inductors, or one or more resistors, or a combination thereof. Similarly, each shunt circuit includes a network of one or more capacitors, or one or more inductors, or one or more resistors, or a combination thereof. Each shunt circuit is coupled to a ground potential at an end.

When the RF signal 130 is transferred via the first branch within the impedance matching circuit 705, the RF signal 702 is transferred via the second branch within the impedance matching circuit 705, and the RF signal 704 is transferred via the zth branch within the impedance matching circuit 705, the circuit components of the impedance matching circuit 705 match an impedance of the load coupled to the output OIMC with an impedance of a source coupled to the inputs I1 through Iz to modify impedances of the RF signals 130, 702, and 704. An example of the load coupled to the output OIMC of the impedance matching circuit 705 includes the RF transmission line 122 and the plasma chamber 104. An example of the source coupled to the inputs I1 through Iz includes the RF cables RFC1 through RFCz and the RF generators RFG1 through RFGz. The impedance of the RF signals 130, 702, and 704 are modified to output a modified RF signal 710 at the output OIMC.

The modified RF signal 710 is supplied from the output OIMC via the RF transmission line 122 to the lower electrode of the substrate support 108. In addition, when the one or more process gases are supplied to the gap 112, plasma is stricken or maintained within the gap 112 to process the substrate S.

In an embodiment, the impedance matching circuit 705 is coupled via the RF transmission line 122 to the upper electrode 110 instead of to the substrate support 108. In this embodiment, the substrate support 108 is coupled to the reference potential.

FIG. 8A is a diagram of an embodiment of the graph 210 to illustrate the plot 212. FIG. 8B is a diagram of an embodiment of a graph 800 to illustrate a plot 802 to illustrate the duty cycles DCS2r1, DCS3r1, and DCS1r1 defining the variable of the RF signal 702 that is generated by the RF generator RFG2 (FIG. 7A). The graph 800 includes the plot 802 illustrating the variable of the RF signal 702 versus the time t. The variable of the RF signal 702 is plotted on a y-axis of the graph 802 and the time t is plotted on an x-axis of the graph 802.

The x-axis of the graph 800 is divided into the equal time intervals illustrated in the graph 210 of FIG. 8A. Also, the y-axis of the graph 800 is divided into variable levels of the RF signal 702 (FIG. 7A) generated by the RF generator RFG2. For example, the y-axis of the graph 800 has the variable level 0, a variable level V1b, a variable level V2b, a variable level V3b, a variable level V4b, and a variable level V5b. It should be noted that a first interval between the variable levels 0 and V1b is equal to a second interval between the variable levels V1b and V2b. Also, the second interval is equal to a third interval between the variable levels V2b and V3b. Similarly, the third interval is equal to a fourth interval between the variable levels V3b and V4b. Also, the fourth interval is equal to a fifth interval between the variable levels V4b and V5b.

The plot 802 transitions at the time t0 from the variable level V2b to the variable level V3b. The plot 802 has the variable level V3b during a time period between the time t0 and the time t3. The plot 802 transitions at the time t3 from the variable level V3b to the variable level V5b. The plot 802 remains at the variable level V5b during a time interval between the time t3 and the time t6, and transitions at the time t6 from the variable level V5b to the variable level V2b. The plot 212 has the variable level V2b during a time interval between the time t6 to the time t8.

The variable level V3b of the plot 802 defines the state S2 of the variable of the RF signal 702. Similarly, the variable level V5b of the plot 802 defines the state S3 of the variable of the RF signal 702 and the variable level V2b of the plot 802 defines the state S1 of the variable of the RF signal 702.

The variable levels V5b through V2b of the plot 802 repeat during each cycle of the clock signal. For example, first instances of the variable levels V5b through V2b of the plot 802 occur during the cycle 1 and second instances of the variable levels V5b through V2b of the plot 802 occur during the cycle 2.

The time interval for which the state S2 of the variable shown in the plot 802 occurs is illustrated as the duty cycle DCS2r1. Similarly, the time interval for which the state S3 of the variable shown in the plot 802 occurs is illustrated as the duty cycle DCS3r1, and the time interval for which the state S1 of the variable occurs is illustrated as the duty cycle DCS1r1.

It should be noted that duty cycles, such as the duty cycles DCS311, DCS211, and DCS111 are adjusted to generate the duty cycles DCS3r1, DCS2r1, and DCS1r1. For example, the duty cycle DCS3r1 is less than the duty cycle DCS311 and the duty cycle DCS2r1 is greater than the duty cycle DCS211. Also, the duty cycle DCS1r1 is greater than the duty cycle DCS111.

In an embodiment, a transition of the variable, illustrated in the plot 802, of the RF signal 702 occurs within a time interval. For example, instead of transitioning from the variable level V3b to the variable level V4b at the time t3, the plot 802 transitions during a time interval from a first time to a second time. The first time is between the time t2.5 and the time t3, and the second time is between the time t3 and the time t3.5. In this example, a duty cycle of the variable level V5b includes a time interval of occurrence of the variable level V5b and the time interval of the transition from the variable level V3b to the variable level V5b. As another example, a duty cycle of the variable level V3b includes a time interval of occurrence of the variable level V3b and the time interval of the transition from the variable level V3b to the variable level V5b.

FIG. 8C is a diagram of an embodiment of a graph 804 to illustrate a plot 806 exemplifying the duty cycles DCS2u2 and DCS1u2 of the variable of the RF signal 704 that is generated by the RF generator RFGz (FIG. 7A). The graph 804 includes the plot 806 versus the time t. The variable defining the RF signal 704 is plotted on a y-axis in the graph 804 and the time t is plotted on an x-axis in the graph 804.

The x-axis of the graph 804 is divided into the equal time intervals illustrated in the graph 210 of FIG. 8A. Also, the y-axis of the graph 804 is divided into variable levels. For example, the y-axis of the graph 804 has the variable level 0, a variable level V1c, a variable level V2c, a variable level V3c, a variable level V4c, and a variable level V5c. It should be noted that a first interval between the variable levels 0 and V1c is equal to a second interval between the variable levels V1c and V2c. Also, the second interval is equal to a third interval between the variable levels V2c and V3c. Similarly, the third interval is equal to a fourth interval between the variable levels V3c and V4c. Also, the fourth interval is equal to a fifth interval between the variable levels V4c and V5c.

The plot 806 transitions at the time to from the variable level Vlc to the variable level V5c. The plot 806 has the variable level V5c during a time period between the time t0 and the time t4.5. The plot 806 transitions at the time t4.5 from the variable level V5c to the variable level Vlc. The plot 806 remains at the variable level Vlc during a time interval between the time t4.5 and the time t8, and transitions at the time t8 from the variable level Vlc to the variable level V5c.

The variable level V5c of the plot 806 defines the state S2 of the variable of the RF signal 704 (FIG. 7A). Similarly, the variable level Vlc of the plot 806 defines the state S1 of the variable of the RF signal 704.

The variable levels V5c and Vlc of the plot 806 repeat during cycle of the clock signal. For example, first instances of the variable levels V5c and V1c of the plot 806 occur during the cycle 1 and second instances of the variable levels V5c and V1c of the plot 806 occur during the cycle 2.

The time interval for which the state S2 of the variable of the plot 806 occurs is illustrated as the duty cycle DCS2u2. Similarly, the time interval for which the state S1 of the variable of the plot 806 occurs is illustrated as the duty cycle DCS1u2.

It should be noted that duty cycles, such as the duty cycles DCS212 and DCS112 are adjusted to generate the duty cycles DCS2u2 and DCS1u2. For example, the duty cycle DCS2u2 is less than the duty cycle DCS212 and the duty cycle DCS1u2 is greater than the duty cycle DCS112.

In an embodiment, a transition of the variable illustrated in the plot 806 occurs within a time interval. For example, instead of transitioning from the variable level V5c to the variable level V1c at the time t4.5, the plot 806 transitions during a time interval from a first time to a second time. The first time is between the time t4 and the time t4.5, and the second time is between the time t4.5 and the time t5. In this example, a duty cycle of the variable level V1c includes a time interval of occurrence of the variable level V1c and the time interval of the transition from the variable level V5c to the variable level V1c. As another example, a duty cycle of the variable level V5c includes a time interval of occurrence of the variable level V5c and the time interval of the transition from the variable level V5c to the variable level V1c.

Figure 9:
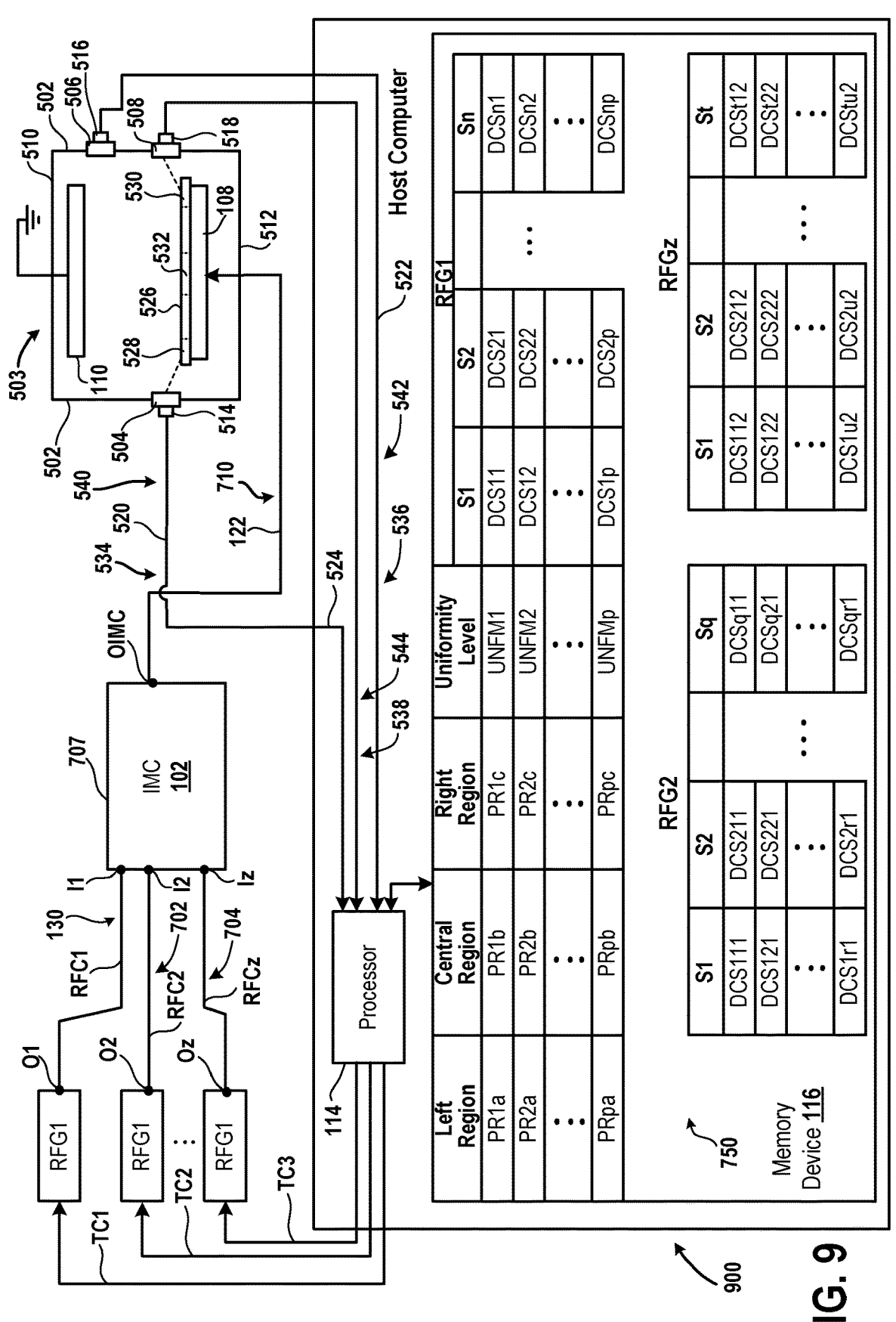
FIG. 9 is a diagram of an embodiment of a system to illustrate generation of the listing of FIG. 7B.

FIG. 9 is a diagram of an embodiment of a system 900 to illustrate generation of the listing 750 of uniformity levels and duty cycles. The system 900 includes the host computer 106, the RF generators RFG1 through RFGz, the impedance matching circuit 705, and the plasma chamber 503.

The substrate 526 is placed within the plasma chamber 503. Thereafter, the processor 114 controls the RF generator RFG1 in a manner described about with reference to FIG. 7A to generate the pth RF signal, such as the RF signal 130, controls the RF generator RFG2 in a manner described about with reference to FIG. 7A to generate the rth RF signal, such as the RF signal 702, and controls the RF generator RFGz in a manner described about with reference to FIG. 7A to generate the uth RF signal, such as the RF signal 704. The pth RF signal having the duty cycles DCS1p through DCSnp for the states S1 through Sn of the variable of the pth RF signal, the rth RF signal having the duty cycles DCS1r1 through DCSqr1 for the states S1 through Sq of the variable of the rth RF signal, and the uth RF signal having the duty cycles DCS1u2 through DCStu2 for the states S1 through St of the variable of the uth RF signal are supplied to the impedance matching circuit 705, which outputs the modified RF signal 710 to the plasma chamber 503. When the modified RF signal 710 is sent to the plasma chamber 503 and the one or more process gases are supplied to the gap 112 within the plasma chamber 503, plasma is generated within the gap 112 in the plasma chamber 503.

After plasma is generated within the gap 112, during the time period TP1, the intensity signals 534, 536, and 538 are generated and sent from the ERMDs 514, 516, and 518 to the processor 114 in the same manner as that described above with reference to FIG. 5A. Moreover, during the time period TP2, the intensity signals 540, 542, and 544 are generated and sent from the ERMDs 514, 516, and 518 to the processor 114 in the same manner as that described above with reference to FIG. 5A, Moreover, in the same manner as that described above with reference to FIG. 5A, the processor 114 determines based on the intensity signals 534 and 540 received from the ERMD 514, the processing rate, such as the processing rate PRpa, of processing the left edge region 528 of the substrate 526. The processor 114 stores the processing rate PRpa in the listing 750 of the memory device 116.

Also, in the same manner as that described above with reference to FIG. 5A, the processor 114 determines based on the intensity signals 536 and 542 received from the ERMD 516, the processing rate, such as the processing rate PRpb, of processing the central region 532 of the substrate 526. The processor 114 stores the processing rate PRpb in the listing 750 of the memory device 116.

Furthermore, in the same manner as that described above with reference to FIG. 5A, the processor 114 determines based on the intensity signals 538 and 544 received from the ERMD 518, the processing rate, such as the processing rate PRpc, of processing the right edge region 530 of the substrate 526. The processor 114 stores the processing rate PRpc in the listing 750 of the memory device 116.

The processor 114 defines the processing rates PRpa through PRpc as the uniformity level UNFMp and stores the uniformity level UNFMp within the listing 750 of the memory device 116. For example, the processor 114 determines that the processing rates PRpa through PRpc form the uniformity level UNFMp, and stores the uniformity level UNFMp in the listing 750. As another example, the processor 114 applies interpolation, as described above with reference to FIG. 5A, to determine the uniformity level UNFMp from the processing rates PRpa through PRpc.

In a similar manner as that described above, with reference to FIG. 5A, for determining the processing rates PRpa through PRpc, the processor 114 determines the processing rates PR1a, PR1b, and PR1c when the first RF signal is supplied by the RF generator RFG1, the first RF signal is supplied by the RF generator RFG2, and the first RF signal is supplied by the RF signal RFGz, and stores the processing rates PR1a through PR1c in the listing 750 within the memory device 116. The first RF signal generated by the RF generator RFG1 has the duty cycles DCS11, DCS21 and so on until the duty cycle DCSn1. Also, the first RF signal generated by the RF generator RFG2 has the duty cycles DCS111, DCS211 and so on until the duty cycle DCSq11. The first RF signal generated by the RF generator RFGz has the duty cycles DCS112, DCS212 and so on until the duty cycle DCSt12. When the first RF signal generated by the RF generator RFG1, the first RF signal generated by the RF generator RFG2, and the first RF signal generated by the RF generator RFGz are supplied to the impedance matching circuit 705, a first modified RF signal is output from the output OIMC and sent via the RF transmission line 122 to the lower electrode. Also, when the first modified RF signal is supplied to the substrate support 108, the one or more process gases are supplied to the gap 112. The processor 114 associates the processing rates PR1a through PR1c with the uniformity level UNFM1 and stores the uniformity level UNFM1 within the listing 750. For example, the processor 114 determines the uniformity level UNFM1 based on the processing rates PR1a through PR1c. To illustrate, the processor 114 determines that the processing rates PR1a through PR1c form the uniformity level UNFM1. As another example, the processor 114 applies the method of interpolation, described above, to determine the uniformity level UNFM1 from the processing rates PR1a through PR1c.

Also, in the similar manner as that described above for determining the processing rates PRpa through PRpc, the processor 114 determines the processing rates PR2a, PR2b, and PR2c when the second RF signal is supplied by the RF generator RFG1, the second RF signal is supplied by the RF generator RFG2, and the second RF signal is supplied by the RF signal RFGz, and stores the processing rates PR2a through PR2c in the listing 750 within the memory device 116. The second RF signal generated by the RF generator RFG1 has the duty cycles DCS12, DCS22 and so on until the duty cycle DCSn2. Also, the second RF signal generated by the RF generator RFG2 has the duty cycles DCS121, DCS221 and so on until the duty cycle DCSq21. The second RF signal generated by the RF generator RFGZ has the duty cycles DCS122, DCS222 and so on until the duty cycle DCSt22. When the second RF signal generated by the RF generator RFG1, the second RF signal generated by the RF generator RFG2, and the second RF signal generated by the RF generator RFGz are supplied to the impedance matching circuit 705, a second modified RF signal is output from the output OIMC and sent via the RF transmission line 122 to the lower electrode. Also, when the second modified RF signal is supplied to the substrate support 108 of the plasma chamber 503, the one or more process gases are supplied to the gap 112 of the plasma chamber 503. The processor 114 associates the processing rates PR2a through PR2c with the uniformity level UNFM2 and stores the uniformity level UNFM2 within the listing 750 of the memory device 116.

Figure 10:
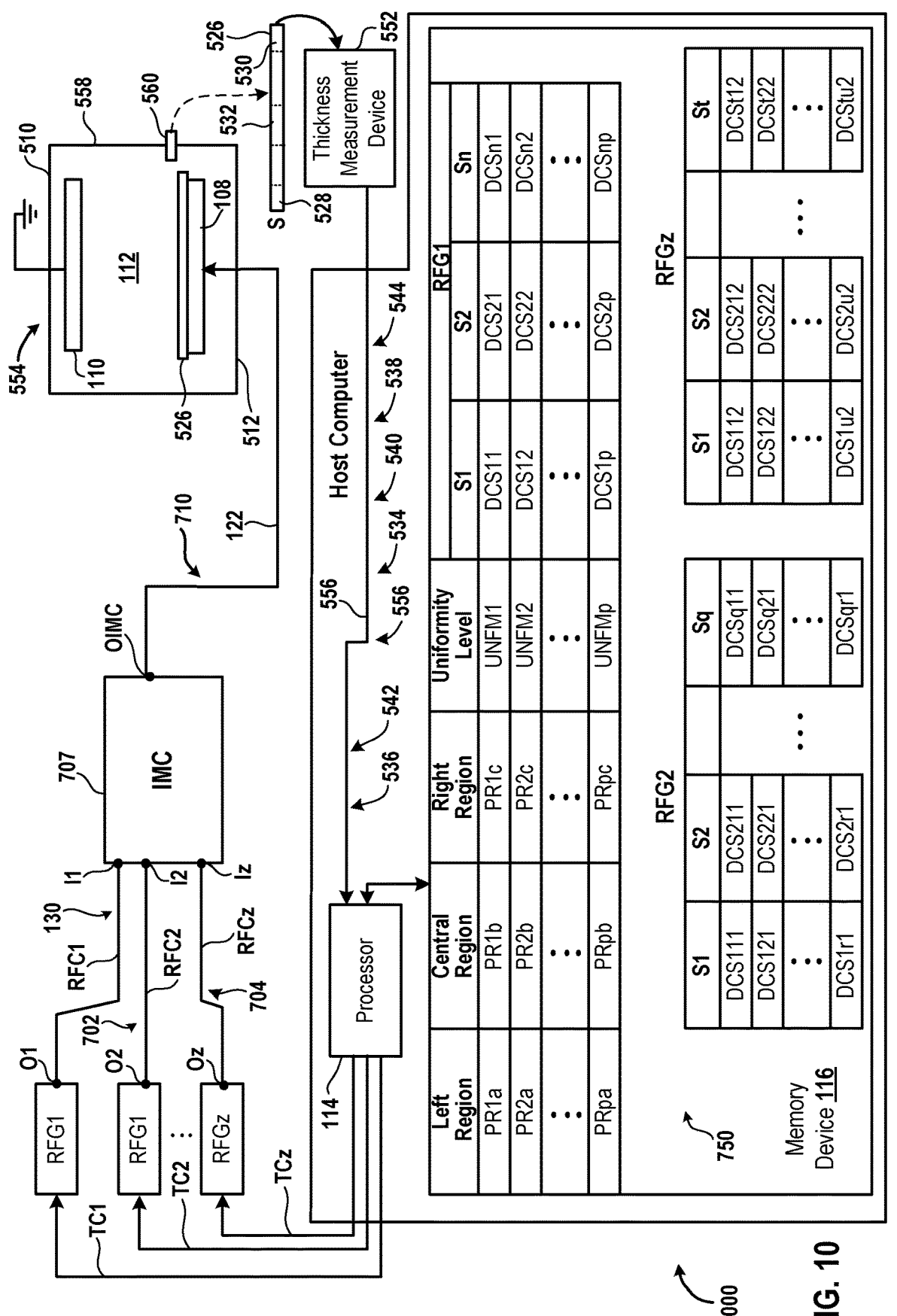
FIG. 10 is a diagram of an embodiment of a system to illustrate use of the thickness measurement device to measure intensity values of light of plasma reflected from the left edge region, the central region, and the right edge region of the substrate.

FIG. 10 is a diagram of an embodiment of a system 1000 to illustrate use of the thickness measurement device 552 to measure intensity values of light emitted from plasma reflected from the left edge region 528, the central region 532, and the right edge region 530. The system 100 includes the RF generators RFG1 through RFGz, the impedance matching circuit 705, the plasma chamber 554, the thickness measurement device 552, and the host computer 106.

The substrate 526 is placed within the plasma chamber 554. Thereafter, the processor 114 controls the RF generator RFG1 in a manner described about with reference to FIG. 7A to generate the pth RF signal, such as the RF signal 130. Also, the processor 114 controls the RF generator RFG2 in a manner described about with reference to FIG. 7A to generate the rth RF signal, such as the RF signal 702 and controls the RF generator RFGz in a manner described about with reference to FIG. 7A to generate the uth RF signal, such as the RF signal 704. The pth RF signal having the duty cycles DCS1p through DCSnp for the states S1 through Sn defining the variable of the pth RF signal, the rth RF signal having the duty cycles DCS1r1 through DCSqr1 for the states S1 through Sq defining the variable of the rth RF signal, and the uth RF signal having the duty cycles DCS1u2 through DCStu2 for the states S1 through St defining the variable of the uth RF signal are supplied to the impedance matching circuit 705, which outputs the modified RF signal 710 to the plasma chamber 554. When the modified RF signal 710 is sent to the plasma chamber 554 and the one or more process gases are supplied to the gap 112 within the plasma chamber 102, plasma is generated within the gap 112 in the plasma chamber 554.

After the substrate 526 is processed using plasma generated within the plasma chamber 554, during the time period TP1, the substrate 526 is removed from the plasma chamber 554 via the opening 560 and placed below the thickness measurement device 552. During the time period TP1, the thickness measurement device 552 generates the intensity signals 534, 536, and 538 and sends the intensity signals 534, 536, and 538 via the transfer cable 556 to the processor 114. After the intensity signals 534, 536, and 538 are generated and sent to the processor 114, the substrate 526 is then placed back in the plasma chamber 554 for further processing. After the pre-set time period has passed from the time period TP1, the substrate 526 is removed from the plasma chamber 554 via the opening 560. During the time period TP2, the substrate 526 is removed from the plasma chamber 554 and placed below the thickness measurement device 552. During the time period TP2, the thickness measurement device 552 generates the intensity signals 540, 542, and 544 and sends the intensity signals 540, 542, and 544 via the transfer cable 556 to the processor 114. The processor 114 determines the processing rates PRpa, PRpb, and PRpc from the intensity signals 534, 536, 538, 540, 542, and 544 in the same manner as that described above with reference to FIG. 5B, determines the uniformity level UNFMp from the processing rates PRpa, PRpb, and PRpc, and stores the processing rates PRpa, PRpb, and PRpc, and the uniformity level UNFMp in the listing 750 of the memory device 116.

In a similar manner as that described above for determining the processing rates PRpa through PRpc with reference to FIG. 5B, the processor 114 determines the processing rates PR1a, PR1b, and PR1c when the first RF signal is supplied by the RF generator RFG1, the first RF signal is supplied by the RF generator RFG2, and the first RF signal is supplied by the RF generator RFGz, and stores the processing rates PR1a through PR1c in the listing 175 within the memory device 116. The first RF signal that is generated and supplied by the RF generator RFG1 has the duty cycles DCS11, DCS21 and so on until the duty cycle DCSn1. Also, the first RF signal that is generated and supplied by the RF generator RFG2 has the duty cycles DCS111, DCS211 and so on until the duty cycle DCq11. The first RF signal that is generated and supplied by the RF generator RFGz has the duty cycles DCS112, DCS212 and so on until the duty cycle DCSt12.

When the RF generator RFG1 supplies the first RF signal to the impedance matching circuit 705, the RF generator RFG2 supplies the first RF signal to the impedance matching circuit 705, and the RF generator RFGz supplies the first RF signal to the impedance matching circuit 705, the impedance matching circuit 705 outputs the first modified RF signal to the lower electrode of the substrate support 108 of the plasma chamber 554. When the first modified RF signal is supplied to the lower electrode of the substrate support 108 and the one or more process gases are supplied to the plasma chamber 554, the substrate 526 is processed. After being processed, the substrate 526 is removed from the plasma chamber 554 via the opening 560 to be placed under the thickness measurement device 552, which generates the first set of intensity signals. The processor 114 determines the processing rates PR1a, PR1b, and PR1c based on the first set of intensity signals in the same manner as that described above with reference to FIG. 7B, determines the uniformity level UNFM1 based on the processing rates PR1$a$, PR1$b$, and PR1$c$ in a manner described above, and stores the processing rates PR1$a$, PR1$b$, and PR1$c$, and the uniformity level UNFM1 in the listing 750 stored in the memory device 116.

Moreover, in a similar manner as that described above for determining the processing rates PRpa through PRpc with reference to FIG. 5B, the processor 114 determines the processing rates PR2$a$, PR2$b$, and PR2$c$ when the second RF signal is supplied by the RF generator RFG1, the second RF signal is supplied by the RF generator RFG2, and the second RF signal is supplied by the RF generator RFGz, and stores the processing rates PR2$a$ through PR2$c$ in the listing 175 within the memory device 116. The second RF signal generated and supplied by the RF generator RFG1 has the duty cycles DCS12, DCS22 and so on until the duty cycle DCSn2. Also, the second RF signal generated and supplied by the RF generator RFG2 has the duty cycles DCS121, DCS221 and so on until the duty cycle DCSq21. The second RF signal generated and supplied by the RF generator RFGz has the duty cycles DCS122, DCS222 and so on until the duty cycle DCSt22. When the RF generator RFG1 supplies the second RF signal, the RF generator RFG2 supplies the second RF signal, and the RF generator RFGz supplies the second RF signal to the impedance matching circuit 705, the impedance matching circuit 705 outputs the second modified RF signal to the lower electrode of the substrate support 108 of the plasma chamber 554. When the second modified RF signal is supplied to the lower electrode of the substrate support 108 and the one or more process gases are supplied to the plasma chamber 554, the substrate 526 is processed. After being processed, the substrate 526 is removed from the plasma chamber 554 via the opening 560 and placed under the thickness measurement device 552, which generates the second set of intensity signals. The processor 114 determines the processing rates PR2$a$, PR2$b$, and PR2$c$ based on the second set of intensity signals in the same manner as that described above with reference to FIG. 5B, associates the processing rates PR2$a$, PR2$b$, and PR2$c$ with the uniformity level UNFM2, and stores the processing rates PR2$a$, PR2$b$, and PR2$c$, and the uniformity level UNFM2 in the listing 175 of the memory device 116.

Figure 11:
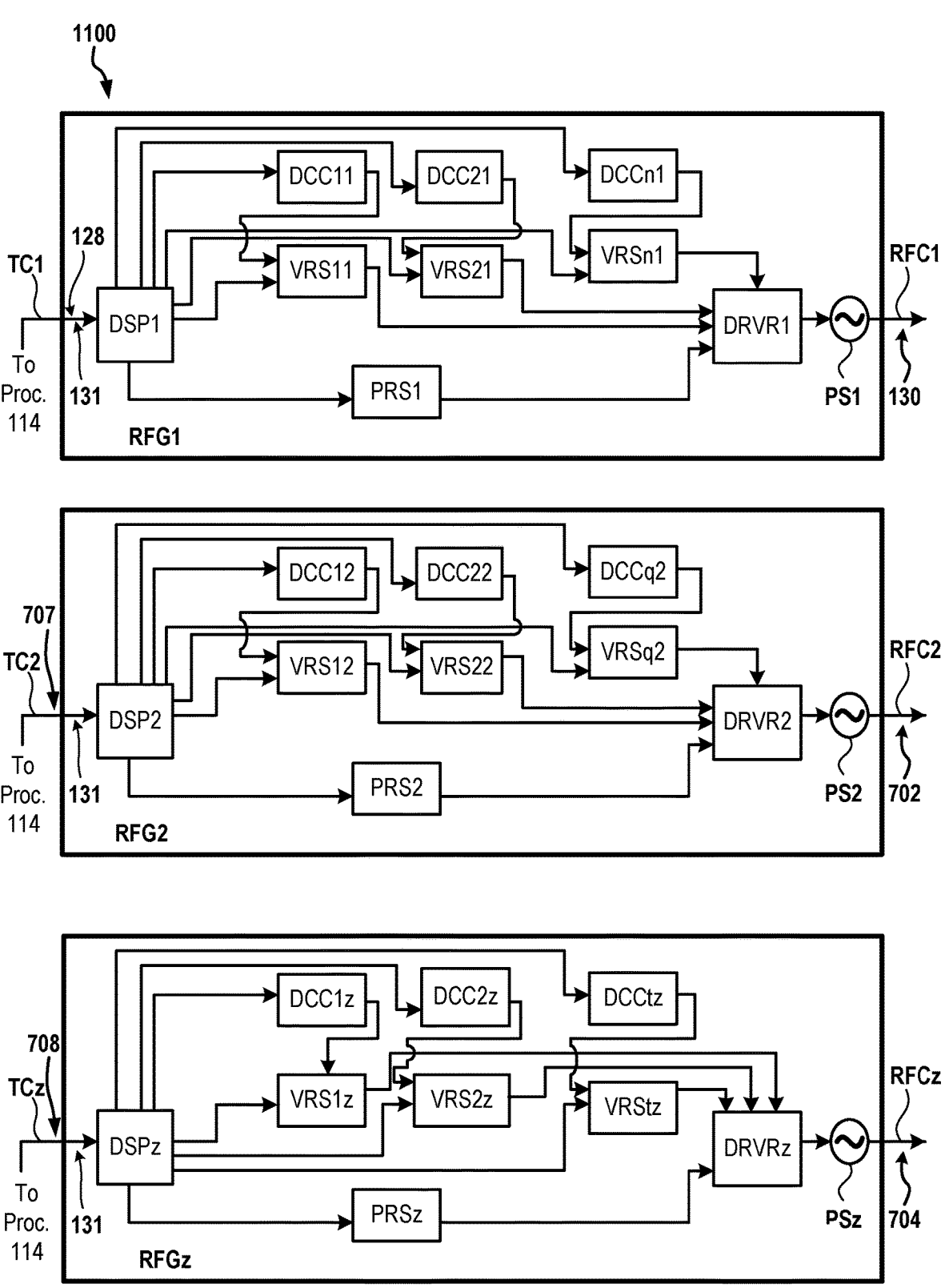
FIG. 11 is a diagram of an embodiment of a system to illustrate internal components of the RF generators of FIG. 7A to control duty cycles of the RF signals generated by the RF generators.

FIG. 11 is a diagram of an embodiment of a system 1100 to illustrate internal components within the RF generators RFG1 through RFGz to control duty cycles during the states S1 through Sn of the each of the first through pth RF signals generated by the RF generator RFG1, to control duty cycles during the states S1 through Sq of the each of the first through rth RF signals generated by the RF generator RFG2, and to control duty cycles during the states S1 through St of the each of the first through uth RF signals generated by the RF generator RFGz. The system 1100 includes the RF generators RFG1 through RFGz.

The internal components of the RF generator RFG1 are illustrated above with reference to FIG. 6. The RF generator RFG2 includes a digital signal processor DSP2, and multiple controllers. The controllers of the RF generator RFG2 include a duty cycle controller DCC12 for the state S1 of the variable of the RF signal 702, a duty cycle controller DCC22 for the state S2 of the variable, and so on until a duty cycle controller DCCq2 for the state Sq of the variable is included. Moreover, the controllers of the RF generator RFG2 include a variable controller VRS12 for the state S1 of the variable of the RF signal 702, a variable controller VRS22 for the state S2 of the variable, and so on until a variable controller VRSq2 for the state Sq of the variable is included. Also, the controllers of the RF generator RFG2 include a parameter controller PRS2 for the states S1 through Sq of the variable of the RF signal 702.

The RF generator RFG2 further includes a driver system DRVR2 and a power supply PS2. The processor 114 is coupled to the DSP2 via the transfer cable TC2. The digital signal processor DSP2 is coupled to the duty cycle controllers DCC12 through DCCq2, the variable controllers VRS12 through VRSq2, and the parameter controller PRS2. The duty cycle controller DCC12 is coupled to the variable controller VRS12. Also, the duty cycle controller DCC22 is coupled to the variable controller VRS22, and so on until the duty cycle controller DCCq2 is coupled to the variable controller VRSq2. The variable controllers VRS12 through VRSq2 and the parameter controller PRS2 are coupled to the driver system DRVR2, which is coupled to the power supply PS2. The power supply PS2 is coupled to the RF cable RFC2.

The processor 114 accesses the duty cycles DCS1$r$1 through DCSqr1 from the listing 750 stored within the memory device 116, generates the recipe signal 707 having the duty cycles DCS1$r$1 through DCSqr1, and sends the recipe signal 707 via the transfer cable TC2 to the digital signal processor DSP2. For example, the processor 114 identifies the duty cycles DCS1$r$1 through DCSqr1 as corresponding to the uniformity level UNFMp to be achieved, and generates the recipe signal 707 having the duty cycles DCS1$r$1 through DCSqr1.

The processor 114 also includes duty cycle identifiers within the recipe signal 707 to indicate that the duty cycles DCS1$r$1 through DCSqr1 are duty cycles for states of the variable of the RF signal 702. For example, the processor 114 includes a first duty cycle identifier within the recipe signal 707 to indicate that the duty cycle DCSr1 is for the state S1 of the variable of the RF signal 702, a second duty cycle identifier within the recipe signal 707 to indicate that the duty cycle DCS2$r$1 is for the state S2 of the variable, and so on until a qth duty cycle identifier within the recipe signal 707 is included to indicate that the duty cycle DCSqr1 is for the state Sq of the variable.

Upon receiving the duty cycles DCS1$r$1 through DCSqr1 embedded within the recipe signal 707, the digital signal processor DSP2 determines that the recipe signal 707 includes the duty cycles DCS1$r$1 through DCSqr1 from the duty cycle identifiers, extracts the duty cycles from the recipe signal 707, and sends the duty cycles DCS1$r$1 through DCSqr1 to the duty cycle controllers DCC12 through DCCq2. For example, the digital signal processor DSP2 identifies, from the first duty cycle identifier, that the recipe signal 707 includes the duty cycle DCS1$r$1 and determines that the duty cycle DCS1$r$1 is to be sent to the duty cycle controller DCC12. The digital signal processor DSP2 identifies, from the second duty cycle identifier, that the recipe signal 707 includes the duty cycle DCS2$r$1, and determines that the duty cycle DCS2$r$1 is to be sent to the duty cycle controller DCC22. The digital signal processor DSP2 identifies, from the qth duty cycle identifier, that the recipe signal 707 includes the duty cycle DCSqr1, and determines that the duty cycle DCSqr1 is to be sent to the duty cycle controller DCCq2. The digital signal processor DSP2 sends the duty cycle DCS1$r$1 to the duty cycle controller DCC12, sends the duty cycle DCS2$r$1 to the duty cycle controller DCC22, and so on until the duty cycle DCSqr1 is sent to the duty cycle controller DCCq2.

The duty cycle controllers DCC12 through DCCq2 store the duty cycles DCS1$r$1 through DCSqr1. For example, the duty cycle controller DCC12 stores the duty cycle DCS1$r$1 within a memory device of the duty cycle controller DCC12. Similarly, the duty cycle controller DCC22 stores the duty cycle DCS2$r$1 within a memory device of the duty cycle controller DCC22 and the duty cycle controller DCCq2 stores the duty cycle DCSqr1 within a memory device of the duty cycle controller DCCq2.

In a similar manner as that described above with respect to sending the duty cycles DCS1$r$1 through DCSqr1 to the digital signal processor DSP2 within the recipe signal 707, the processor 114 sends variable levels for the states S1 through Sq of the variable of the RF signal 702 and a parameter level, such as a single parameter level, for the states S1 through Sq within the recipe signal 707 to the digital signal processor DSP2. Upon receiving the variable levels for the states S1 through Sq, the digital signal processor DSP2 sends the variable level for the state S1 to the variable controller VRS12, sends the variable level for the state S2 to the variable controller VRS22, and so on until the variable level for the state Sq is sent to the variable controller VRSq2. Also, upon receiving the parameter level for all the states S1 through Sq, the digital signal processor DSP2 sends the parameter level for the states S1 through S1 to the parameter controller PRS2.

Moreover, the processor 114 sends, within the recipe signal 707, an order of generation of the variable levels of the RF signal 702. For example, as illustrated in the graph 800 (FIG. 8B), a portion of the RF signal 702 having a power level for the state S2 is generated first, a portion of the RF signal 702 having a power level for the state S3 is generated second, and a portion of the RF signal 702 having a power level for the state S2 is generated third during each clock cycle.

After the duty cycles DCS1$r$1 through DCSqr1 are stored in the duty cycle controllers DCC12 through DCCq2, the variable levels for the states S1 through Sq are stored in the variable controllers VRS12 through VRSq2, and the parameter level for the states S1 through Sq is stored in the parameter controller PRS2, the processor 114 sends the trigger signal 131 to the digital signal processor DSP2. Upon receiving the trigger signal 131, the digital signal processor DSP2 sends a first command signal to a first set of the controllers DCC12, VRS12, and PRS2, a second command signal to a second set of the controllers DCC22, VRS22, and PRS2, and a qth command signal to a qth set of the controllers DCCq2, VRSq2, and PRS2. The first through qth command signals are sent from the digital signal processor DSP2 in the order of execution of the states S1 through Sq defining the variable levels of the RF signal 702. Upon receiving the first command signal, the variable controller VRS12 accesses the duty cycle DCS1$r$1 from the duty cycle controller DCC12 and supplies the variable level for the state S1 to the driver system DRVR2 for a time interval of the duty cycle DCS1$r$1. Similarly, upon receiving the first command signal, the parameter controller PRS2 supplies the parameter level for the states S1 through Sq to the driver system DRVR2.

Upon receiving the variable level for the state S1 for the time period of the duty cycle DCS1$r$1 and the parameter level for the states S1 through Sq, the driver of the driver system DRVR2 generates a drive signal for the state S1 for the time period of the duty cycle DCS1$r$1. The drive signal for the state S1 is based on the variable level for the state S1 defining the variable of the RF signal 702 and the parameter level for the states S1 through Sq defining the variable of the RF signal 702. The drive signal for the state S1 can be amplified by the amplifier of the driver system DRVR2 to output an amplified signal for the state S1 for the time period defining the duty cycle DCS1$r$1. The amplified signal for the state S1 for the time period defining the duty cycle DCS1$r$1 is sent from the amplifier of the driver system DRVR2 to the power supply PS2. Upon receiving the amplified signal for the state S1 for the time period defining the duty cycle DCS1$r$1, the power supply PS2 generates a portion of the RF signal 702 for the state S1. The portion of the RF signal 702 for the state S1 has the variable level for the state S1 for the time period defining the duty cycle DCS1$r$1 and has the parameter level for the states S1 through Sq for the time period defining the duty cycle DCS1$r$1.

Moreover, upon receiving the second command signal, the variable controller VRS22 accesses the duty cycle DCS2$r$1 from the duty cycle controller DCC22 and supplies the variable level for the state S2 to the driver system DRVR2 for a time interval defining the duty cycle DCS2$r$1. Similarly, upon receiving the second command signal, the parameter controller PRS2 continues to supply the parameter level for the states S1 through Sq to the driver system DRVR2.

Upon receiving the variable level for the state S2 for the time period defining the duty cycle DCS2$r$1 and the parameter level for the states S1 through Sq, the driver of the driver system DRVR2 generates a drive signal for the state S2 for the time period defining the duty cycle DCS2$p$. The drive signal for the state S2 defining the variable of the RF signal 702 is based on the variable level for the state S2 and the parameter level for the states S1 through Sq. The drive signal for the state S2 defining the variable of the RF signal 702 can be amplified by the amplifier of the driver system DRVR2 to output an amplified signal for the state S2 for the time period of the duty cycle DCS2$r$1. The amplified signal for the state S2 for the time period defining the duty cycle DCS2$r$1 is sent from the amplifier of the driver system DRVR2 to the power supply PS2. Upon receiving the amplified signal for the state S2 for the time period defining the duty cycle DCS2$r$1, the power supply PS2 generates a portion of the RF signal 702 for the state S2. The portion of the RF signal 702 for the state S2 has the variable level for the state S2 for the time period defining the duty cycle DCS2$r$1 and has the parameter level for the states S1 through Sq for the time period defining the duty cycle DCS2$r$1.

Also, upon receiving the qth command signal, the variable controller VRSq2 accesses the duty cycle DCSqr1 from the duty cycle controller DCCq2 and supplies the variable level for the state Sq to the driver system DRVR2 for a time interval of the duty cycle DCSqr1. Also, upon receiving the qth command signal, the parameter controller PRS2 further continues to supply the parameter level for the states S1 through Sq to the driver system DRVR2.

Upon receiving the variable level for the state Sq for the time period of the duty cycle DCSqr1 and the parameter level for the state Sq for the time period defining the duty cycle DCSqr1, the driver of the driver system DRVR2 generates a drive signal for the state Sq for the time period defining the duty cycle DCSqr1. The drive signal for the state Sq is based on the variable level for the state Sq and the parameter level for the states S1 through Sq. The drive signal for the state Sq can be amplified by the amplifier of the driver system DRVR2 to output an amplified signal for the state Sq for the time period defining the duty cycle DCSqr1. The amplified signal for the state Sq for the time period defining the duty cycle DCSqr1 is sent from the amplifier of the driver system DRVR2 to the power supply PS2. Upon receiving the amplified signal for the state Sq for the time period defining the duty cycle DCSqr1, the power supply PS2 generates a portion of the RF signal 702 for the state Sq.

The portion of the RF signal 702 for the state Sq has the variable level for the state Sq for the time period defining the duty cycle DCSqr1 and has the parameter level for the states S1 through Sq for the time period defining the duty cycle DCSqr1.

The states S1 through Sq defining the variable of the RF signal 702 repeat for each clock cycle of the clock signal. The clock signal is generated by a clock source, such as clock oscillator or an electronic oscillator, of the RF generator RFG2. The clock signal generated by the RF generator RFG2 is the same as the clock signal generated by the RF generator RFG1. The clock source of the RF generator RFG2 is coupled to the digital signal processor DSP2 to send the clock signal to the digital signal processor DSP2. Upon determining that the cycle 1 of the clock signal generated by the clock source of the RF generator RFG2 has ended and the cycle 2 of the clock signal has begun, the digital signal processor DSP2 repeats sending the first through qth command signals to the variable controllers VRS12 through VRSq2 and the parameter controller PRS2 in the order described above to repeat generation of the states S1 through Sq defining the variable levels and the parameter level of the RF signal 702 during the cycle 2 of the clock signal generated by the RF generator RFG2.

The RF generator RFGz includes a digital signal processor DSPz, and multiple controllers. The controllers of the RF generator RFGz include a duty cycle controller DCCIz for the state S1, a duty cycle controller DCC2z for the state S2, and so on until a duty cycle controller DCCtz for the state St is included. Moreover, the controllers of the RF generator RFGz include a variable controller VRSIz for the state S1, a variable controller VRS2z for the state S2, and so on until a variable controller VRStz for the state St is included. Also, the controllers of the RF generator RFGz include a parameter controller PRSZ for the states S1 through St.

The RF generator RFGz further includes a driver system DRVRz and a power supply PSz. The processor 114 is coupled to the DSPz via the transfer cable TCz. The DSPZ is coupled to the duty cycle controllers DCCIz through DCCtz, the variable controllers VRS1z through VRStz, and the parameter controller PRSz. The duty cycle controller DCC1z is coupled to the variable controller VRSIz. Also, the duty cycle controller DCC2z is coupled to the variable controller VRS2z, and so on until the duty cycle controller DCCtz is coupled to the variable controller VRStz. The variable controllers VRSIz through VRStz and the parameter controller PRSz are coupled to the driver system DRVRz, which is coupled to the power supply PSz. The power supply PSz is coupled to the RF cable RFCZ.

The processor 114 accesses the duty cycles DCS1u2 through DCStu2 from the listing 750 stored within the memory device 116, generates the recipe signal 708 having the duty cycles DCS1u2 through DCStu2, and sends the recipe signal 708 via the transfer cable TCz to the digital signal processor DSPz. For example, the processor 114 identifies the duty cycles DCS1u2 through DCStu2 as corresponding to the uniformity level UNFMp to be achieved, and generates the recipe signal 708 having the duty cycles DCS1u2 through DCStu2.

The processor 114 also includes duty cycle identifiers within the recipe signal 708 to indicate that the duty cycles DCS1u2 through DCStu2 are duty cycles for states of the variable of the RF signal 704. For example, the processor 114 includes a first duty cycle identifier within the recipe signal 708 to indicate that the duty cycle DCS1u2 is for the state S1, a second duty cycle identifier within the recipe signal 707 to indicate that the duty cycle DCS2u2 is for the state S2, and so on until a tth duty cycle identifier within the recipe signal 708 to indicate that the duty cycle DCStu2 is for the state St.

Upon receiving the duty cycles DCS1u2 through DCStu2 embedded within the recipe signal 708, the digital signal processor DSPz determines that the recipe signal 708 includes the duty cycles DCS1u2 through DCStu2 from the duty cycle identifiers, extracts the duty cycles from the recipe signal 708, and sends the duty cycles DCS1u2 through DCStu2 to the duty cycle controllers DCCIz through DCCtz. For example, the digital signal processor DSPz identifies, from the first duty cycle identifier, that the recipe signal 708 includes the duty cycle DCS1u2 and determines that the duty cycle DCS1u2 is to be sent to the duty cycle controller DCCIz. The digital signal processor DSPz identifies, from the second duty cycle identifier, that the recipe signal 708 includes the duty cycle DCS2u2, and determines that the duty cycle DCS2u2 is to be sent to the duty cycle controller DCC2z. The digital signal processor DSPz identifies, from the tth duty cycle identifier, that the recipe signal 708 includes the duty cycle DCStu2, and determines that the duty cycle DCStu2 is to be sent to the duty cycle controller DCCtz. The digital signal processor DSPz sends the duty cycle DCS1u2 to the duty cycle controller DCCIz, sends the duty cycle DCS2u2 to the duty cycle controller DCC2z, and so on until the duty cycle DCStu2 is sent to the duty cycle controller DCCtz.

The duty cycle controllers DCCIz through DCCtz store the duty cycles DCS1u2 through DCStu2. For example, the duty cycle controller DCCIz stores the duty cycle DCS1u2 within a memory device of the duty cycle controller DCCIz. Similarly, the duty cycle controller DCC2z stores the duty cycle DCS2u2 within a memory device of the duty cycle controller DCC2z and the duty cycle controller DCCtz stores the duty cycle DCStu2 within a memory device of the duty cycle controller DCCtz.

In a similar manner as that described above with respect to sending the duty cycles DCS1u2 through DCStu2 to the digital signal processor DSPz within the recipe signal 708, the processor 114 sends variable levels for the states S1 through St of the variable of the RF signal 704 and a parameter level, such as a single parameter level, for the states S1 through St within the recipe signal 708 to the digital signal processor DSPz. Upon receiving the variable levels for the states S1 through St of the variable of the RF signal 704, the digital signal processor DSPz sends the variable level for the state S1 to the variable controller VRS1z, sends the variable level for the state S2 to the variable controller VRS2z, and so on until the variable level for the state St is sent to the variable controller VRStz. Also, upon receiving the parameter level for the states S1 through St, the digital signal processor DSPZ sends the parameter level to the parameter controller PRSZ.

Moreover, the processor 114 sends, within the recipe signal 708, an order of generation of the variable levels and the parameter level of the RF signal 704. For example, as illustrated in the graph 804 (FIG. 8C), a portion of the RF signal 704 having a power level for the state S2 is generated first and a portion of the RF signal 704 having a power level for the state S1 is generated second during each clock cycle of the clock signal.

After the duty cycles DCS1u2 through DCStu2 are stored in the duty cycle controllers DCC1z through DCCtz, the variable levels for the states S1 through St are stored in the variable controllers VRS1z through VRStz, and the parameter level for the states S1 through St are stored in the parameter controller PRSz, the processor 114 sends the trigger signal 131 to the digital signal processor DSPz. Upon receiving the trigger signal 131, the digital signal processor DSPz sends a first command signal to a first set of the controllers DCC1z, VRS1z, and PRSz, a second command signal to a second set of the controllers DCC2z, VRS2z, and PRSz, and a tth command signal to a tth set of the controllers DCCtz, VRStz, and PRSz. The first through tth command signals are sent from the digital signal processor DSPz in the order of execution of the states S1 through St defining the variable levels and the parameter level of the RF signal 704. Upon receiving the first command signal, the variable controller VRS1z accesses the duty cycle DCS1u2 from the duty cycle controller DCC1z and supplies the variable level for the state S1 to the driver system DRVRz for a time interval of the duty cycle DCS1u2. Also, upon receiving the first command signal, the parameter controller PRSz supplies the parameter level for the states S1 through St defining the variable of the RF signal 704 to the driver system DRVRZ.

Upon receiving the variable level for the state S1 for the time period of the duty cycle DCS1u2 and the parameter level for the states S1 through St, the driver of the driver system DRVRz generates a drive signal for the state S1 for the time period defining the duty cycle DCS1u2. The drive signal for the state S1 is based on the variable level for the state S1 of the variable of the RF signal 704 and the parameter level for the states S1 through St. The drive signal for the state S1 can be amplified by the amplifier of the driver system DRVRz to output an amplified signal for the state S1 for the time period defining the duty cycle DCS1u2. The amplified signal for the state S1 for the time period defining the duty cycle DCS1u2 is sent from the amplifier of the driver system DRVRz to the power supply PSz. Upon receiving the amplified signal for the state S1 for the time period defining the duty cycle DCS1u2, the power supply PSz generates a portion of the RF signal 704 for the state S1. The portion of the RF signal 704 for the state S1 has the variable level for the state S1 for the time period defining the duty cycle DCS1u2 and has the parameter level for the states S1 through St for the time period defining the duty cycle DCS1u2.

Moreover, upon receiving the second command signal, the variable controller VRS2z accesses the duty cycle DCS2u2 from the duty cycle controller DCC2z and supplies the variable level for the state S2 to the driver system DRVR2 for a time interval of the duty cycle DCS2z. Also, upon receiving the second command signal, the parameter controller PRSz continues to supply the parameter level for the states S1 through St to the driver system DRVRZ.

Upon receiving the variable level for the state S2 for the time period defining the duty cycle DCS2u2 and the parameter level for the states S1 through St, the driver of the driver system DRVRz generates a drive signal for the state S2 for the time period defining the duty cycle DCS2u2. The drive signal for the state S2 defining the variable of the RF signal 704 is based on the variable level for the state S2 and the parameter level for the states S1 through St. The drive signal for the state S2 defining the variable of the RF signal 704 can be amplified by the amplifier of the driver system DRVRz to output an amplified signal for the state S2 for the time period defining the duty cycle DCS2u2. The amplified signal for the state S2 for the time period defining the duty cycle DCS2u2 is sent from the amplifier of the driver system DRVRz to the power supply PSz. Upon receiving the amplified signal for the state S2 for the time period defining the duty cycle DCS2u2, the power supply PSz generates a portion of the RF signal 704 for the state S2. The portion of the RF signal 704 for the state S2 has the variable level for the state S2 for the time period of the duty cycle DCS2u2 and has the parameter level for the states S1 through St for the time period of the duty cycle DCS2u2.

Also, upon receiving the tth command signal, the variable controller VRStz accesses the duty cycle DCStu2 from the duty cycle controller DCCtz and supplies the variable level for the state St to the driver system DRVRz for a time interval of the duty cycle DCStu2. Also, upon receiving the tth command signal, the parameter controller PRSz further continues to supply the parameter level for the states S1 through St to the driver system DRVRz.

Upon receiving the variable level for the state St for the time period of the duty cycle DCStu2 and the parameter level for the states S1 through St, the driver of the driver system DRVRz generates a drive signal for the state St for the time period of the duty cycle DCStu2. The drive signal for the state St is based on the variable level for the state St and the parameter level for the states S1 through St. The drive signal for the state St can be amplified by the amplifier of the driver system DRVRz to output an amplified signal for the state St for the time period of the duty cycle DCStu2. The amplified signal for the state St for the time period of the duty cycle DCStu2 is sent from the amplifier of the driver system DRVRz to the power supply PSz. Upon receiving the amplified signal for the state St for the time period defining the duty cycle DCStu2, the power supply PSz generates a portion of the RF signal 704 for the state St. The portion of the RF signal 704 for the state St has the variable level for the state St for the time period defining the duty cycle DCStu2 and has the parameter level for the states S1 through St for the time period defining the duty cycle DCStu2.

The states S1 through St defining the variable of the RF signal 704 repeat for each clock cycle of the clock signal. The clock signal is generated by a clock source, such as clock oscillator or an electronic oscillator, of the RF generator RFGz. The clock signal generated by the RF generator RFGz is the same as the clock signal generated by the RF generator RFG1. The clock source within the RF generator RFGz is coupled to the digital signal processor DSPz to send the clock signal to the digital signal processor DSPz. Upon determining that the cycle 1 of the clock signal generated by the clock source within the RF generator RFGz has ended and the cycle 2 of the clock signal has begun, the digital signal processor DSPz repeats sending the first through tth command signals to the variable controllers VRS1z through VRStz and the parameter controller PRSz in the order described above to repeat generation of the states S1 through St defining the variable levels and the parameter level of the RF signal 704 during the cycle 2 of the clock signal generated by the RF generator RFGz.

In one embodiment, the functions described herein as being performed by two or more of the controllers DCC12 through DCCq2, VRS12 through VRSq2, and PRS2 are instead performed by a single controller. For example, the functions described herein as being performed by two or more of the controllers DCC12 through DCCq2, VRS12 through VRSq2, and PRS2 are instead performed by a processor within the single controller.

In an embodiment, the functions described herein as being performed by two or more of the controllers DCC12 through DCCq2, VRS12 through VRSq2, and PRS2 are instead performed by any other number of controllers.

In one embodiment, the functions described herein as being performed by two or more of the controllers DCC1z through DCCtz, VRS1z through VRStz, and PRSz are instead performed by a single controller. For example, the functions described herein as being performed by two or more of the controllers DCC1z through DCCtz, VRS1z through VRStz, and PRSz are instead performed by a processor within the single controller.

In an embodiment, the functions described herein as being performed by two or more of the controllers DCC1z through DCCtz, VRS1z through VRStz, and PRSz are instead performed by any other number of controllers.

Figures 12A, 12B:
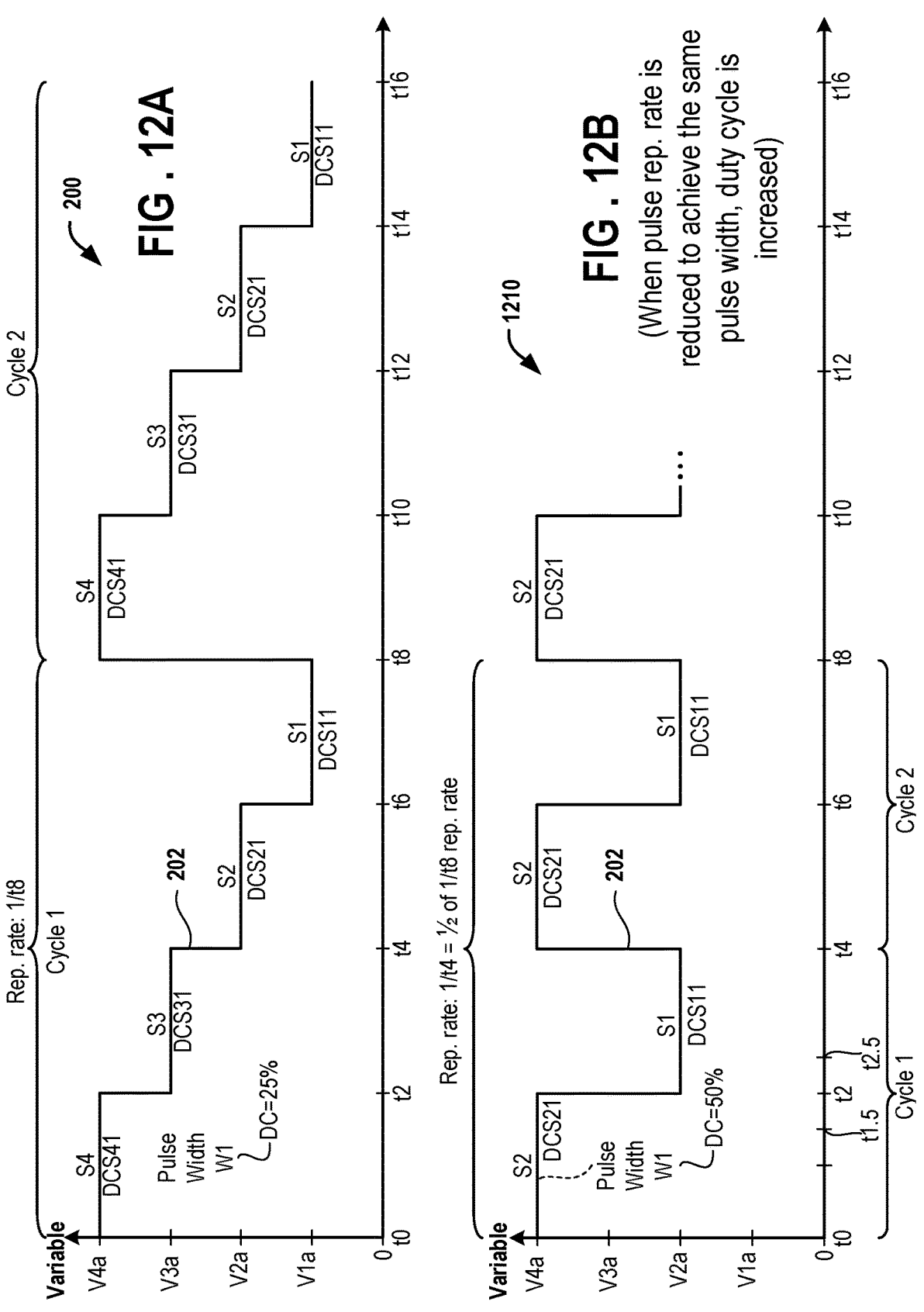
FIG. 12A is an embodiment of the graph of FIG. 2A.
FIG. 12B is an embodiment of a graph to illustrate that when a pulse repetition rate is reduced, to achieve the same pulse width, a duty cycle of each pulse of an RF signal that is generated by the RF generator of FIG. 1 is increased.

FIG. 12A is an embodiment of the graph 200. The plot 202 has a frequency, such as a pulse repetition rate, of the states S1 through S4 defining the variable of the first RF signal that is generated by the RF generator RFG1 (FIG. 1). For example, the repetition rate of the plot 202 is 1/t8. The states S1 through S4 repeat with the frequency of 1/t8. For example, a first instance of each of the states S1 through S4 are occurs during the cycle 1 generated by the RF generator RFG1 and a second instance of each of the states S1 through S4 are occurs during the cycle 2.

It should be noted that each of the duty cycles DC11 through DC41 is 25%. For example, a time period of occurrence defining the state S4 of the variable of the first RF signal that is generated by the RF generator RFG1 is 25% of a total time period of the cycle 1 of the clock signal generated by the RF generator RFG1. Also, a time period of occurrence defining the state S3 of the variable of the first RF signal that is generated by the RF generator RFG1 is 25% of the total time period defining the cycle 1 of the clock signal generated by the RF generator RFG1. A time period of occurrence defining the state S2 of the variable is 25% of the total time period defining the cycle 1 generated by the RF generator RFG1, and a time period of occurrence defining the state S1 of the variable is 25% of the total time period.

It should further be noted that a pulse width defining the state S4 of the variable of the first RF signal that is generated by the RF generator RFG1 extends from the time t0 to the time t2. Similarly, a pulse width defining the state S3 of the variable of the first RF signal that is generated by the RF generator RFG1 extends from the time t2 to the time t4. Also, a pulse width defining the state S2 of the variable extends from the time t4 to the time t6 and a pulse width defining the state S1 of the variable extends from the time t6 to the time t8.

FIG. 12B is an embodiment of a graph 1210 to illustrate that when the pulse repetition rate is reduced, to achieve the same pulse width, a duty cycle of each pulse of the first RF signal that is generated by the RF generator RFG1 is increased. The graph 1210 includes a plot 1212 of the variable of a two-state RF signal that is generated by the RF generator RFG1 versus the time t. The variable of the two-state RF signal is plotted on a y-axis in the graph 1210 and the time t is plotted on an x-axis in the graph 1210.

The x-axis in the graph 1210 is divided into equal time intervals in the same manner in which the x-axis in the graph 200 (FIG. 12A) is divided. The y-axis in the graph 1210 is divided into variable levels of the variable of the two-state RF signal in the same manner in which the y-axis in the graph 200 is divided.

The plot 1212 transitions from the variable level V2a to the variable level V4a at the time t0. The plot 1212 has the variable level V4a during a time period between the time t0 and the time t2. The plot 1212 transitions at the time t2 from the variable level V4a to the variable level V2a at the time t2. The plot 1212 remains at the variable level V2a during a time interval between the time t2 and the time t4, and transitions at the time t4 from the variable level V2a to the variable level V4a.

The variable level V4a of the plot 1212 defines the state S2 representing the variable of the two-state RF signal.

Similarly, the variable level V2a of the plot 202 defines the state S1 of the variable of the two-state RF signal. The variable levels V4a through V2a of the plot 1212 repeat during each clock cycle generated by the RF generator RFG1. For example, first instances of the variable levels V4a and V2a of the plot 1212 occur during the cycle 1 generated by the RF generator RFG1 and second instances of the variable levels V4a and V2a occur during the cycle 2.

The time interval for which the state S2 of the variable of the plot 1212 occurs is illustrated as the duty cycle DCS21. Similarly, the time interval for which the state S1 of the variable of the plot 1212 occurs is illustrated as the duty cycle DCS11.

A pulse repetition rate, such as a frequency, of occurrence of the states S2 and S1 illustrated in the plot 1212 is reduced compared to the pulse repetition rate of occurrence of the states S1 through S4 shown in the graph 200. For example, the pulse repetition rate of occurrence of the states S2 and S1 of the plot 1212 is 1/t4, which is half of the pulse repetition rate of 1/t8 of the plot 202.

It should further be noted that a pulse width of the state S2 of the variable of the two-state RF signal that is generated by the RF generator RFG1 extends from the time t0 to the time t2. Similarly, a pulse width of a pulse of the state S1 of the variable of the two-state RF signal that is generated by the RF generator RFG1 extends from the time t2 to the time t4.

It should be noted that each of the duty cycles DC21 through DC11 is 50%. For example, a time period of occurrence of the state S2 defining the variable of the two-state RF signal that is generated by the RF generator RFG1 is 50% of a total time period defining the cycle 1 generated by the RF generator RFG1. Also, a time period of occurrence defining the state S1 of the variable of the two-state RF signal that is generated by the RF generator RFG1 is 50% of the total time period defining the cycle 1 generated by the RF generator RFG1.

With reference to the graph 200 of FIG. 12A, when the pulse repetition rate is reduced, to achieve the same pulse width, a duty cycle of occurrence of the variable of an RF signal generated by the RF generator RFG1 is increased. For example, when the pulse repetition rate reduces from 1/t8 to 1/t4, to achieve the pulse width of the state S4 of the first RF signal generated by the RF generator RFG1 (FIG. 1), a duty cycle of the first RF signal is increased from 25% to 50%. When the duty cycle is increased, the two-state RF signal is generated by the RF generator RFG1.

In an embodiment, a transition of the variable, illustrated in the plot 1212, of the two-state RF signal occurs within a time interval. For example, instead of transitioning from the variable level V4a to the variable level V2a at the time t2, the plot 1212 transitions during a time interval from a first time to a second time. The first time is between the time t1.5 and the time t2, and the second time is between the time t2 and the time t2.5. In this example, a duty cycle of the variable level V2a includes a time interval of occurrence of the variable level V2a and the time interval defining the transition from the variable level V4a to the variable level V2a. As another example, a duty cycle of the variable level V4a includes a time interval of occurrence of the variable level V4a and the time interval defining the transition from the variable level V4a to the variable level V2a.

Figure 13:
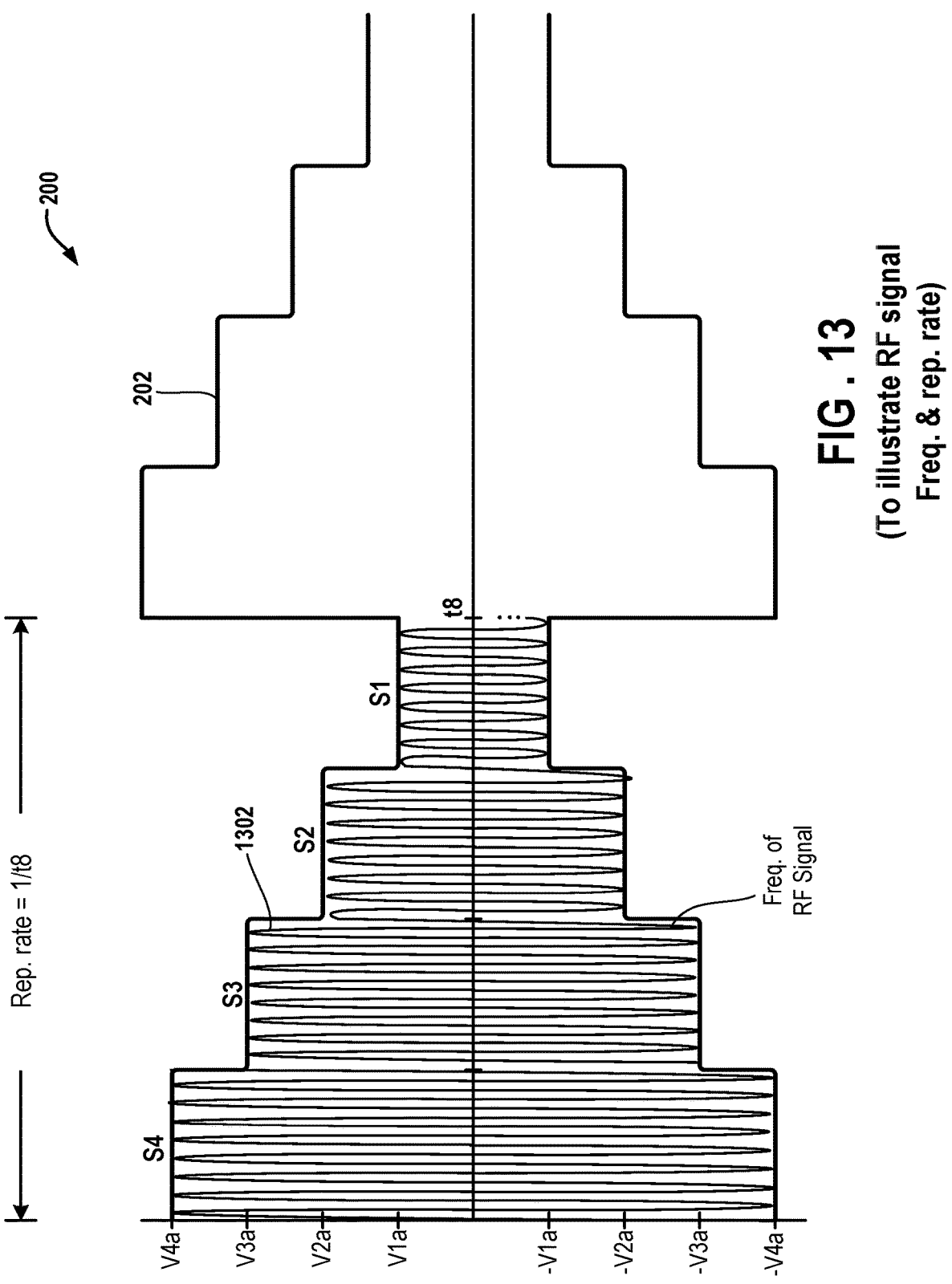
FIG. 13 is a diagram of an embodiment of the graph of FIG. 2A to illustrate an RF signal that is generated by the RF generator of FIG. 1.

FIG. 13 is a diagram of an embodiment of the graph 200 to illustrate the first RF signal, such as an RF signal 1302, that is generated by the RF generator RFG1 (FIG. 1). Each variable level V1a through V4a is an envelope of the RF signal 1302. For example, the variable level V4a is a peak-to-peak amplitude of the RF signal 1302 and the variable level V3*a* is another peak-to-peak amplitude of the RF signal 1302. It should be noted that a frequency of the RF signal 1302 is greater than a frequency of repetition of the states S1 through S4. A frequency of operation of the RF generator RFG1 defines the frequency of the RF signal 1302. For example, the frequency of operation of the RF generator RFG1 is the same as the frequency of the RF signal 1302.

An example of an RF signal, as used herein, is a sinusoidal signal, which has the shape of a sine wave. The RF signal oscillates between a positive variable level and a negative variable level. To illustrate, the RF signal 1302 oscillates between the variable level V4*a* and a negative variable level-V4*a* during the state S4. The RF signal 1302 further oscillates between the variable level V3*a* and a negative variable level-V3*a* during the state S3, oscillates between the variable level V2*a* and a negative variable level-V2*a* during the state S2, and oscillates between the variable level V1*a* and a negative variable level-V1*a* during the state S1. The negative variable level—V3*a* is greater than the variable level—V4*a*. The negative variable level—V2*a* is greater than the negative variable level—V3*a*, and the negative variable level—V1*a* is greater than the negative variable level—V2*a*. The variable level of zero is greater than the negative variable level—V1*a*.

Figure 14A:
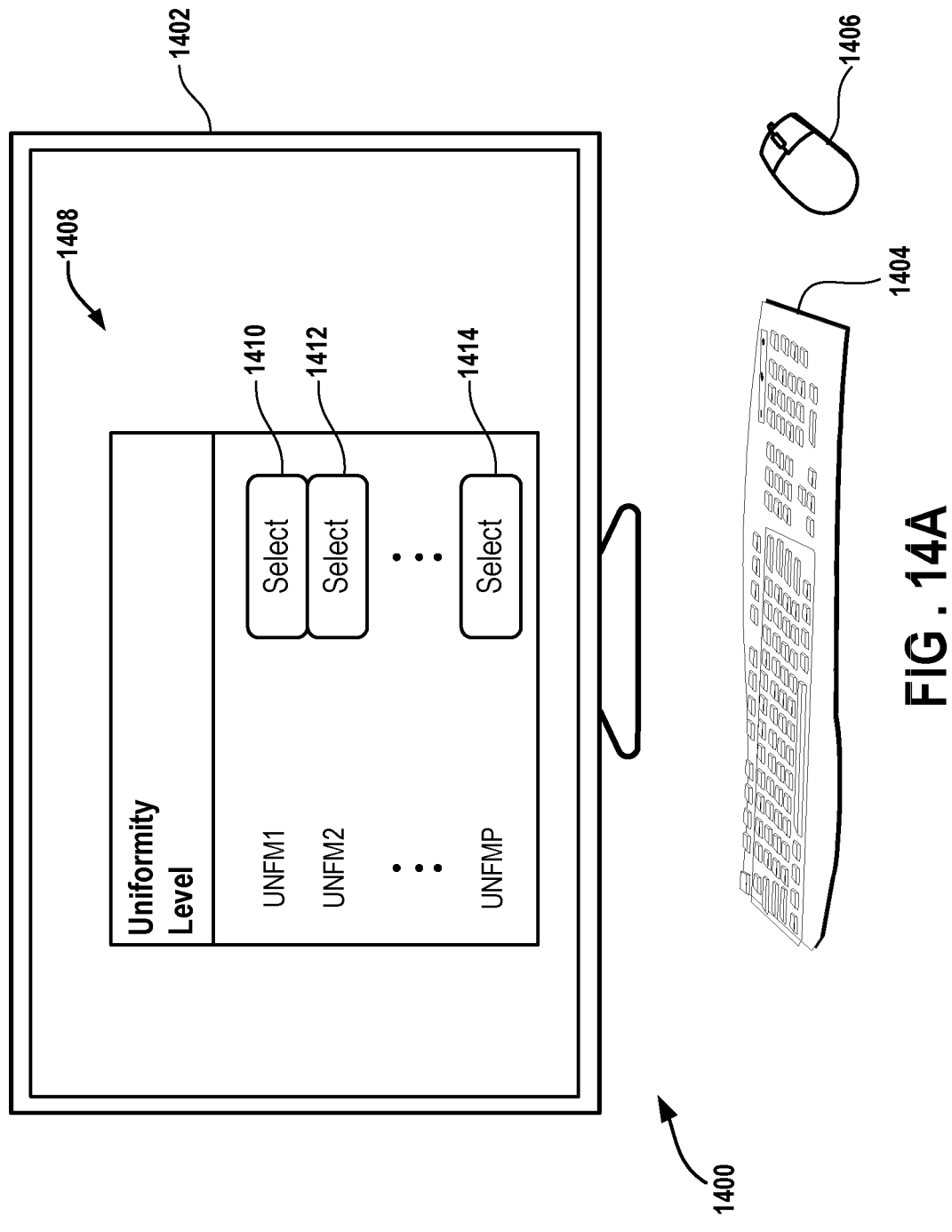
FIG. 14A is a diagram of an embodiment of a desktop computer to illustrate a selection of one of the uniformity levels of FIG. 5A or of FIG. 7B.

FIG. 14A is a diagram of an embodiment of a desktop computer 1400, which is an example of the host computer 106 (FIG. 1). The desktop computer 1400 illustrates a selection of one of the uniformity levels UNFM1 through UNFMp. The desktop computer 1400 includes a monitor 1402, a keyboard 1404 and a mouse 1406. Each of the keyboard 1404 and the mouse 1406 is an example of the input device. The keyboard 1404 and the mouse 1406 are wirelessly coupled to the monitor 1402. For example, the keyboard 1404 is coupled to a CPU of the monitor 1402 via a wireless connection. Examples of a wireless connection include a Bluetooth™ connection and a Wi-Fi™ connection. Similarly, the mouse 1406 is coupled to the CPU of the monitor 1402 via a wireless connection.

Within a housing of the monitor 1402, the CPU, such as the processor 114 (FIG. 1), a graphical processing unit (GPU), and a memory device, such as the memory device 116 (FIG. 1) are located. The monitor 114 includes a display screen, such as a liquid crystal display (LCD) display screen, a plasma display screen, and a light emitting diode (LED) display screen.

The GPU displays a list 1408 of the uniformity levels UNFM1 through UNFMp. Besides each uniformity level UNFM1 through UNFMp, the GPU displays a select button. For example, a select button 1410 is displayed besides the uniformity level UNFM1, a select button 1412 is displayed besides the uniformity level UNFM2, and a select button 1414 is displayed besides the uniformity level UNFMp.

The user uses the keyboard 1404 or the mouse 1406 or a combination thereof to select one of the select buttons, such as the select buttons 1410-1414, to select one of the uniformity levels UNFM1 through UNFMp to be achieved after processing the substrate S (FIG. 1). Upon receiving a signal indicating the selection of the one of the uniformity levels UNFM1 through UNFMp via one or more of the wireless connections, the processor of the monitor 1402 controls one or more of the RF generators RFG1 through RFGz. The one or more of the RF generators RFG1 through RFGz are controlled to achieve the one of the uniformity levels UNFM1 through UNFMp.

Figure 14B:
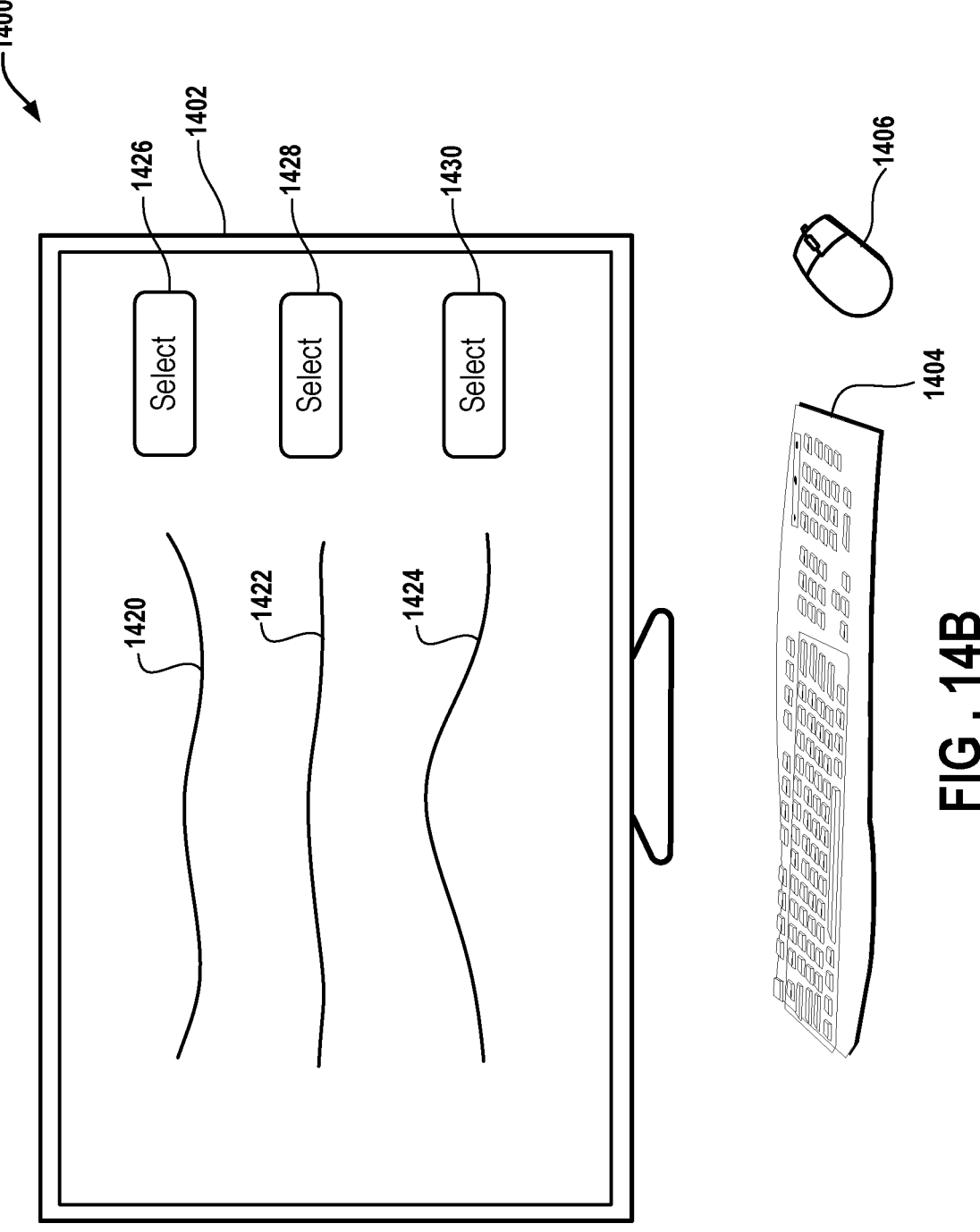
FIG. 14B is a diagram of an embodiment of the desktop computer to illustrate a selection of one of the uniformity levels of FIG. 5A or of FIG. 7B in a graphical form.

FIG. 14B is a diagram of an embodiment of the desktop computer 1400 to illustrate a selection of one of the uniformity levels UNFM1 through UNFMp in a graphical form. The GPU displays a uniformity level 1420, a uniformity level 1422, and a uniformity level 1424. The uniformity level 1420 is an example of the uniformity level UNFM1, the uniformity level 1422 is an example of the uniformity level UNFM2, and the uniformity level 1424 is an example of the uniformity level UNFMp.

Besides each uniformity level 1420, 1422, and 1424, the GPU displays a select button. For example, a select button 1426 is displayed besides the uniformity level 1420, a select button 1428 is displayed besides the uniformity level 1422, and a select button 1430 is displayed besides the uniformity level 1424.

The user uses the keyboard 1404 or the mouse 1406 or a combination thereof to select one of the select buttons, such as the select buttons 1426-1430, to select one of the uniformity levels 1420, 1422, and 1424 to be achieved after processing the substrate S (FIG. 1). Upon receiving a signal indicating the selection of the one of the uniformity levels 1420, 1422, and 1424 via one or more of the wireless connections, the processor of the monitor 1402 controls one or more of the RF generators RFG1 through RFGz. The one or more of the RF generators RFG1 through RFGz are controlled to achieve the one of the uniformity levels 1420, 1422, and 1424.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for achieving a uniformity level in a processing rate across a surface of a substrate, comprising:

receiving a first uniformity level to be achieved across the surface of the substrate;

identifying a first plurality of duty cycles associated with a first plurality of states based on the first uniformity level, wherein the first plurality of states are of a variable of a first radio frequency (RF) signal;

receiving a second uniformity level to be achieved across the surface of the substrate;

identifying a second plurality of duty cycles associated with a second plurality of states based on the second uniformity level, wherein the second plurality of states are of a variable of a second RF signal; and controlling an RF generator to generate the second RF signal having the second plurality of duty cycles to achieve the second uniformity level, wherein the second RF signal having the second plurality of duty cycles is generated by the RF generator that is coupled to a substrate support of a plasma chamber.

2. The method of claim 1, further comprising:

accessing, from a memory device, a listing having a one-to-one correspondence between the second uniformity level and the second plurality of duty cycles, wherein said identifying the second plurality of duty cycles includes determining that the second plurality of duty cycles correspond to the second uniformity level in the listing, and wherein said controlling the RF generator includes sending a recipe signal having the second plurality of duty cycles to the RF generator.

3. The method of claim 2, wherein said controlling the RF generator includes sending a trigger signal to the RF generator after said sending the recipe signal.

4. The method of claim 1, wherein a number of the second plurality of states is unequal to a number of the first plurality of states.

5. The method of claim 1, wherein the first plurality of duty cycles and the second plurality of duty cycles repeat with each clock cycle.

6. The method of claim 1, wherein the variable of the first RF signal is power or frequency and the variable of the second RF signal is power or frequency.

7. The method of claim 1, wherein each of the first plurality of duty cycles is a time period that occurs during a clock cycle, wherein each of the first plurality of states represents a peak-to-peak amplitude of the first RF signal, wherein each of the second plurality of duty cycles is a time period that occurs during the clock cycle, wherein each of the second plurality of states represents a peak-to-peak amplitude of the second RF signal.

8. The method of claim 1, wherein the first plurality of states include a first plurality of variable levels of the variable of the first RF signal, wherein each of the first plurality of variable levels is a peak-to-peak envelope of the variable of the first RF signal, wherein the second plurality of states include a second plurality of variable levels of the variable of the second RF signal, wherein each of the second plurality of variable levels is a peak-to-peak envelope of the variable of the second RF signal.

9. A method for achieving a uniformity level in a processing rate across a surface of a substrate, comprising:

receiving a first uniformity level to be achieved across the surface of the substrate;

identifying a first plurality of duty cycles associated with a first plurality of states of a variable based on the first uniformity level, wherein the first plurality of states are of a first plurality of radio frequency (RF) signals;

receiving a second uniformity level to be achieved across the surface of the substrate;

identifying a second plurality of duty cycles associated with a second plurality of states based on the second uniformity level, wherein the second plurality of states are of a second plurality of RF signals; and controlling a plurality of RF generators to generate the second plurality of RF signals having the second plurality of duty cycles to achieve the second uniformity level, wherein the second plurality of RF signals having the second plurality of duty cycles are generated by the RF generator that is coupled to a substrate support of a plasma chamber.

10. The method of claim 9, wherein the second plurality of duty cycles include a first set of duty cycles, a second set of duty cycles, and a third set of duty cycles, wherein the second plurality of states include a first set of states, a second set of states, and a third set of states, wherein the second plurality of RF signals include a first RF signal, a second RF signal, and a third RF signal, wherein said identifying the second plurality of duty cycles includes:

identifying the first set of duty cycles associated with the first set of states based on the second uniformity level, wherein the first set of states are of the variable of the first RF signal;

identifying the second set of duty cycles associated with the second set of states based on the second uniformity level, wherein the second set of states are of the variable of the second RF signal; and identifying the third set of duty cycles associated with the third set of states based on the second uniformity level, wherein the third set of states are of the variable of the third RF signal.

11. The method of claim 10, wherein the plurality of RF generators includes a first RF generator, a second RF generator, and a third RF generator, wherein said controlling the plurality of RF generators includes:

controlling the first RF generator to generate the first RF signal;

controlling the second RF generator to generate the second RF signal;

controlling the third RF generator to generate the third RF signal.

12. The method of claim 9, wherein the second plurality of duty cycles includes a first set of duty cycles, a second set of duty cycles, and a third set of duty cycles, wherein the plurality of RF generators include a first RF generator, a second RF generator, and a third RF generator, the method further comprising:

accessing, from a memory device, a listing having a one-to-one correspondence between the second uniformity level and the second plurality of duty cycles, wherein said identifying the second plurality of duty cycles includes determining that the second plurality of duty cycles correspond to the second uniformity level in the listing, and wherein said controlling the plurality of RF generators includes:

sending a first recipe signal having the first set of duty cycles to the first RF generator;

sending a second recipe signal having the second set of duty cycles to the second RF generator; and sending a third recipe signal having the third set of duty cycles to the third RF generator.

13. The method of claim 12, wherein said controlling the plurality of RF generators includes sending a trigger signal to the plurality of RF generators after said sending the first, second, and third recipe signals.

14. The method of claim 9, wherein the second plurality of RF signals include a first RF signal, a second RF signal, and a third RF signal, wherein the plurality of RF generators include a first RF generator, a second RF generator, and a third RF generator, wherein the second plurality of states include a first set of states of the variable of the first RF signal, a second set of states of the variable of the second RF signal, and a third set of states of the variable of the third RF signal.

15. A controller for achieving a uniformity level in a processing rate across a surface of a substrate, comprising:
a processor configured to:
    receive a first uniformity level to be achieved across the surface of the substrate;
    identify a first plurality of duty cycles associated with a first plurality of states based on the first uniformity level, wherein the first plurality of states are of a variable of a first radio frequency (RF) signal;
    receive a second uniformity level to be achieved across the surface of the substrate;
    identify a second plurality of duty cycles associated with a second plurality of states based on the second uniformity level, wherein the second plurality of states are of a variable of a second RF signal; and
    control an RF generator to generate the second RF signal having the second plurality of duty cycles to achieve the second uniformity level, wherein the second RF signal having the second plurality of duty cycles is generated by the RF generator that is coupled to a substrate support of a plasma chamber; and
a memory device coupled to the processor, wherein the memory device is configured to store the first and second uniformity levels.

16. The controller of claim 15, wherein the processor is configured to:
    access, from the memory device, a listing having a one-to-one correspondence between the second uniformity level and the second plurality of duty cycles,
    wherein to identify the second plurality of duty cycles, the processor is configured to determine that the second plurality of duty cycles correspond to the second uniformity level in the listing, and
    wherein to control the RF generator, the processor is configured to send a recipe signal having the second plurality of duty cycles to the RF generator.

17. The controller of claim 16, wherein to control the RF generator, the processor is configured to send a trigger signal to the RF generator after sending the recipe signal.

18. The controller of claim 15, wherein a number of the second plurality of states is unequal to a number of the first plurality of states.

19. The method of claim 1, wherein a number of the first plurality of duty cycles is different from a number of the second plurality of duty cycles.

20. The controller of claim 15, wherein a number of the first plurality of duty cycles is different from a number of the second plurality of duty cycles.

* * * * *